US009583455B2

United States Patent
Oyachi et al.

(10) Patent No.: US 9,583,455 B2
(45) Date of Patent: Feb. 28, 2017

(54) SEMICONDUCTOR DEVICE

(71) Applicant: Renesas Electronics Corporation, Tokyo (JP)

(72) Inventors: Kenji Oyachi, Tokyo (JP); Tamaki Wada, Tokyo (JP); Yuichi Morinaga, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 15/092,864

(22) Filed: Apr. 7, 2016

(65) Prior Publication Data
US 2016/0293564 A1  Oct. 6, 2016

Related U.S. Application Data

(63) Continuation of application No. 14/278,300, filed on May 15, 2014, now Pat. No. 9,337,134.

(30) Foreign Application Priority Data

May 31, 2013  (JP) .................................. 2013-115580

(51) Int. Cl.
*H01L 23/00* (2006.01)
*H01L 23/498* (2006.01)
(Continued)

(52) U.S. Cl.
CPC .......... *H01L 24/48* (2013.01); *G06K 19/0772* (2013.01); *H01L 23/053* (2013.01);
(Continued)

(58) Field of Classification Search
CPC ..... H01L 23/49811; H01L 24/14; H01L 24/48
See application file for complete search history.

(56) References Cited

U.S. PATENT DOCUMENTS 6,117,704 A    9/2000  Yamaguchi et al.
6,117,706 A    9/2000  Yoshioka et al.
(Continued)

FOREIGN PATENT DOCUMENTS

FR    2855891 A1    12/2004
FR    2895548 A1    6/2007
(Continued)

OTHER PUBLICATIONS

Communication dated Mar. 5, 2015, issued by the European Patent Office in corresponding application No. 14169979.3.
(Continued)

*Primary Examiner* — Christine Enad
(74) *Attorney, Agent, or Firm* — Sughrue Mion, PLLC

(57) ABSTRACT

Reliability of a semiconductor device is improved. A semiconductor device has a base material of insulating material having a through hole, a terminal formed on a lower surface of the base material, and a semiconductor chip mounted on an upper surface of the base material in a face-up manner. The semiconductor device has a conductive member such as a wire, which electrically connects a pad of the semiconductor chip with an exposed surface of the terminal which is exposed from the through hole of the base material, and has a sealing body for sealing the conductive member, inside of the through hole of the base material, and the semiconductor chip. An anchor is provided in a region of the exposed surface of the terminal which is exposed from the through hole of the base material except for a joint portion joined with the conductive member.

8 Claims, 55 Drawing Sheets

(51) Int. Cl.
*H01L 23/053* (2006.01)
*H01L 23/31* (2006.01)
*G06K 19/077* (2006.01)

(52) U.S. Cl.
CPC .... *H01L 23/3114* (2013.01); *H01L 23/49811* (2013.01); *H01L 23/49838* (2013.01); *H01L 23/49855* (2013.01); *H01L 2224/48228* (2013.01); *H01L 2224/48479* (2013.01)

(56) References Cited

U.S. PATENT DOCUMENTS

| | | | |
|---|---|---|---|
| 6,271,057 B1 | 8/2001 | Lee et al. | |
| 7,939,950 B2 | 5/2011 | Wu et al. | |
| 2005/0253245 A1 | 11/2005 | Lynch et al. | |
| 2006/0108666 A1* | 5/2006 | Koizumi | H01L 23/3171 |
| | | | 257/621 |
| 2007/0170564 A1 | 7/2007 | Drummer et al. | |
| 2007/0252249 A1 | 11/2007 | Murai et al. | |
| 2008/0054052 A1 | 3/2008 | Arakawa | |
| 2008/0099898 A1 | 5/2008 | Cui et al. | |
| 2008/0197510 A1 | 8/2008 | Mii et al. | |
| 2009/0236755 A1* | 9/2009 | Wu | H01L 23/5385 |
| | | | 257/777 |
| 2010/0059883 A1 | 3/2010 | Yow et al. | |
| 2011/0079887 A1 | 4/2011 | Shim et al. | |
| 2012/0049363 A1* | 3/2012 | Tsai | H01L 23/49827 |
| | | | 257/738 |
| 2014/0021264 A1 | 1/2014 | Pueschner et al. | |

FOREIGN PATENT DOCUMENTS

| | | |
|---|---|---|
| JP | 11017054 A | 1/1999 |
| JP | 11163204 A | 6/1999 |
| JP | 2005-317860 A | 11/2005 |
| JP | 2006-156574 A | 6/2006 |
| JP | 2007-318098 A | 12/2007 |
| JP | 2009038145 A | 2/2009 |
| JP | 2010040902 A | 2/2010 |
| JP | 2010129713 A | 6/2010 |
| JP | 2011-210936 A | 10/2011 |
| WO | 2007/077356 A2 | 7/2007 |

OTHER PUBLICATIONS

Communication dated Nov. 3, 2014 from the European Patent office in counterpart application No. 14169979.3.
Japanese Office Action issued Dec. 27, 2016 in JP 2013-115580.

* cited by examiner

SEMICONDUCTOR DEVICE

CROSS-REFERENCE TO RELATED APPLICATION

This is a Continuation of application Ser. No. 14/278,300 filed on May 15, 2014, which claims priority from Japanese Patent Application No. 2013-115580 filed on May 31, 2013, the contents of which are hereby incorporated by reference into this application.

TECHNICAL FIELD OF THE INVENTION

The present invention relates to a semiconductor device, and can be preferably used for, for example, a semiconductor device including a semiconductor chip.

A technique of obtaining an IC card which can perform data communication to/from outside by embedding a semiconductor device into a card main body is cited.

Japanese Patent Application Laid-Open Publication No. 2011-210936 (Patent Document 1) describes a technique relating to a semiconductor device embedded to an IC card.

BACKGROUND

As described in, for example, the Patent Document 1, in a semiconductor device in which a semiconductor chip is mounted on a base material formed of a tape, which is a so-called COT (Chip On Tape) package, a conductive member (a wire in the above-described Patent Document 1) is connected to a surface of a terminal formed on a back surface of the base material (which is a surface exposed from a through hole of the base material) via the through hole formed in the base material, and besides, a semiconductor chip and the conductive member are sealed with a resin (sealing body).

However, adhesiveness between the surface of the terminal and the resin is low. Therefore, if large load (stress, damage) is applied to a joint portion (bonding region) of the conductive member on the surface of the terminal, an electrical property is changed at the joint portion (disconnection occurs in some cases).

The above and other preferred aims and novel characteristics of the present invention will be apparent from the description of the present specification and the accompanying drawings.

SUMMARY

According to one embodiment, a semiconductor device has a base material comprised of insulating material having a through hole, an external terminal formed on one principal surface of the base material, and a semiconductor chip mounted on the other principal surface of the base material in a face-up manner. The semiconductor device has a conductive member for electrically connecting an exposed surface of the external terminal exposed from the through hole of the base material with a pad of the semiconductor chip, and the semiconductor device has a sealing body for sealing the conductive member, an inside portion of the through hole of the base material, and the semiconductor chip. An anchor means is provided in a region of the exposed surface except for the joint portion to which the conductive member is jointed.

Moreover, according to one embodiment, a semiconductor device has a base material comprised of insulating material having a through hole, an external terminal formed on one of principal surfaces of the base material, and a semiconductor chip mounted on the other principal surface of the base material in a face-up manner. The semiconductor device has a conductive member for electrically connecting an exposed surface of the external terminal exposed from the through hole of the base material with a pad of the semiconductor chip, and the semiconductor device has a sealing body for sealing the conductive member, an inside portion of the through hole of the base material, and the semiconductor chip. The exposed surface has a first region and a second region having larger surface roughness than that of the first region, and the conductive member is jointed to the first region.

According to one embodiment, reliability of a semiconductor device can be improved.

BRIEF DESCRIPTIONS OF THE DRAWINGS

DETAILED DESCRIPTIONS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments will be described in detail based on the accompanying drawings. Note that components having the same function are denoted by the same reference symbols throughout all drawings for describing the embodiments, and the repetitive description thereof will be omitted. Also, in the following embodiments, the explanations of the same or similar parts are not repeated in principle unless particularly required.

Also, in some drawings used in the embodiments, hatching is omitted in some cases even in a cross-sectional view so as to make the drawings easy to see. Further, hatching is used in some cases even in a plan view so as to make the drawings easy to see.

First Embodiment

Regarding Structure of Semiconductor Device

Figure 1:
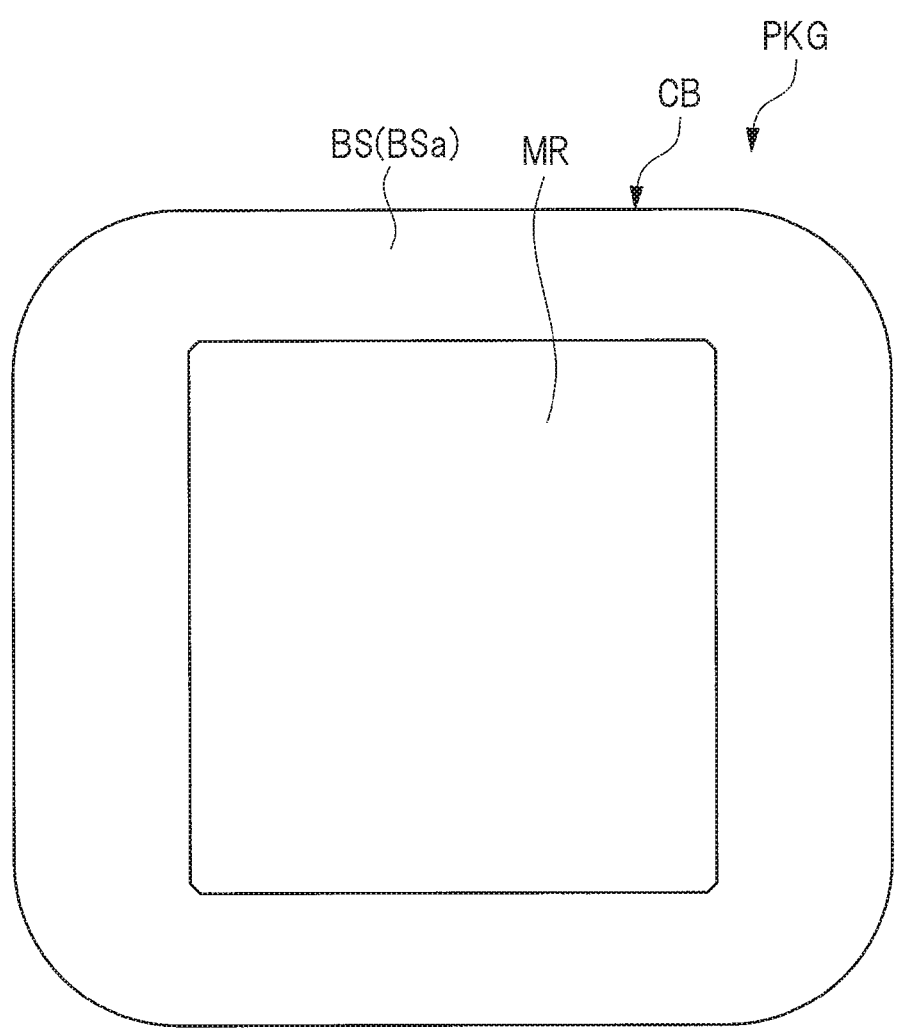
FIG. 1 is a plan view of a semiconductor device of one embodiment.
Figure 2:
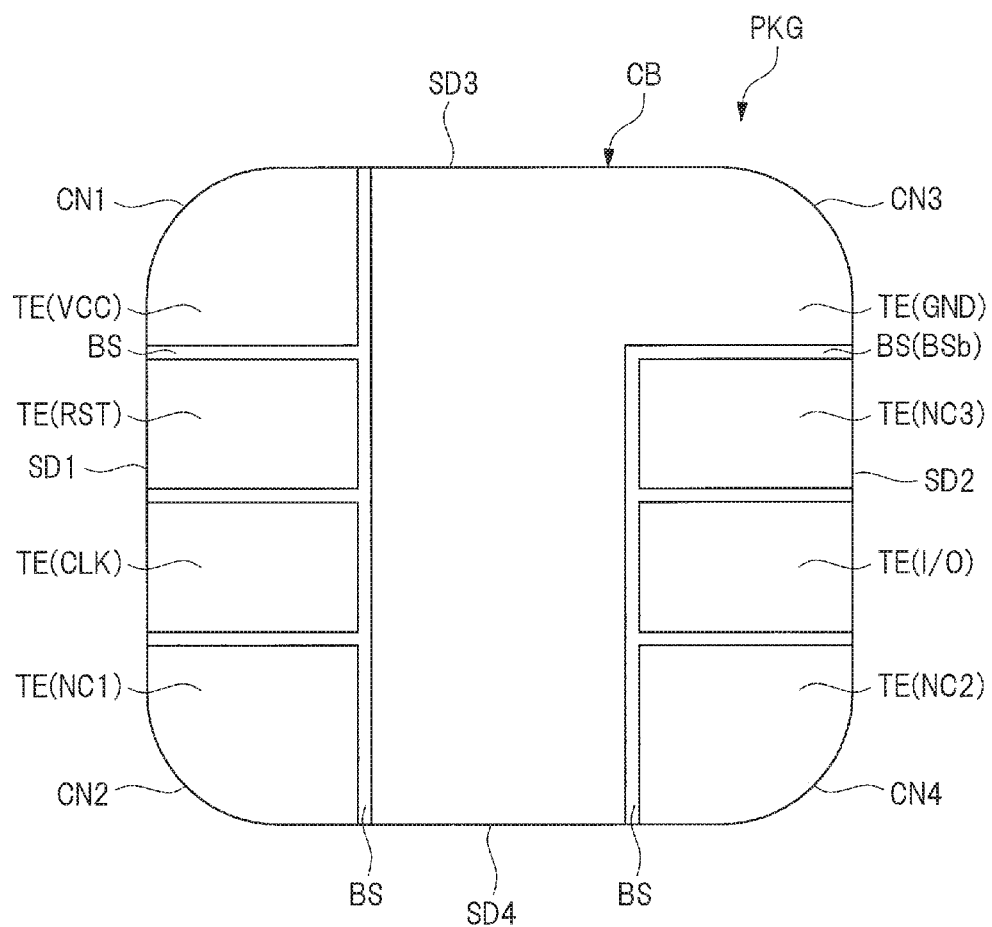
FIG. 2 is a plan view of a semiconductor device of one embodiment.
Figure 3:
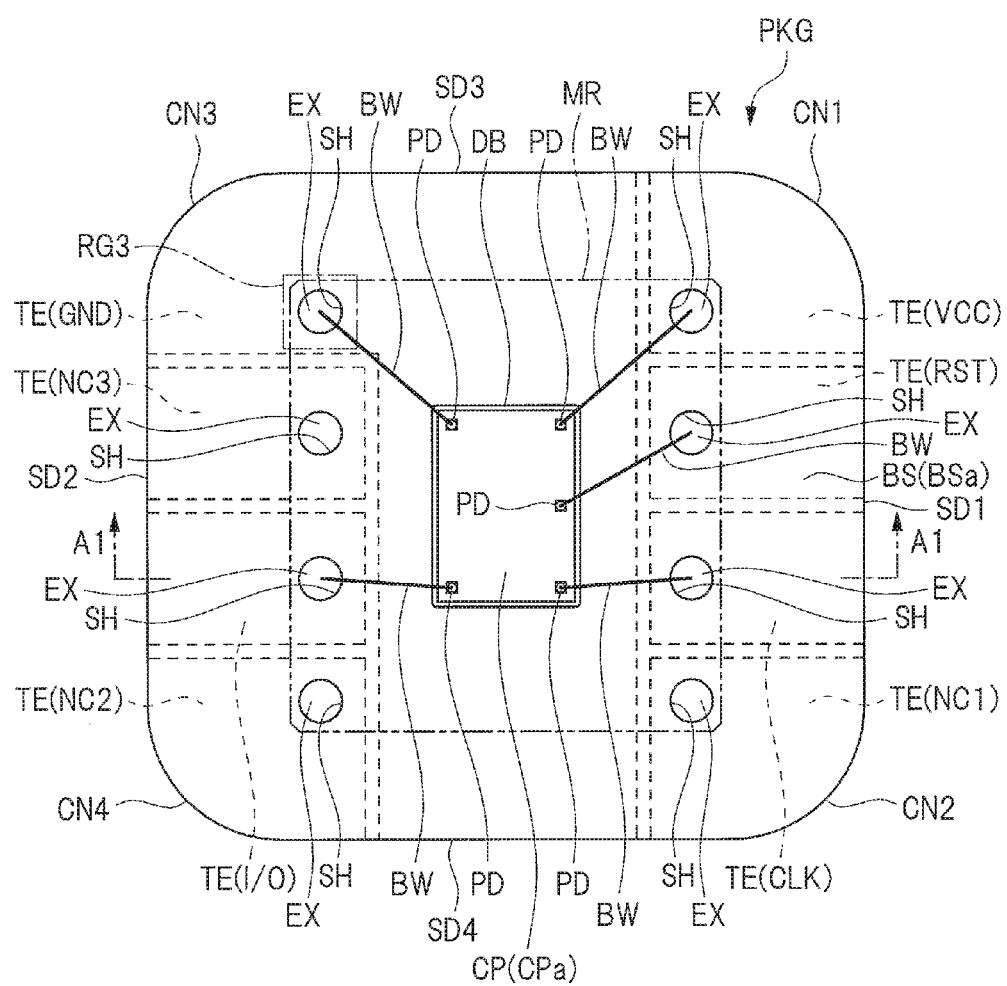
FIG. 3 is a plan perspective view of a semiconductor device of one embodiment.
Figure 4:
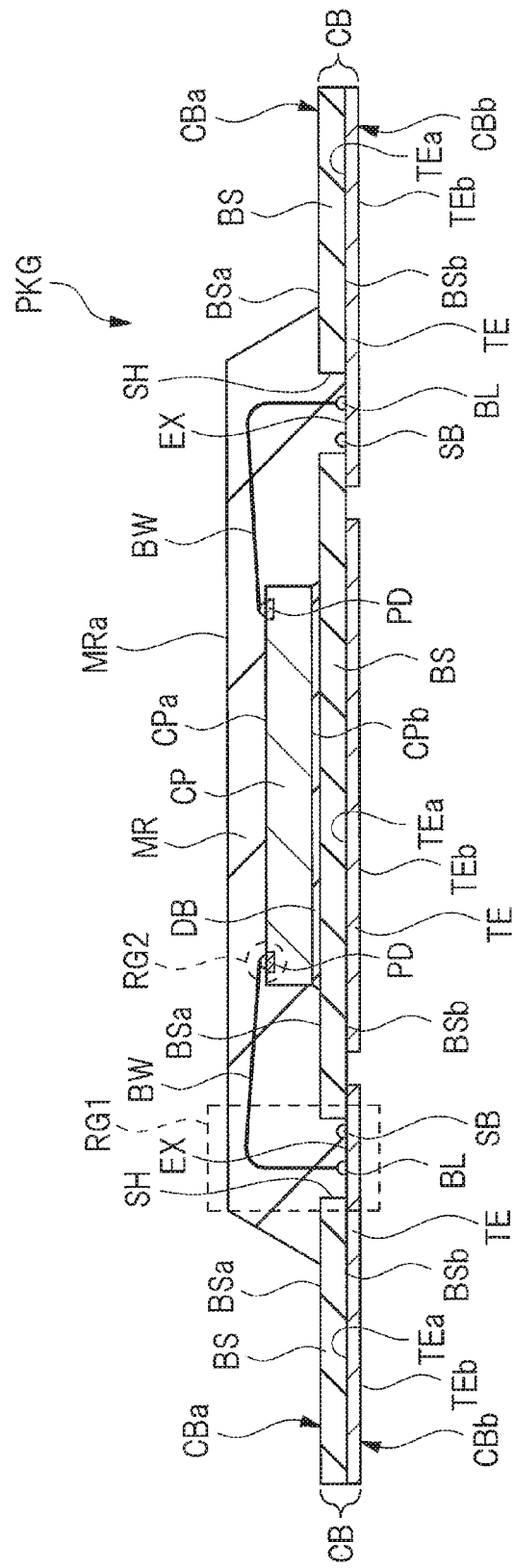
FIG. 4 is a cross-sectional view of a semiconductor device of one embodiment.
Figure 5:
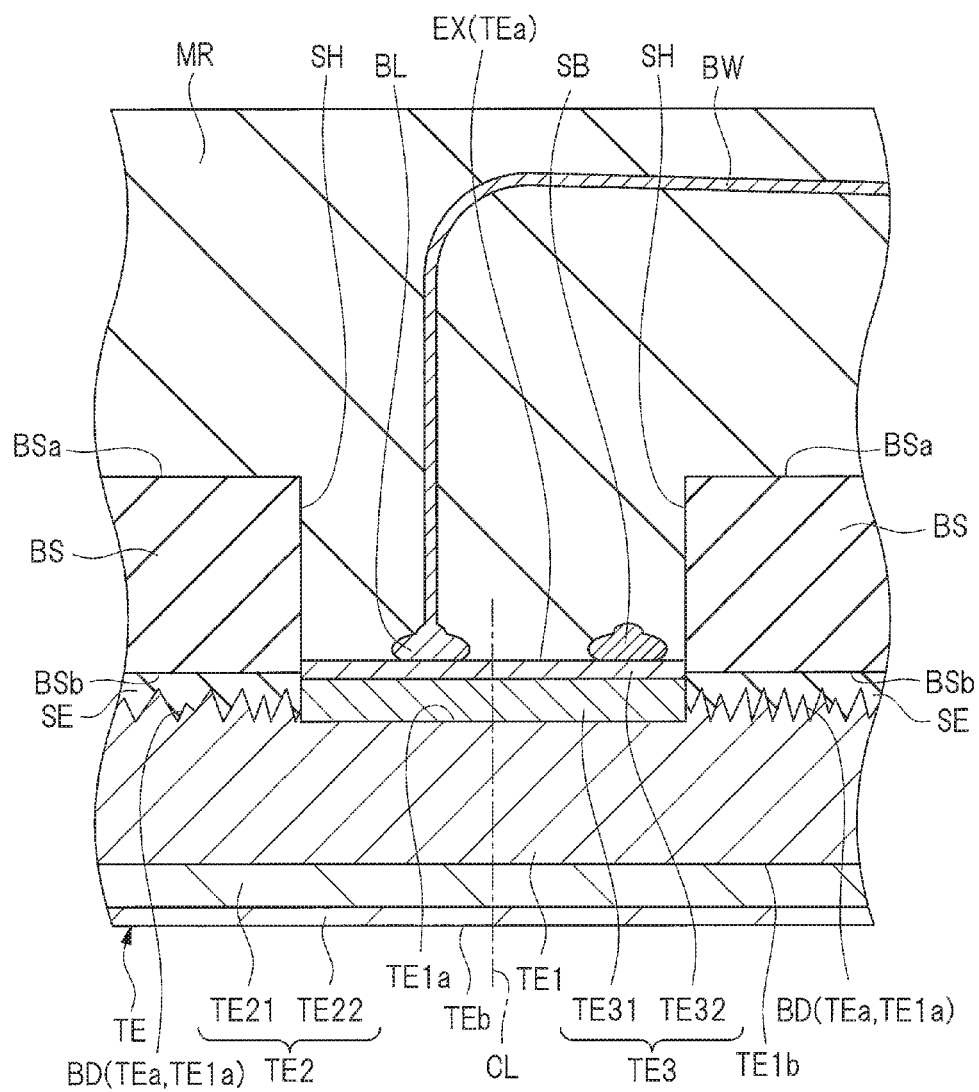
FIG. 5 is a partial enlarged cross-sectional view of a semiconductor device of one embodiment.
Figure 6:
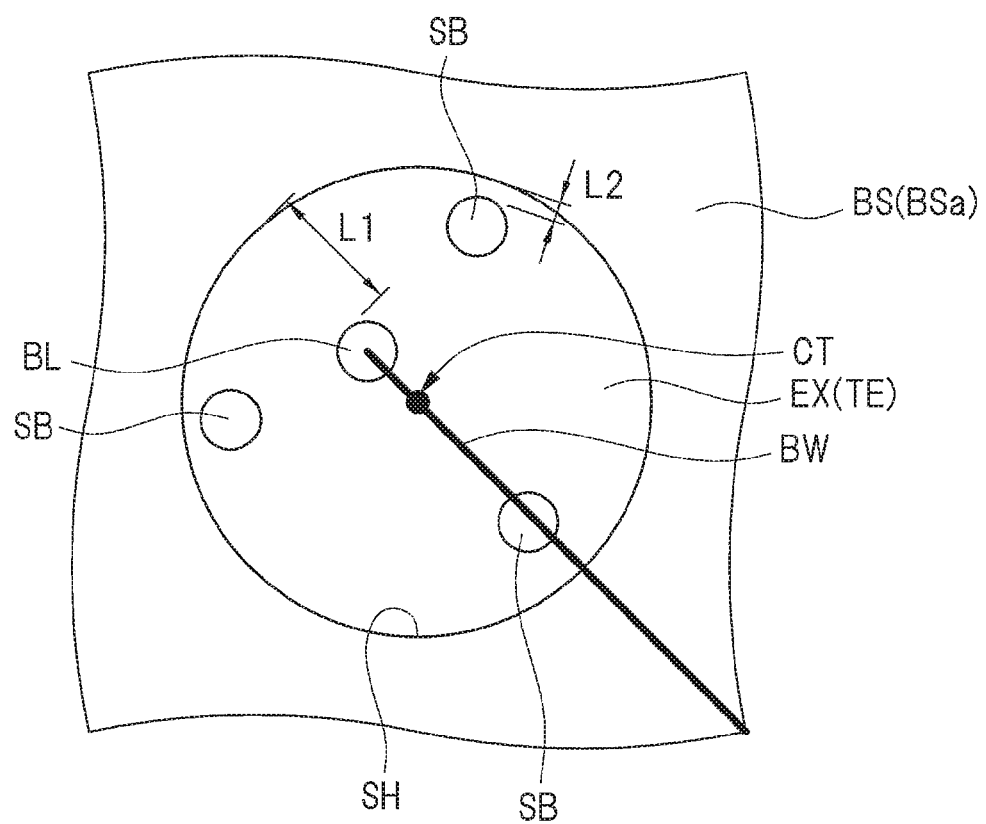
FIG. 6 is a partial enlarged plan perspective view of a semiconductor device of one embodiment.
Figure 7:
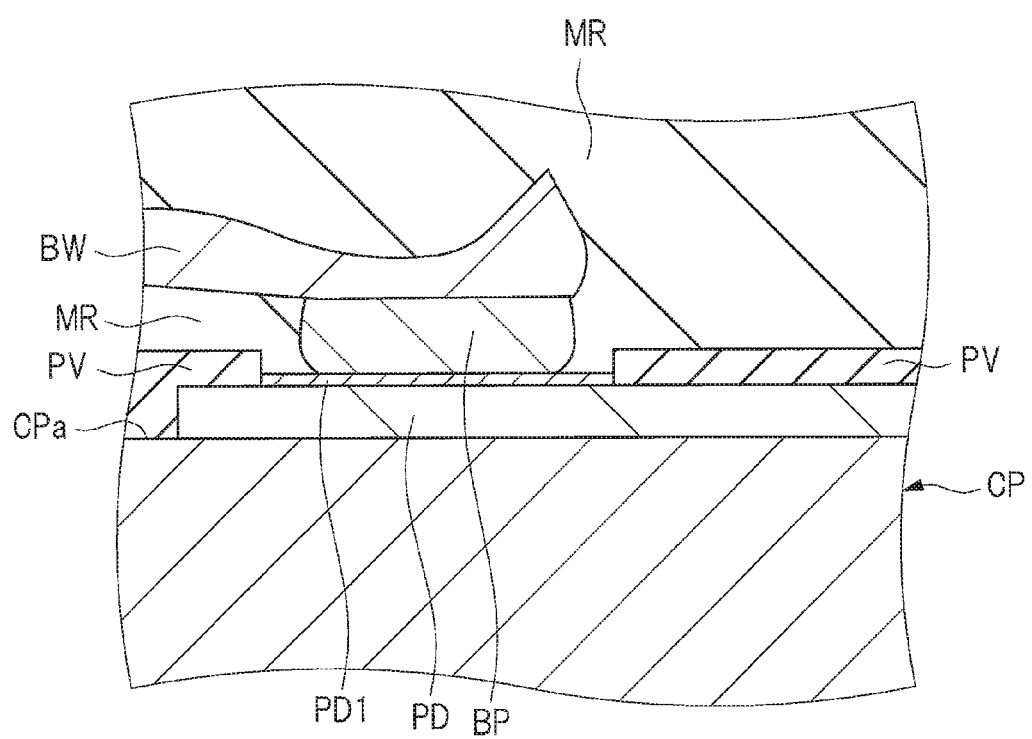
FIG. 7 is a partial enlarged cross-sectional view of a semiconductor device of one embodiment.

FIGS. 1 to 3 are plan views of a semiconductor device PKG of the present embodiment, FIG. 4 is a cross-sectional view of the semiconductor device PKG, FIG. 5 is a partial enlarged cross-sectional view of the semiconductor device PKG, FIG. 6 is a partial enlarged plan view of the semiconductor device PKG, and FIG. 7 is a partial enlarged cross-sectional view of the semiconductor device PKG.

Among FIGS. 1 to 3, FIG. 1 illustrates a plan view of the semiconductor device PKG on an upper surface side (in other words, a top view thereof), and FIG. 2 illustrates a plan view of the semiconductor device PKG on a lower surface side (in other words, a bottom view thereof). While FIG. 3 is a plan view of the semiconductor device PKG on an upper surface side (in other words, a top view thereof), it illustrates a plan perspective view in which a sealing body MR is viewed as being transparent. In FIG. 3, in order to easily understand a planar positional relation of each member, note that an outline position of the sealing body MR is illustrated by a dashed double-dotted line, and an outline position of a terminal TE formed on a lower surface CBb of a substrate CB is illustrated by a dotted line. Also, FIG. 4 almost corresponds to a cross-sectional view on a line A1-A1 of FIG. 2. Also, FIG. 5 illustrates an enlarged view of a region RG1 in FIG. 4 surrounded by a dotted line. FIG. 6 illustrates an enlarged view of a region RG3 in FIG. 3 surrounded by a dashed-dotted line, and is a plan perspective view in which the sealing body MR is viewed as being transparent as similar to FIG. 3. FIG. 7 illustrates an enlarged view of a region RG2 in FIG. 4 surrounded by a dotted line.

The semiconductor device PKG of the present embodiment illustrated in FIGS. 1 to 7 is a semiconductor device in a form of a semiconductor package.

As illustrated in FIGS. 1 to 7, the semiconductor device PKG of the present embodiment has: the substrate CB; a semiconductor chip CP mounted (arranged) on an upper surface CBa of the substrate CB; the terminals TE formed on a lower surface CBb of the substrate CB; a conductive member (a conductive connecting member which is a wire BW here) for electrically connecting a pad PD of the semiconductor chip CP with the terminal TE; and the sealing body MR for sealing the semiconductor chip CP and the wire BW.

First, the semiconductor chip CP of the semiconductor device PKG will be specifically explained.

A planar shape of the semiconductor chip CP which crosses a thickness thereof is a substantially rectangular (tetragonal) shape, and the semiconductor chip CP is manufactured by, for example, forming various semiconductor elements, semiconductor integrated circuits, or others on a principal surface of a semiconductor substrate (semiconductor wafer) made of single-crystal silicon, and then, dividing the semiconductor substrate into semiconductor chips by a dicing method or others. While the planar shape of the semiconductor chip CP is the substantially rectangular shape, the shape can be a shape obtained by cutting corners of the rectangle or a shape obtained by rounding the corners of the rectangle.

The semiconductor chip CP has a front surface (principal surface) CPa serving as the principal surface on a semiconductor element formation side and a back surface CPb serving as the principal surface opposite to the front surface CPa, and a plurality of pads (bonding pads, pad electrodes, electrode pads, terminals) PD are formed on the front surface CPa of the semiconductor chip CP (see FIGS. 3 and 4). Therefore, in the semiconductor chip CP, the principal surface on the side where the pad PD is formed serves as the front surface CPa of the semiconductor chip CP, and the principal surface opposite thereto serves as the back surface CPb of the semiconductor chip CP.

Each of the pads PD of the semiconductor chip CP is electrically connected to the semiconductor element or the semiconductor integrated circuit formed inside or in a surface layer of the semiconductor chip CP via an internal wiring (not illustrated) of the semiconductor chip CP or others. As the circuit (semiconductor integrated circuit) formed inside the semiconductor chip CP, for example, a memory circuit that stores data, an arithmetic circuit that performs arithmetic processing to data, or others is cited. The pad PD is provided to a peripheral part (circumferential part) of the front surface CPa of the semiconductor chip CP.

Also, while a passivation film PV (see FIG. 7) is formed on the uppermost surface (top layer) on the front surface CPa side of the semiconductor chip CP as an insulating film (protective insulating film) for surface protection, each surface of the plurality of pads PD is exposed from the passivation film at an opening formed in this passivation film PV. Therefore, to the pads PD on the front surface CPa of the semiconductor chip CP, the conductive connecting members (conductive members for electrically connecting the pads PD with the terminals TE, which are the wires BW here) can be connected. The formation of the passivation film PV can be omitted in some cases. While the pad PD is made of, for example, a metal film such as an aluminum (Al) film, the uppermost surface of the pad PD can be formed of a plating film PD1 by forming the plating film PD1 (see FIG. 7) on this aluminum film. The plating film PD1 can be regarded as a part of the pad PD. The plating film PD1 can be formed as, for example, a stacked film of a nickel (Ni) film and a gold (Au) film on the nickel film. In this case, the gold film (gold plating film) forms the uppermost surface of the pad PD. In the present embodiment, note that the front surface CPa of the semiconductor chip CP is the surface (principal surface) where the pads PD are formed in the semiconductor chip CP, and corresponds to an upper surface of the insulating film which is a base where the pads PD are formed.

The substrate CB has an upper surface CBa which is a principal surface on a side on which the semiconductor chip CP is mounted, and a lower surface CBb which is a principal surface opposite to the upper surface CBa, and the semiconductor chip CP is mounted on the upper surface CBa of the substrate CB (see FIG. 4) in the semiconductor device PKG. That is, the semiconductor chip CP is mounted (packaged) on the upper surface CBa of the substrate CB via a bonding material (die-bond material, adhesive material, adhesive layer) DB in a direction in which the back surface CPb of the semiconductor chip CP faces the upper surface CBa of the substrate CB. Therefore, the semiconductor chip CP is bonded to the upper surface CBa of the substrate CB in a face-up bonding manner.

The semiconductor chip CP is mounted on and fixed to the upper surface CBa of the substrate CB (specifically, an upper surface BSa of a base material BS) via a bonding material DB which is a die-bond material. While this bonding material DB is not particularly limited as long as the semiconductor chip CP can be firmly fixed to the upper surface CBa of the substrate CB, for example, an epoxy-based thermoset resin or others can be used.

Also, the semiconductor chip CP is mounted on the upper surface CBa of the substrate CB (that is, on the upper surface BSa of the base material BS) via the bonding material DB so that each side of the planar shape of the semiconductor chip CP goes along each side of the planar shape of the substrate CB (base material BS) (see FIGS. 3 and 4). The plurality of pads PD are formed on the front surface CPa of the semiconductor chip CP so that the plurality of pads PD are arranged on a circumferential side of the front surface CPa of the semiconductor chip CP along the sides.

Next, the substrate CB of the semiconductor device PKG will be specifically explained.

The substrate CB has the base material (base material layer, base film, substrate) BS which is comprised of insulating material and which is an insulating layer serving as a base of the substrate CB, and the plurality of terminals (electrodes, external terminals, metal pattern) TE which are bonded (joined) and fixed to a lower surface BSb of the base material BS via the bonding layer (bonding material layer) SE (see FIGS. 4 and 5). The terminal TE is functioned as an external terminal (a terminal for external connection) of the semiconductor device PKG. The terminal TE has electrical conductivity, and is preferably made of a metal material. The base material BS has an insulation property, and is, for example, a glass-epoxy-based resin substrate. For example, a glass-epoxy-based substrate obtained by impregnating an epoxy-based resin into glass fibers can be used as the base material BS.

The base material BS is thin, and is thinner than, for example, the semiconductor chip CP. A base material thinly formed as the base material BS is handled in a tape-shaped state in an assembly step of the semiconductor device PKG, and therefore, the base material is called a tape base material. Also, such a semiconductor package as the semiconductor device PKG having the semiconductor chip CP mounted on the base material BS which is the tape base material is called a COT (Chip on Tape) package. However, in the semiconductor device PKG of FIGS. 1 to 7, the base material BS is in a state obtained after the tape-shaped base material is cut.

The base material BS has the upper surface (chip mounting surface) BSa and the lower surface (terminal surface, terminal forming surface) BSb, which are two principal surfaces positioned so as to be opposite to each other. The upper surface BSa of the base material BS forms the upper surface CBa of the substrate CB. That is, since the base material BS is a member that is arranged on an upper side of the substrate CB, the upper surface BSa of the base material BS is the same surface as the upper surface CBa of the substrate CB. The semiconductor chip CP is mounted on the upper surface BSa of the base material BS (via the bonding material DB) in a direction in which the back surface CPb of the semiconductor chip CP faces the upper surface BSa of the base material BS. Also, the plurality of terminals TE are bonded to the lower surface BSb of the base material BS via the bonding layer SE. Therefore, the lower surface BSb of the base material BS and the plurality of terminals TE which are bonded to the lower surface BSb of the base material BS form the lower surface CBb of the substrate CB. The plurality of terminals TE are provided to the lower surface CBb side of the substrate CB by bonding the plurality of terminals TE to the lower surface BSb of the base material BS via the bonding layer SE.

While the planar shape of the base material BS (therefore, also including the substrate CB) which crosses the thickness thereof is, for example, the substantially rectangular (tetragonal) shape, the shape can be a shape obtained by cutting corners of the rectangle or a shape obtained by rounding the corners of the rectangle. In FIGS. 1 to 3, the planar shape of the base material BS (therefore, also including the planar shape of the substrate CB) is the shape obtained by rounding the corners of the rectangle (tetragon) (that is, a shape having arc-shaped corners). That is, each of corner portions CN1, CN2, CN3, and CN4 described later has an arc shape.

A plurality of through holes (openings, bonding holes, connecting holes, through holes) SH are formed in the base material BS, and each of the through holes SH penetrates through the upper surface BSa and the lower surface BSb of the base material BS from one side to the other side (see FIGS. 3 to 6).

The through hole SH is a hole for exposing a part (that is, an exposed surface EX) of the terminal TE from the base material BS in order to join the terminal TE to the conductive connecting member (the conductive member for electrically connecting the pad PD with the terminal TE, which is the wire BW here). Therefore, the through hole SH is formed for each of the plurality of the terminals TE (see FIG. 3). That is, the substrate CB has the plurality of terminals TE, and the through hole SH from which the part (the exposed surface EX) of the terminal TE is exposed is formed for each terminal TE.

Each through hole SH is formed at a position where each through hole is overlapped with each terminal TE in a planar view (as viewed in a plane which is substantially parallel to the upper surface BSa of the base material BS). That is, in the base material BS, the through hole SH is formed for each of the plurality of terminals TE bonded to the lower surface BSb of the base material BS at the position where the through hole is overlapped with the terminal TE in the planar view. A planar dimension (planar area) of the through hole SH is smaller than a planar dimension (planar area) of the terminal, and each through hole SH is included in each terminal TE in the planar view. The planar shape of the through hole SH can be, for example, a circular shape, and the shape of the through hole SH in that case is a substantially cylindrical shape in this case. A diameter of the through hole SH is exemplified as, for example, about 0.7 mm.

While the through hole SH penetrates through the base material BS, it does not penetrate through the terminal TE. Therefore, when the substrate CB is viewed from the upper surface CBa side as viewing the sealing body MR to be transparent, a part of each terminal TE is exposed from the through hole SH. That is, the terminal TE is formed on the lower surface BSb side of the base material BS, the through hole SH penetrating through the upper surface BSa and the lower surface BSb of the base material BS from one side to the other side is formed in the base material BS, and the part (that is, the exposed surfaces EX) of the terminal TE is exposed from the through hole SH formed in the base material BS. The part (surface) of the terminal TE, which is exposed from the through hole SH, is referred to as the exposed surface (exposed portion, surface, bonding surface) EX.

Note that the exposure of the exposed surface EX of the terminal TE from the through hole SH formed in the base material BS means that the exposed surface is not covered with the base material BS but exposed from the base material BS. Practically, the inside of the through hole SH is sealed with the sealing body MR, and the through hole SH is filled with a material that forms the sealing body MR, and therefore, the terminal TE in the part (that is, the exposed surface EX) exposed from the through hole SH is covered with the sealing body MR. Therefore, the exposed surface EX of the terminal TE which is exposed from the through hole SH corresponds to a part (surface) which is a surface (base-material facing surface TEa) on the side facing the base material BS of the terminal TE and which is not covered with the base material BS but exposed from the base material BS at the through hole SH.

The plurality of pads PD on the front surface CPa of the semiconductor chip CP and the plurality of terminals TE on the substrate CB are electrically connected to each other via the plurality of conductive members (for example, the plurality of wires BW) (see FIGS. 3 to 7). The wires BW can be functioned as the conductive members (conductive connecting members) which electrically connect the pads PD of the semiconductor chip CP with the terminals TE of the substrate CB.

Note that the conductive member for electrically connecting the pad PD with the terminal TE is referred to as a conductive connecting member below. For example, the wire BW can be preferably used as the conductive connecting member (that is, the conductive member for electrically connecting the pad PD with the terminal TE), and FIGS. 3 to 7 illustrate a case of usage of the wire BW as the conductive connecting member.

The wire (bonding wire) BW is made of a metal wire, and, for example, a gold wire made of gold (Au) can be preferably used. As another aspect, a material (metal material) containing copper (Cu) as a main component can be used as the material of the wire BW, and a copper wire made of copper (Cu) can be also used as the wire BW.

One end of the wire BW is connected to the pad PD on the front surface CPa of the semiconductor chip CP, and the other end thereof is connected to the exposed surface EX of the terminal TE which is exposed from the through hole SH of the base material BS. That is, the plurality of pads PD on the front surface CPa of the semiconductor chip CP and the plurality of terminals TE on the substrate CB are electrically connected to each other via the plurality of wires BW, and the exposed surfaces EX of the terminals TE which are exposed from the through holes SH of the base material BS are connected to the wires BW in each terminal. In other words, the terminal TE and the wire BW are electrically connected to each other by forming the wire BW so as to penetrate through the through hole SH and joining the wire BW to the exposed surface EX of the terminal TE which is exposed from the through hole SH of the base material BS.

By providing the through holes SH in the base material BS and exposing the exposed surfaces EX of the terminals TE from the through holes SH, the pads PD of the semiconductor chip CP mounted on the upper surface CBa of the substrate CB (that is, the upper surface BSa of the substrate BS) and the exposed surfaces EX of the terminals TE exposed from the through holes SH of the base material BS can be electrically connected to each other by connecting them with the conductive connecting members such as the wires BW on the upper surface CBa side of the substrate CB.

The terminals TE are formed on the lower surface BSb of the base material BS, and each of the terminals TE has a base-material facing surface (upper surface) TEa which is a principal surface on the side facing the lower surface BSb of the base material BS, and a terminal surface (lower surface) TEb which is a principal surface opposite to the base-material facing surface TEa. And, the base-material facing surface (upper surface) TEa of this terminal TE has: a joint surface (surface) BD which faces the lower surface BSb of the base material BS except for the through hole SH and which is bonded to the lower surface BSb of the base material BS via the bonding layer SE; and the exposed surface EX which is exposed from the through hole SH of the base material BS.

In each of the plurality of terminals TE formed on the lower surface BSb of the base material BS, the joint surface BD of the base-material facing surface TEa of the terminal TE is bonded and fixed to the lower surface BSb of the base material BS via the bonding layer SE, and besides, the exposed surface EX of the base-material facing surface TEa of the terminal TE is exposed from the through hole SH of the base material BS. In this manner, the exposed surface EX can be ensured as a connecting region of the conductive connecting member (the wire BW here) in the terminal TE, so that the conductive connecting member such as the wire BW can be connected to the exposed surface EX of the terminal TE.

The terminal surface TEb of the terminal TE is formed of a surface of a plating layer TE2 described later. If the plating layer TE2 is formed of a stacked film of a nickel layer TE21 and a gold layer TE22 on the nickel layer TE21, the terminal surface TEb of the terminal TE is formed of the gold layer TE22 (gold plating layer) which forms the uppermost surface of the plating layer TE2. The terminal surface TEb of the terminal TE of the semiconductor device PKG can be functioned as an external connection terminal.

The exposed surface EX of the terminal TE which is exposed from the through hole SH is formed of a surface of a plating layer TE3 described later. If the plating layer TE3 is formed of a stacked film of a nickel layer TE31 and a gold layer TE32 on the nickel layer TE31, the exposed surface EX of the terminal TE which is exposed from the through hole SH is formed of the gold layer TE32 (gold plating layer) which forms the uppermost surface of the plating layer TE3. The joint surface BD of the terminal TE is formed of an upper surface TE1a of a copper layer TE1 described later.

The conductive connecting member which is the wire BW here is connected (joined) to the exposed surface EX of the terminal TE. In addition, a stud bump (bump electrode) SB is formed in the exposed surface EX (see FIGS. 4 to 6).

Although the stud bump SB is formed on the exposed surface EX of the terminal TE, the wire (BW) is not connected to the stud bump SB. That is, the stud bump SB is not formed for connecting the conductive connecting member (the wire BW here) to the terminal TE. In other words, the stud bump SB formed on the exposed surface EX of the terminal TE is not formed for electrically connecting the pad PD of the semiconductor chip CP with the terminal TE of the substrate CB. The stud bump SB is formed as an anchor means for enhancing the adhesiveness between the sealing body MR and the exposed surface EX of the terminal TE. The stud bump SB formed on the exposed surface EX of the terminal TE protrudes from the exposed surface EX of the terminal TE, and therefore, the stud bump SB can be regarded also as a convex portion (protruding portion) formed on the exposed surface EX of the terminal TE.

The stud bump SB is made of, for example, gold (Au). When the stud bump SB is made of gold (Au), the stud bump SB is a gold bump (gold bump electrode). When the stud bump SB is made of gold, it is preferred to form the exposed surface EX of the terminal TE by a gold (Au) layer (corresponding to a gold layer TE32 described later), so that the stud bump SB and the exposed surface EX of the terminal TE can be firmly joined with each other by Au—Au joint.

Also, it is more preferred to form the stud bump SB and the wire BW by the same material as each other. In this manner, the stud bump SB and the wire BW can be formed by using the same apparatus as each other. Moreover, the stud bump SB and the wire BW can be formed in the same wire bonding step as each other. Therefore, increase in the number of manufacturing steps and increase in the manufacturing time caused by forming the stud bump SB can be suppressed or prevented.

If the stud bump SB and the wire BW are made of the same material as each other, selection of the material that is suitable for connecting the wire BW as the material that forms the exposed surface EX of the terminal TE necessarily leads to selection of the material that is suitable for connecting the stud bump SB as the material that forms the exposed surface EX of the terminal TE. Therefore, as the material that forms the exposed surface EX of the terminal TE, a material that is suitable for both of the stud bump SB and the wire BW can be selected. Therefore, both of joint strength between the stud bump SB and the exposed surface EX of the terminal TE and joint strength between the wire BW and the exposed surface EX of the terminal TE can be improved.

Although described in detail later, the stud bump SB is formed by forming a ball portion (ball-shaped electrode) at a tip (end) of a wire which is made of, for example, gold by electric flame off (electric torch) and pressing this ball portion against the exposed surface EX of the terminal TE by a capillary (illustration is omitted) to be joined thereto, and the stud bump SB is formed of a ball portion (ball-shaped electrode) squashed into a flattened shape. Also, a planar shape of the stud bump SB is, for example, a substantially circular shape, and a diameter thereof is exemplified as, for example, about 0.1 mm. Further, a height of the stud bump SB (a dimension thereof in a direction substantially perpendicular to the exposed surface EX) can be, for example, 8 μm or higher.

Also, when the plurality of pads PD of the semiconductor chip CP and the plurality of terminals TE are electrically connected to each other via the plurality of wires BW, the wires BW are connected by a reverse bonding method in the present embodiment.

Here, in wire bonding of connecting the pad of the semiconductor chip with the terminal of the substrate on which the semiconductor chip is mounted by the wire, a so-called forward bonding method is as a case of previously connecting the wire to the pad of the semiconductor chip (first bonding), and then, connecting the wire to the terminal of the substrate (second bonding). And, a so-called reverse bonding method is as a case of previously connecting the wire to the terminal of the substrate (first bonding), and then, connecting the wire to the pad of the semiconductor chip (second bonding).

Although described in detail later, in the wire bonding step, the ball portion (ball-shaped electrode) is formed first at the tip (end) of the wire made of, for example, gold by the electric flame off, and this ball portion is pressed against and joined to the bonding region (the exposed surface EX of the terminal TE here) on a first connection side by the capillary (illustration is omitted). Therefore, when the reverse bonding method taking the joint portion with the terminal TE as the first bonding side is employed for the formation of the wire BW, the wire BW and the exposed surface EX of the terminal TE are joined to each other via the ball portion BL (the flat-shaped ball portion formed by pressing the capillary against it) integrally formed with the wire BW as illustrated in FIG. 5. That is, the ball portion (ball-shaped electrode) BL integrally formed with the wire BW at the tip (end) of the wire BW is bonded to the exposed surface EX of the terminal TE. The ball portion BL is integrally formed with the wire BW by the same material as that of the wire BW. The ball portion BL can be regarded also as a part of the wire BW.

On the other hand, on a second bonding side of the wire BW (that is, on the connecting portion side of the wire BW with the pad PD), the other end of the wire BW (the end opposite to the connection side of the exposed surface EX of the terminal TE) may be directly joined to the pad PD. However, it is more preferred to join the other end to the stud bump (bump electrode) BP formed on the pad PD so as to be electrically connected to the pad PD via this stud bump BP. This stud bump BP is formed on the pad PD separately from the wire BW. That is, the stud bump BP is previously formed on the pad PD of the semiconductor chip CP, and then, the wire BW is joined to the stud bump BP on this pad PD by the second bonding of the reverse bonding method.

When the stud bump BP is made of gold, the uppermost surface of the pad PD (which is the surface of the above-described plating film PD1) is preferably formed of a gold (Au) film, so that the stud bump BP and the gold film on the uppermost surface of the pad PD can be firmly joined with each other by Au—Au joint.

By joining the end of the wire BW (the end opposite to the connection side of the exposed surface EX of the terminal TE) to the stud bump BP formed on the pad PD, and electrically connecting the end to the pad PD via this stud bump BP, the wire BW is more reliably easily connected to the pad PD of the semiconductor chip CP even in the reverse bonding in which the pad PD side of the semiconductor chip CP becomes the second bonding side.

As illustrated in FIG. 7, the passivation film (insulating film) PV is formed on the uppermost surface of the semiconductor chip CP, and the surface of the pad PD is exposed from the passivation film PV at the opening formed in the passivation film PV. Therefore, the surface of the pad PD is at a position lower than the surface of the passivation film PV. On the second bonding side of the wire bonding, the wire is joined so as to be rubbed against a joint target member (which is the pad PD here). At this time, there is a risk that the capillary (not illustrated) of the wire bonding apparatus damages the passivation film PV. Accordingly, in the reverse bonding method, it is more preferred to electrically connect the wire BW to the pad PD via the stud bump BP by previously forming (joining) the stud bump BP on the pad PD and joining the wire BW to the stud bump BP on the pad PD. In this manner, the damage of the passivation film PV in the wire bonding or others can be prevented.

Note that the stud bump SB formed on the exposed surface EX of the terminal TE is not provided for connecting the wire (BW) but formed as the anchor means for enhancing the adhesiveness between the sealing body MR and the exposed surface EX of the terminal TE. On the other hand, the stud bump BP formed on the pad PD of the semiconductor chip CP is provided for connecting the wire BW. That is, the stud bump SB formed on the exposed surface EX of the terminal TE is not formed for electrically connecting the pad PD of the semiconductor chip CP with the terminal TE of the substrate CB, whereas the stud bump BP formed on the pad PD is formed for electrically connecting the pad PD of the semiconductor chip CP with the terminal TE of the substrate CB.

Next, with reference to FIG. 5, a layer structure of the terminal TE will be explained.

The terminal TE has a copper (Cu) layer TE1 made of copper foil as a main conductive layer (core metal layer). An upper surface TE1a of the copper layer TE1 is bonded to the lower surface BSb of the base material BS via the bonding layer SE. Also, on a lower surface TE1b of the copper layer TE1, the plating layer (plating film) TE2 is formed. Here, the upper surface TE1a and the lower surface TE1b of the copper layer TE are principal surfaces opposite to each other, the principal surface on the side facing the base material BS (that is, the side bonded to the base material BS) is the upper surface TE1a, and the principal surface opposite to the upper surface TE1a is the lower surface TE1b. A thickness of the copper layer TE1 can be, for example, about 30 μm.

The plating layer TE2 is formed of, for example, a stacked film of the nickel (Ni) layer (that is, nickel plating layer) TE21 formed on the lower surface TE1b of the copper layer TE1 and the gold (Au) layer (that is, gold plating layer) TE22 on the nickel layer TE21. In this case, the uppermost surface of the plating layer TE2 is the gold layer TE22. In the present first embodiment, the nickel layer TE21 forming the plating layer TE2 is thicker than the gold layer TE22 forming the plating layer TE2, a thickness of the nickel layer TE21 is, for example, about 4 μm, and a thickness of the gold layer TE22 is, for example, about 0.1 μm.

A plating layer (plating film) TE3 is formed on the upper surface TE1a of the copper layer TE1 at the part exposed from the through hole SH of the base material BS. The plating layer TE3 is formed of, for example, a stacked film of a nickel (Ni) layer (that is, nickel plating layer) TE31 formed on the upper surface TE1a of the copper layer TE1 and a gold (Au) layer (that is, gold plating layer) TE32 on the nickel layer TE31. In this case, the uppermost surface of the plating layer TE3 is the gold layer TE32. Also, in the present first embodiment, the nickel layer TE31 forming the plating layer TE3 is thicker than the gold layer TE32 forming the plating layer TE3, and a thickness of the nickel layer TE31 is, for example, about 6 μm, and a thickness of the gold layer TE32 is, for example, about 0.3 μm.

By forming the plating layer TE2 and the plating layer TE3 in the same step as each other, the substrate CB is easily manufactured. In that case, the plating layer TE2 and the plating layer TE3 have the same film configuration as each other.

The plating layer TE2 is formed on the entire lower surface TE1b of the copper layer TE1. That is, the entire lower surface TE1b of the copper layer TE1 is covered with the plating layer TE2. On the other hand, the plating layer TE3 is not formed on the entire upper surface TE1a of the copper layer TE1 but formed on the upper surface TE1a of the copper layer TE1 inside the through hole SH in the upper surface TE1a of the copper layer TE1. That is, in the upper surface TE1a of the copper layer TE1, while the plating layer TE3 is formed in a region overlapped with the through hole SH of the base material BS in a planar view, the plating layer TE3 is not formed except for the part overlapped with the through hole SH of the base material BS in the planar view (that is, in a region bonded to the lower surface BSb of the base material BS via the bonding layer SE). In other words, in the upper surface TE1a of the copper layer TE1, the plating layer TE3 is selectively formed in the region overlapped with the through hole SH in the planar view. Therefore, the upper surface TE1a of the copper layer TE1 in the region where the plating layer TE3 is not formed is in contact with the bonding layer SE, and is bonded to the lower surface BS1b of the base material BS via the bonding layer SE. In other words, the upper surface TE1a of the copper layer TE1 is bonded to the lower surface BS1b of the base material BS via the bonding layer SE except for the through hole SH, and is covered with the plating layer TE3 inside the through hole SH.

As described above, by covering the surface of the copper layer TE1 with the plating layers TE2 and TE3 each made of the metal which is more difficult to be oxidized than copper (Cu), the oxidation of the exposed surface of the terminal TE can be prevented.

Also, the uppermost surface of the plating layer TE3 is the gold (Au) layer TE32, so that the conductive connecting member such as the wire BW can be reliably connected to the exposed surface EX of the terminal TE. Further, the uppermost surface of the plating layer TE2 is the gold (Au) layer TE22, so that electrical characteristics obtained when the terminal TE of the semiconductor device PKG is brought into contact with an external device not illustrated can be improved.

As described above, the terminal TE is formed of the copper layer TE1, the plating layer TE2 formed on the lower surface TE1b of the copper layer TE1, and the plating layer TE3 formed on the upper surface TE1a of the copper layer TE1 inside the through hole SH.

Next, an arrangement example of the plurality of terminals TE on the lower surface CBb of the substrate CB will be explained.

That is, the base material BS (substrate CB) has a side SD1 and a side SD2 which face each other, and a side SD3 and a side SD4 which cross the sides SD1 and SD2 and which face each other. FIG. 2 illustrates a case in which eight terminals (VCC, NC1, GND, NC2, RST, CLK, I/O, and NC3) are formed as the plurality of terminals TE on the lower surface CBb of the substrate CB. More specifically, at the corner portion CN1 defined by the side SD1 and the side SD3, a power-supply potential terminal VCC which supplies a power-supply potential among the plurality of terminals TE is formed. Moreover, at the corner portion CN2 defined by the side SD1 and the side SD4, a spare terminal NC1 among the plurality of terminals TE is formed. Moreover, at the corner portion CN3 defined by the side SD2 and the side SD3, a reference potential terminal GND which supplies a reference potential among the plurality of terminals TE is formed. Moreover, at the corner portion CN4 defined by the side SD2 and the side SD4, a spare terminal NC2 among the plurality of terminals TE is formed. Moreover, between the power-supply potential terminal VCC and the spare terminal NC1, a reset terminal RST which supplies a reset signal (current) and a clock terminal CLK which supplies a clock signal (current) among the plurality of terminals TE are formed. Note that the reset terminal RST is formed on a side close to the corner portion CN1 (that is, a side close to the power-supply potential terminal VCC) between the power-supply potential terminal VCC and the spare terminal NC1, and the clock terminal CLK is formed on a side close to the corner portion CN2 (that is, between the reset terminal RST and the spare terminal NC1). Moreover, between the reference potential terminal GND and the spare terminal NC2, among the plurality of terminals TE, a data terminal I/O which inputs/outputs a data signal (current) and a spare terminal NC3 are formed. Note that the data terminal I/O is formed on a side close to the corner portion CN4 (that is, a side close to the spare terminal NC2) between the reference potential terminal GND and the spare terminal NC2, and the spare terminal NC3 is formed on a side close to the corner portion CN3 (that is, between the reference potential terminal GND and the data terminal I/O).

Also, a planar shape of each of the plurality of terminals TE (excluding the reference potential terminal GND) can be, for example, a substantially rectangular (tetragonal) shape. However, the rectangle (tetragon) forming the planar shape of the terminal TE can be rounded (have arc shapes) at the positions of the corner portions CN1, CN2, CN3, and CN4 in accordance with the fact that the corner portions CN1, CN2, CN3, and CN4 of the base material BS are rounded (have the arc shapes).

Also, the plurality of terminals TE are arranged along the two facing sides SD1 and SD2 among the four sides SD1, SD2, SD3, and SD4 of the base material BS. In the case of FIG. 2, the four terminals (VCC, RST, CLK, and NC1) are arranged along the side SD1, and the four terminals (GND, NC3, I/O, and NC2) are arranged along the side SD2. As described above, by arranging each of the plurality of terminals TE along the two facing sides among the four sides SD1, SD2, SD3, and SD4, change of the planar dimension (for example, increase in the size) of the semiconductor chip CP can be supported without changing the layout of the terminals TE.

In FIG. 2, on the lower surface BSb of the base material BS, note that the reference potential terminal GND arranged at the corner portion CN3 has a shape which is integrally formed with an extension portion extending along the side SD1 (or the side SD2) between the terminals VCC, RST, CLK, and NC1 and the terminals NC3, I/O, and NC2. However, the terminal shape is not limited to this, and, for example, the planar shape of the reference potential terminal GND can be a shape which is symmetrical to the power-supply potential terminal VCC.

Next, the sealing body MR of the semiconductor device PKG will be specifically explained.

In the semiconductor device PKG, the sealing body (sealing resin, sealing portion, sealing resin portion) MR which seals the semiconductor chip CP and the plurality of wires BW is formed on the upper surface CBa of the substrate CB (see FIGS. 3 to 5). The sealing body MR is formed on the upper surface CBa of the substrate CB so as to cover the semiconductor chip CP and the plurality of wires BW. By the sealing body MR, the semiconductor chip CP and the conductive connecting members (the plurality of wires BW here) which electrically connect the plurality of pads PD of the semiconductor chip CP with the plurality of terminals TE can be sealed and protected. The sealing body MR is made of, for example, a resin material such as an epoxy resin (for example, a thermoset resin material), and can contain a filler (silica or others).

The sealing body MR is formed also inside the through hole SH. That is, the sealing body MR is formed so as to include the through hole SH in a planar view, and the through hole SH is filled with a part of the sealing body MR. Therefore, in the through hole SH, the exposed surface EX of the terminal TE which is exposed from the base material BS is covered and sealed with the sealing body MR. In this manner, the joint portion between the conductive connecting member such as the wire BW and the exposed surface EX of the terminal TE is sealed with the sealing body MR.

As described above, the sealing body MR seals the inside of the through hole SH of the base material BS (therefore, the exposed surface EX of the terminal TE), the semiconductor chip CP, and the conductive connecting members (the plurality of wires BW here) which electrically connect the plurality of pads PD with the plurality of terminals TE.

Also, the sealing body MR does not cover the entire upper surface CBa of the substrate CB, and the circumferential part of the upper surface CBa of the substrate CB is exposed without being covered with the sealing body MR. Therefore, the marginal part of the upper surface CBa of the substrate CB can be bonded to a bottom surface 3c of a concave portion 3a of a card main body 2 described later.

Further, when the semiconductor device PKG is housed inside the concave portion 3 of the card main body 2 described later, it is required to provide a thickness of the sealing body MR as large as the semiconductor device PKG can be housed inside the concave portion 3.

<Regarding Structure of IC Card>

Next, an IC (Integrated Circuit) card in which the above-described semiconductor device PKG is embedded will be explained.

Figure 8:
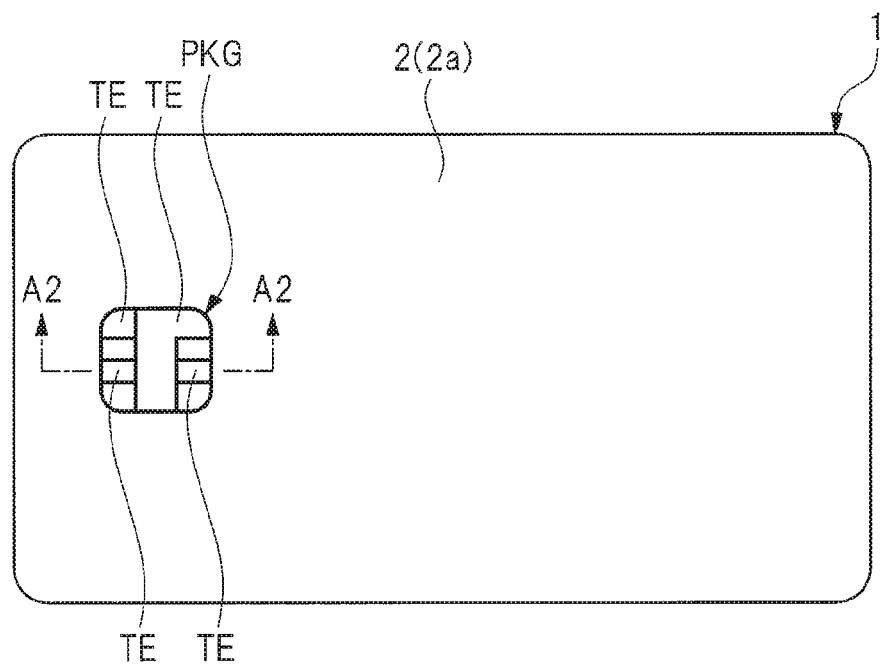
FIG. 8 is a plan view of an IC card of one embodiment.
Figure 9:
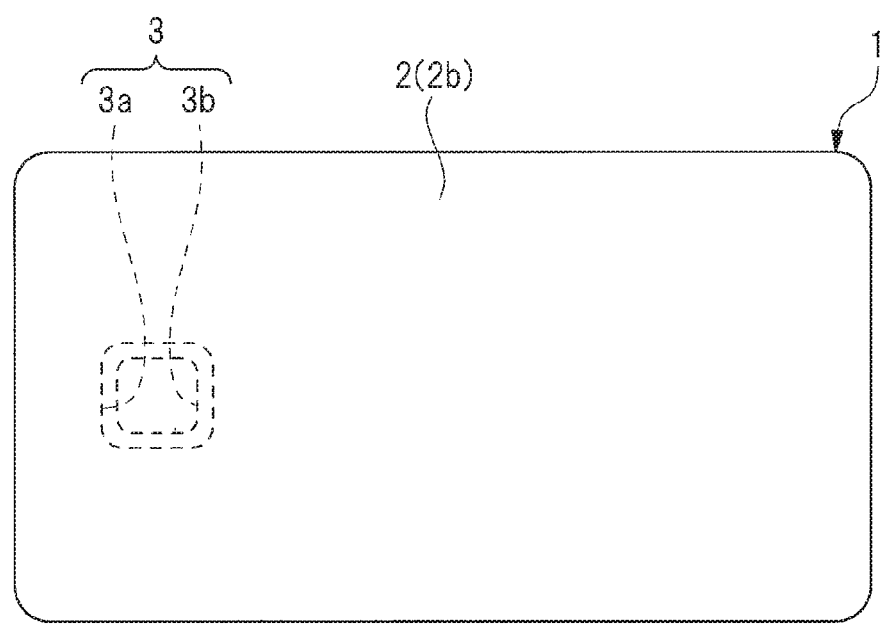
FIG. 9 is a plan view of an IC card of one embodiment.

FIGS. 8 and 9 are plan views of an IC card 1 of the present embodiment, FIG. 8 illustrates a plan view of a front surface side of the IC card 1, and FIG. 9 illustrates a plan view of a back surface side of the IC card 1. Also, FIG. 10 is a partial enlarged cross-sectional view of the IC card 1, and almost corresponds to a cross-sectional view of FIG. 8 on a line A2-A2.

Figure 10:
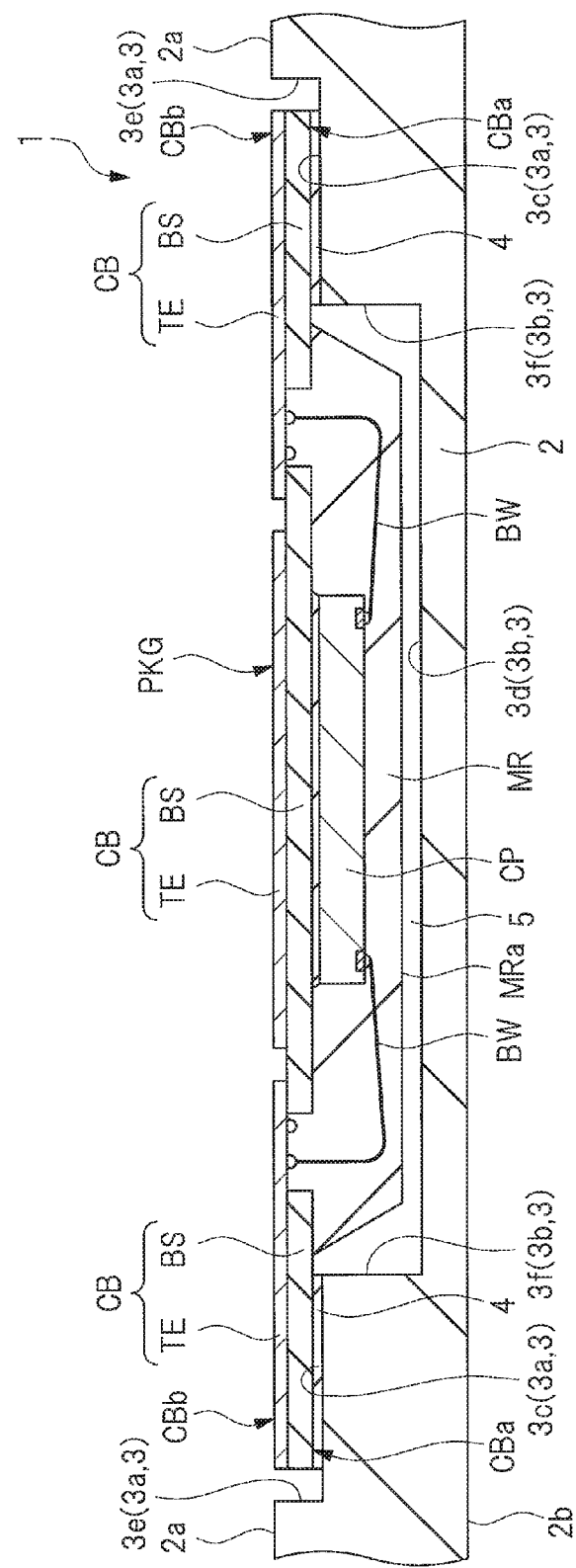
FIG. 10 is a partial enlarged cross-sectional view of an IC card of one embodiment.

The IC card 1 illustrated in FIGS. 8 to 10 is a card in which the above-described semiconductor device PKG is embedded into the card main body 2. In other words, the IC card 1 is an IC card on which the above-described semiconductor device PKG is build. By embedding the semiconductor device PKG into the card main body 2, information can be stored in, for example, (the semiconductor chip CP of) the semiconductor device PKG of the IC card 1, and therefore, the information can be stored in the IC card 1. The above-described terminal TE of the semiconductor device PKG in the IC card can be used as an external terminal (an external connection terminal) of the IC card 1, and data communication can be performed between (the semiconductor device PKG of) the IC card 1 and outside by bringing this terminal TE into contact with an interface of an external device (for example, an external terminal of the external device) not illustrated.

As illustrated in FIGS. 8 and 9, the planar shape of the card main body 2 is, for example, the substantially rectangular (tetragonal) shape. However, the shape can be also a shape obtained by cutting the corners of the rectangle or a shape obtained by rounding the corners of the rectangle (forming the corners in the arc shape). By the shape obtained by rounding the corners of the rectangle, the IC card 1 can be easily handled.

Since the card main body 2 forms an outer shape of the IC card 1, a planar shape of the IC card 1 is similar to a planar shape of the card main body 2. The card main body 2 is made of, for example, a resin such as plastic. Also, by forming the card main body 2 by the resin such as plastic, the IC card 1 is easily handled, and process in manufacturing the card main body 2 is facilitated. As one example of a dimension of the card main body 2, the planar shape is a substantially rectangular shape whose long side length is about 84.6 mm and short side length is about 54 mm (which is a rectangular shape having four arc-shaped corners), and a thickness of the same is about 750 μm.

As illustrated in FIGS. 8 to 10, the card main body 2 has a front surface 2a and a back surface 2b, which are two principal surfaces positioned to be opposite to each other, and the concave portion (hollowed portion) 3 for housing the semiconductor device PKG is formed on the front surface 2a side of the card main body 2. The concave portion 3 is formed on the front surface 2a side of the card main body 2, but does not penetrate through the card main body 2. The semiconductor device PKG is bonded and fixed to the inside of the concave portion 3 formed on the front surface 2a side of the card main body 2 via a bonding material (bonding layer, bonding sheet) 4.

The concave portion 3 has a planar shape and a dimension which are almost equal to or slightly larger than the planar shape of the semiconductor device PKG so that the semiconductor device PKG can be exactly housed therein. Therefore, if the planar shape of the semiconductor device PKG (almost corresponding to the planar shape of the substrate CB) is the shape obtained by rounding the corners of the rectangle, the planar shape of the concave portion 3 can be also a shape obtained by rounding corners of a rectangle.

More specifically, on the front surface 2a of the card main body 2, a concave portion (a hollowed portion) 3a that forms a substantially tetragonal shape in a planar view (in viewing on a plane which is substantially parallel to the front surface 2a of the card main body 2), and a concave portion (a hollowed portion) 3b which is formed inside the concave portion 3a and which is formed to be deeper than the concave portion 3a are formed, and the concave portion 3 is formed of these concave portion 3a and concave portion 3b. In other words, in the planar view (in viewing on a plane that is substantially parallel to the front surface 2a of the card main body 2), the concave portion 3b is included in the concave portion 3a. Also, a depth of the concave portion 3b is deeper than a depth of the concave portion 3a. Therefore, a bottom surface 3c of the concave portion 3a is at a position shallower than a bottom surface 3d of the concave portion 3b, a lateral wall 3f of the concave portion 3b is interposed between the bottom surface 3d of the concave portion 3b and the bottom surface 3c of the concave portion 3a, and a lateral wall 3e of the concave portion 3a is interposed between the bottom surface 3c of the concave portion 3a and the front surface 2a of the card main body 2.

A reason why the concave portion 3 for housing the semiconductor device PKG is formed of the concave portion 3a and the concave portion 3b deeper than the concave portion 3a is that the sealing body MR formed on the upper surface CBa of the substrate CB is housed in the concave portion 3b, and that a region where the sealing body MR is not formed in the upper surface CBa of the substrate CB of the semiconductor device PKG (in other words, an outer peripheral region of the upper surface CBa of the substrate CB) can be bonded to the bottom surface 3c of the concave portion 3a.

And, one surface of a sheet-shaped bonding material 4 is bonded to the upper surface CBa of the substrate CB of the semiconductor device PKG, and the other surface thereof is bonded to the bottom surface 3c of the concave portion 3a. That is, the part overlapped with the bottom surface 3c of the concave portion 3a in the planar view in the upper surface CBa of the substrate CB of the semiconductor device PKG is bonded to the bottom surface 3c of the concave portion 3a via the bonding material 4. In this manner, the semiconductor device PKG can be housed in the concave portion 3, and be fixed to the card main body 2.

On the other hand, the bottom surface 3d of the concave portion 3b and the upper surface of the semiconductor device PKG (in other words, an upper surface MRa of the sealing body MR) are not bonded to each other by a bonding material or others, and a hollow space 5 is formed between the bottom surface 3d of the concave portion 3b and the upper surface of the semiconductor device PKG (in other words, the upper surface MRa of the sealing body MR). In other words, in the semiconductor device PKG housed in the concave portion 3, while the sealing body MR is housed inside the concave portion 3a, the sealing body MR of the semiconductor device PKG and the bottom surface 3d of the concave portion 3b are not bonded to each other so that the hollow space 5 is formed therebetween. By providing the hollow space 5 between the bottom surface 3d of the concave portion 3b and the semiconductor device PKG as described above, even if the card main body 2 is deformed due to external force or others, direct transfer of the stress caused by the deformation to the sealing body MR of the semiconductor device PKG can be suppressed or prevented. Therefore, breakage of the sealing body MR due to the stress caused by external force or others can be suppressed or prevented.

A distance from the bottom surface 3d of the concave portion 3b to the back surface 2b of the card main body 2 (in other words, a thickness of the card main body 2 at the bottom surface 3d of the concave portion 3b) can be, for example, about 100 μm, and a thickness of the hollow space 5 (in other words, a distance from the upper surface MRa of the sealing body MR to the bottom surface 3d of the concave portion 3b) can be, for example, about 50 μm.

Also, a position of the concave portion 3 in the card main body 2, that is, arrangement of the semiconductor device PKG inside the IC card 1 is arranged so as to be closer to one of short sides (short sides of the card main body 2) than a center line that connects centers of facing long sides (long sides of the card main body 2) as illustrated in FIG. 8. Note that the arrangement of the semiconductor device PKG inside the IC card 1 is standardized as a position of an external terminal based on, for example, ISO (International Organization for Standardization) or others.

As described above, the IC card 1 has a structure in which the semiconductor device PKG is embedded inside and fixed to the concave portion 3 formed on the front surface 2a of the card main body 2, and the plurality of terminals TE formed on the semiconductor device PKG are exposed from the card main body 2 on the front surface 2a of the card main body 2 as illustrated in FIG. 8. Therefore, by bringing the plurality of terminals TE into contact with terminals of an external device or others not illustrated, data communication with the external device can be performed. That is, the IC card 1 can perform data communication with outside by a contact method of the contact of the terminals TE.

As a technique of storing information in a card and reading the information by an external device, a magnetic stripe card technique of providing a card with a band made of a magnetic substance and storing information in the magnetic substance is cited. However, the IC card technique has a larger storage capacity than that of the magnetic stripe card technique. Moreover, the IC card technique can be applied to wide usage such as a cash card and a credit card since counterfeit can be suppressed by encrypting data.

A data communication method of the IC card includes not only a contact type in which the external terminal of the semiconductor device PKG is brought into contact with an external device for the communication as described in the present embodiment but also a non-contact type in which an antenna terminal is formed inside the semiconductor device for the communication via the antenna terminal and a combination type in which these types are used in combination. In the present embodiment, a representative example of the types is explained by exemplifying the IC card 1 of the contact type in which the plurality of terminals TE of the semiconductor device PKG are exposed from the front surface 2a of the card main body 2 as illustrated in FIG. 8.

<Regarding Manufacturing Step of Semiconductor Device>

Next, manufacturing steps of the semiconductor device PKG of the present embodiment will be explained.

Figure 11:
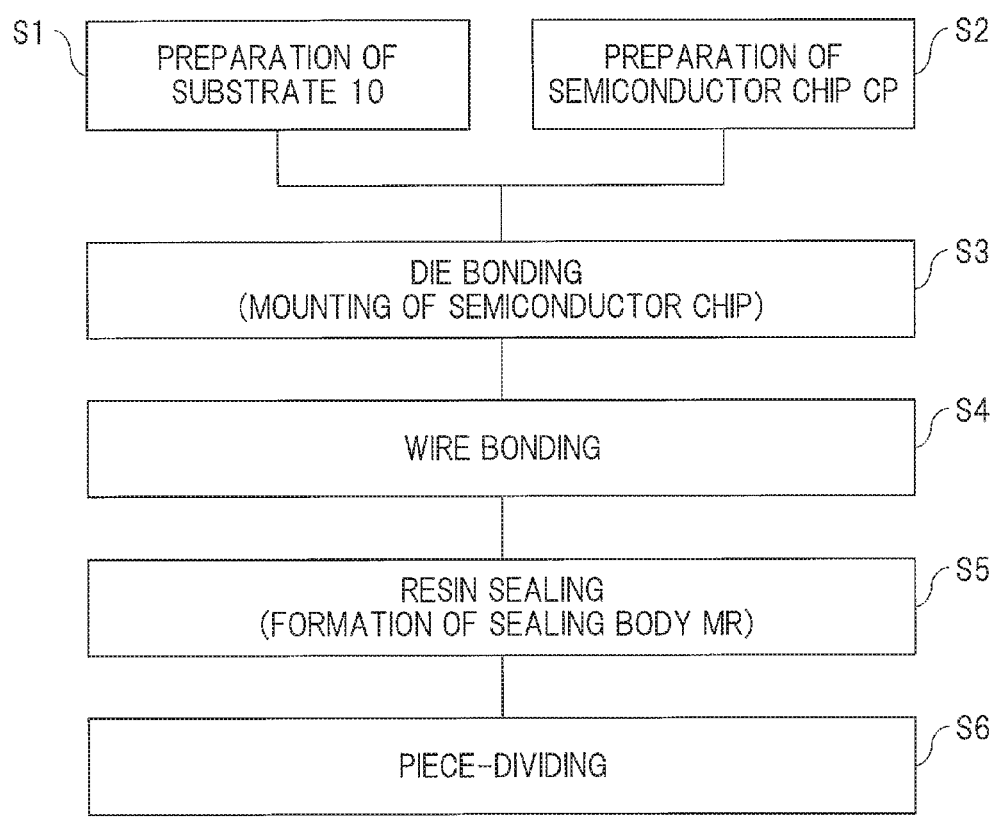
FIG. 11 is a manufacturing process flowchart illustrating a step of manufacturing the semiconductor device of one embodiment.
Figure 12:
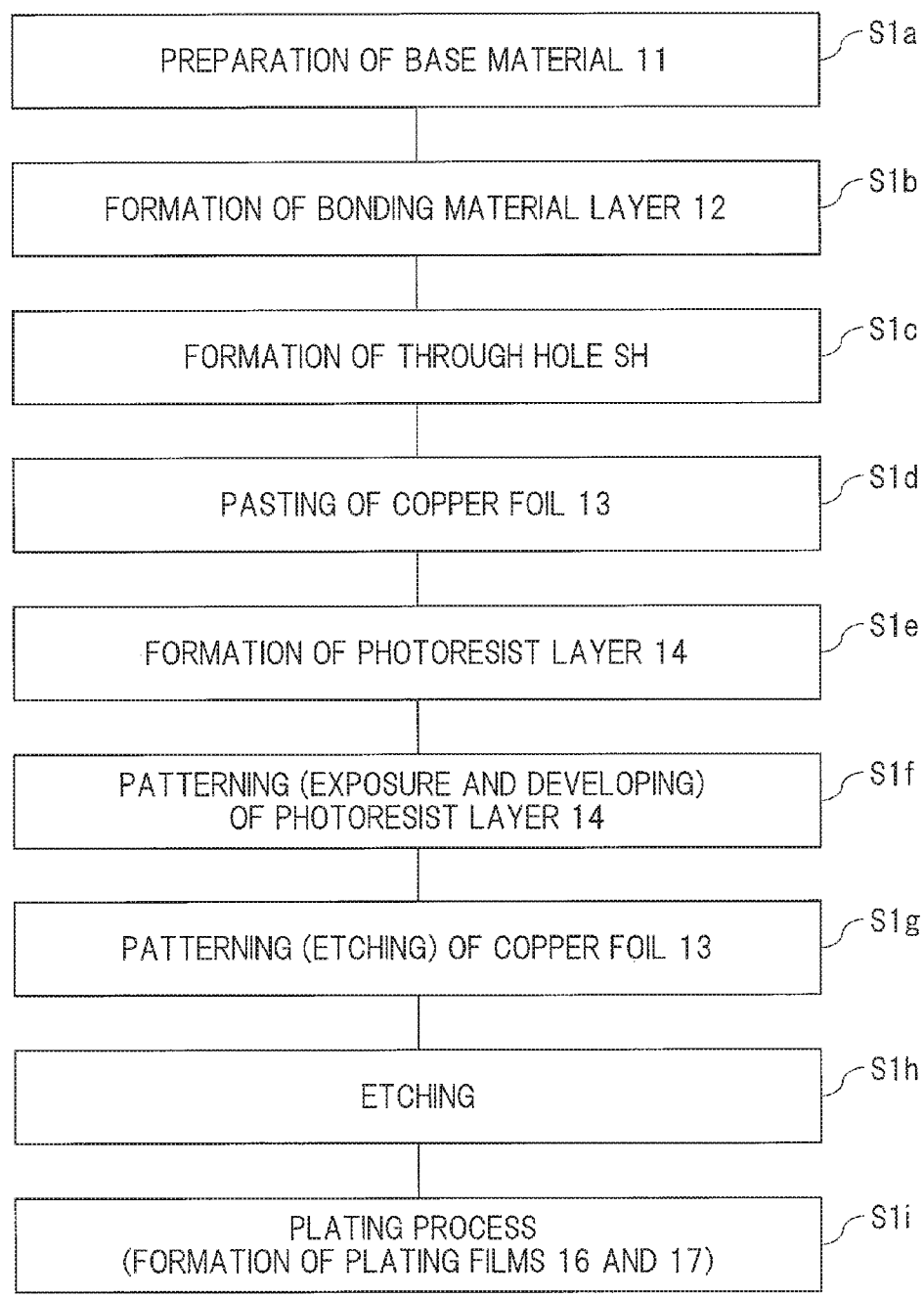
FIG. 12 is a manufacturing process flowchart illustrating a step of manufacturing the semiconductor device (more particularly, a substrate) of one embodiment.

FIGS. 11 and 12 are manufacturing process flow charts illustrating manufacturing steps of the semiconductor device PKG of the present embodiment. FIG. 12 illustrates a process flow which is detail of step S1 in the process flow of FIG. 11. In other words, step S1 of FIG. 11 includes steps S1a to S1i of FIG. 12.

FIGS. 13 to 44 are explanatory diagrams of the manufacturing steps of the semiconductor device PKG of the present embodiment, and each illustrates a plan view or a cross-sectional view. Among FIGS. 13 to 44, FIGS. 13 to 25, 29, 32, 35 to 40, 43, and 44 are cross-sectional views, and FIGS. 26 to 28, 30, 31, 33, 34, 41, and 42 are plan views.

In order to manufacture the semiconductor device PKG, first, a substrate 10 is prepared (manufactured) (step S1 of FIG. 11). Moreover, the semiconductor chip CP is prepared (manufactured) (step S2 of FIG. 11).

The semiconductor chip CP may be prepared in step S2 after preparing the substrate 10 first in step S1, or the substrate 10 may be prepared in step S1 after preparing the semiconductor chip CP first in step S2. Alternatively, the preparation of the substrate 10 in step S1 and the preparation of the semiconductor chip CP in step S2 may be simultaneously performed.

The substrate 10 is a base of the above-described substrate CB, and the substrate 10 is cut in a piece-dividing step of step S6 described later to become the above-described substrate CB.

The preparation step of the substrate 10 in step S1 is formed of steps S1a to S1i of FIG. 12. Hereinafter, steps S1a to S1i of FIG. 12 will be specifically explained with reference to FIGS. 13 to 25. FIGS. 13 to 25 are cross-sectional views each illustrating the manufacturing steps of the substrate 10.

Figure 13:
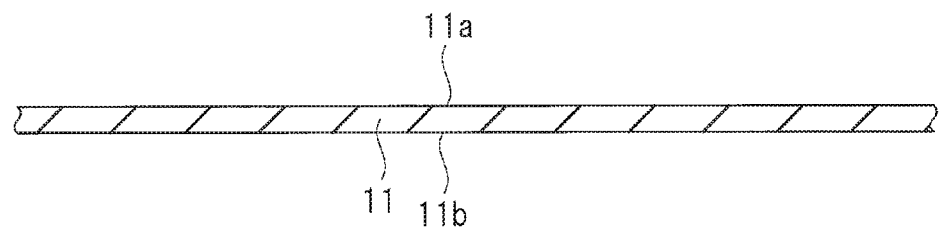
FIG. 13 is a cross-sectional view illustrating a step of manufacturing the substrate.

First, as illustrated in FIG. 13, a base material (base material layer, substrate, base film, tape base material) 11 comprised of insulating material is prepared (provided) (step S1a of FIG. 12).

The base material 11 corresponds to the above-described base material BS. The base material 11 has a principal surface 11a and a principal surface 11b, which are two principal surfaces positioned opposite to each other. The principal surface 11a of the base material 11 becomes the lower surface BSb of the above-described base material BS later, and the principal surface 11b of the base material 11 becomes the upper surface BSa of the above-described base material BS later.

The base material 11 is an insulating layer to be a base of the substrate 10, and is, for example, a glass-epoxy-based resin substrate (resin base material). For example, a glass epoxy substrate (glass epoxy base material) obtained by impregnating glass fiber in an epoxy-based resin can be used as the base material 11. Also, the base material BS is thin, and the base material 11 has flexibility. A thickness of the base material 11 may be, for example, about 110 μm.

Figure 14:
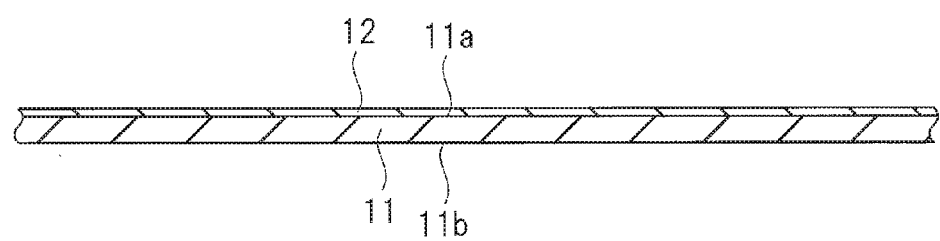
FIG. 14 is a cross-sectional view illustrating a step of manufacturing the substrate.

Next, as illustrated in FIG. 14, a bonding material layer 12 is formed on one principal surface 11a of the base material 11 (step S1b of FIG. 12). The bonding material layer 12 corresponds to the above-described bonding layer SE. The bonding material layer 12 is made of, for example, a modified epoxy resin or others. Also, a thickness of the bonding material layer 12 can be, for example, about 20 μm.

Figure 15:
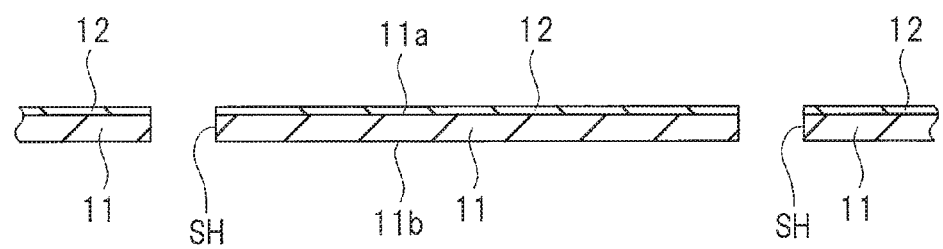
FIG. 15 is a cross-sectional view illustrating a step of manufacturing the substrate.

Next, as illustrated in FIG. 15, the through hole SH is formed in the base material 11 (step S1c of FIG. 12).

The through hole SH penetrates from one principal surface (one of the principal surfaces 11a and 11b) of the base material 11 to the other principal surface (the other of the principal surfaces 11a and 11b) thereof. The through hole SH also penetrates through the bonding material layer 12 in addition to the base material 11. While the through hole SH can be formed by, for example, punch processing (punching), other formation method can be also applied. Also, in step S1c, not only the through hole SH but also a sprocket hole 20c described later can be formed in the base material 11.

Figure 16:
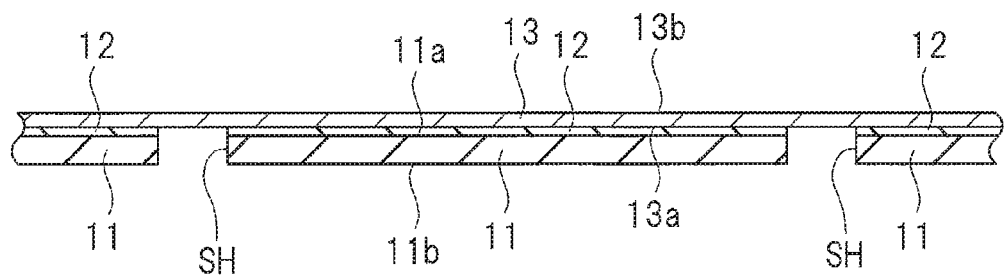
FIG. 16 is a cross-sectional view illustrating a step of manufacturing the substrate.

Next, as illustrated in FIG. 16, copper foil (copper layer) 13 is pasted on the principal surface 11a of the base material 11 via the bonding material layer 12 (step S1d of FIG. 12).

The copper foil 13 is formed into a thin sheet shape, and a thickness of the copper foil can be, for example, about 30 μm.

The copper foil 13 corresponds to the above-described copper layer TE1. The copper foil 13 has a principal surface 13a which is a principal surface on a side bonded to the base material 11 and a principal surface 13b which is a principal surface opposite to the principal surface 13a, and the principal surface 13a of the copper foil 13 is bonded to the principal surface 11a of the base material 11 via the bonding material layer 12. The principal surface 13a of the copper foil 13 becomes the upper surface TE1a of the above-described copper layer TE1 later, and the principal surface 13b of the copper foil 13 becomes the lower surface TE1b of the above-described copper layer TE1 later.

In viewing from the principal surface 11b side of the base material 11, the copper foil 13 is exposed from the through hole SH. In other words, a region of the principal surface 13a of the copper foil 13 which is overlapped with the through hole SH in a planar view is not covered with the copper foil 13 but is exposed from the copper foil 13, and a region of the principal surface 13a of the copper foil 13 which is bonded to the principal surface 11a of the base material 11 via the bonding material layer 12 is not exposed therefrom since the region is covered with the bonding material layer 12 and the base material 11.

The principal surface 13a of the copper foil 13 is roughened to have predetermined surface roughness in order to enhance the adhesiveness with the base material 11, and the roughened principal surface 13a is bonded to the principal surface 11a of the base material 11 via the bonding material layer 12. The principal surface 13b of the copper foil 13 may be roughened or may not be roughened. When the principal surface 13b of the copper foil 13 and the principal surface 13a of the copper foil 13 are similarly roughened, the copper foil 13 can be easily roughened.

Figure 17:
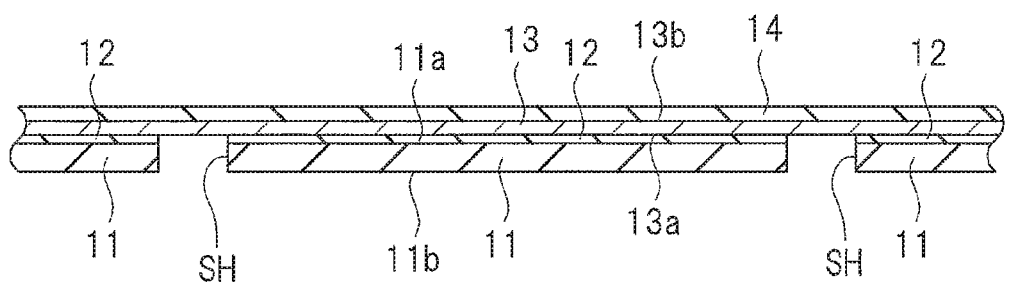
FIG. 17 is a cross-sectional view illustrating a step of manufacturing the substrate.

Next, as illustrated in FIG. 17, a photoresist layer (photoresist film) 14 is formed on the principal surface 13b of the copper foil 13 (step S1e of FIG. 12).

In step S1e, a photoresist layer 14 formed of a pasted photoresist film can be formed by, for example, pasting the sheet-shaped photoresist film onto the principal surface 13b of the copper foil 13. As the pasted photoresist film, for example, a photoresist dry film can be used.

The process performed up to step S1e causes a state in which the bonding layer 12, the copper foil 13, and the photoresist layer are stacked on the principal surface 11a of the base material 11 in an order closer to the base material 11.

Next, the photoresist layer 14 is patterned by performing an exposure process and a development process to the photoresist layer 14 (step S1f of FIG. 12).

Figure 18:
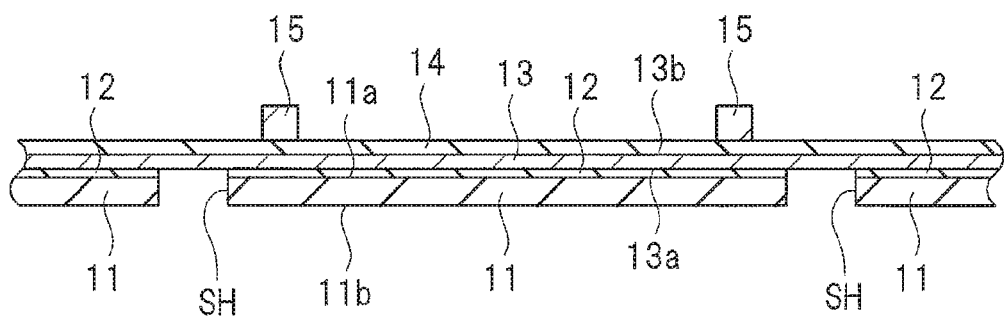
FIG. 18 is a cross-sectional view illustrating a step of manufacturing the substrate.
Figure 19:
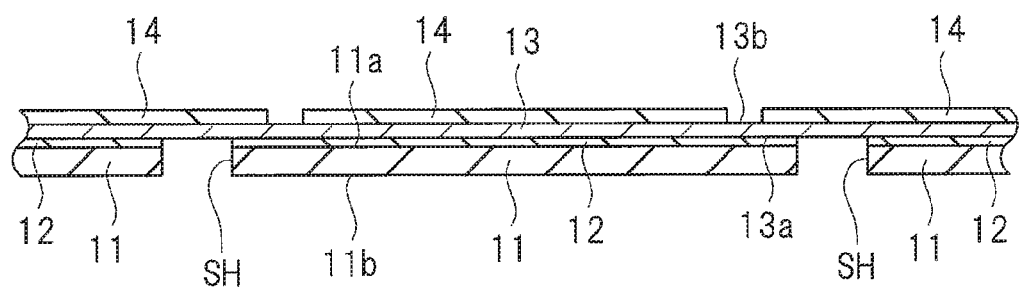
FIG. 19 is a cross-sectional view illustrating a step of manufacturing the substrate.

This step S1f can be performed as, for example, follows. That is, first, an exposure mask 15 is formed or arranged above the photoresist layer 14 as illustrated in FIG. 18, and then, the photoresist layer 14 is exposed to light as using the mask 15 as a light-shielding mask. Then, the mask 15 is removed from above the photoresist layer 14, and then, the development process for the photoresist layer 14 is performed. In this manner, as illustrated in FIG. 19, the photoresist layer 14 can be patterned. FIG. 18 illustrates a case of the mask 15 using a negative-type photoresist (a photoresist whose exposed part is left) as the photoresist layer 14. However, as the photoresist layer 14, a positive-type photoresist (a photoresist whose exposed part is removed) can be also used.

Figure 20:
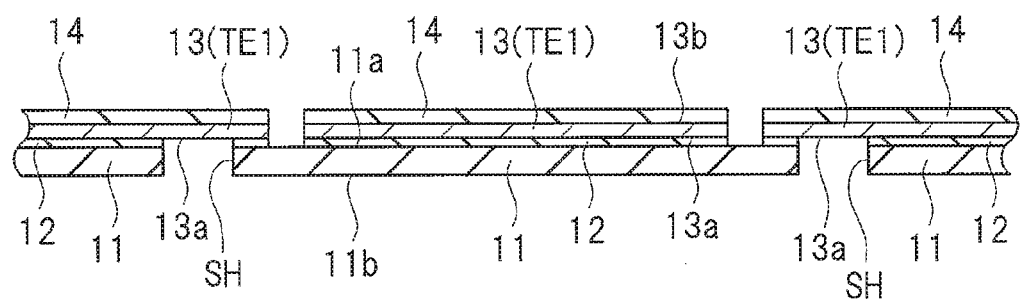
FIG. 20 is a cross-sectional view illustrating a step of manufacturing the substrate.
Figure 21:
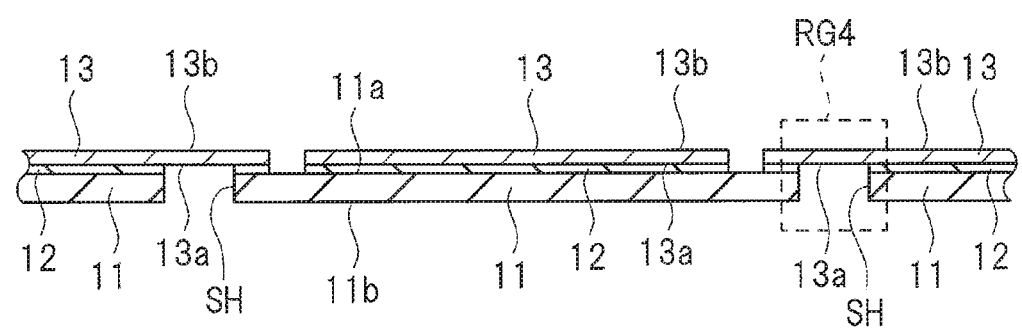
FIG. 21 is a cross-sectional view illustrating a step of manufacturing the substrate.

Next, as illustrated in FIG. 20, the copper foil 13 is etched and patterned as using the photoresist layer 14 as an etching mask (step S1g of FIG. 12). In this manner, the copper foil 13 is patterned into a predetermined pattern (planar shape). The patterned copper foil 13 becomes the copper layer TE1 of the above-described terminals TE. After the etching of step S1g, the photoresist layer 14 is removed as illustrated in FIG. 21.

In step S1g, the copper foil 13 is patterned so as to have the pattern (planar shape) of the terminals TE1 by the etching. The copper foil 13 is patterned in step S1g into the same pattern as that of the photoresist layer 14 which is functioned as the etching mask by patterning the photoresist layer 14 in step S1f into the pattern of the above-described terminals TE, and therefore, the copper foil 13 can be patterned into the pattern of the above-described terminals TE.

Also, in step S1g, the copper foil 13 is etched as using the photoresist layer 14, which is formed on the principal surface 13b of the copper foil 13, as the etching mask, and therefore, the principal surface 13a of the copper foil 13 exposed from the through hole SH is configured not to be etched.

Further, in step S1g, in a region from which the copper foil 13 is removed by the etching, the bonding material layer 12 for bonding and fixing the copper foil 13 is also removed so that the principal surface 11a of the base material 11 is exposed. Depending on cases, note that the bonding material layer 12 can be left in the region from which the copper foil 13 is removed.

Next, the principal surface 13a of the copper foil 13 which is exposed from the through hole SH of the base material 11 is etched (step S1h of FIG. 12).

Figure 22:
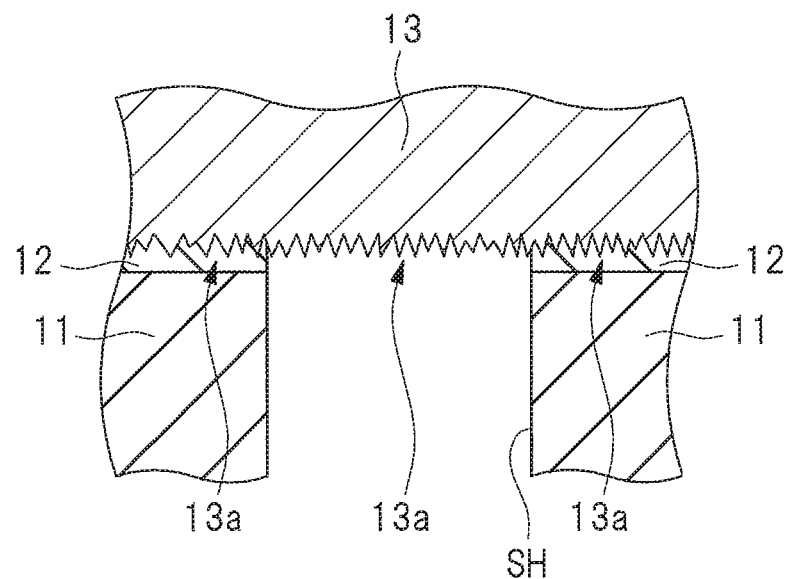
FIG. 22 is a cross-sectional view illustrating a step of manufacturing the substrate.
Figure 23:
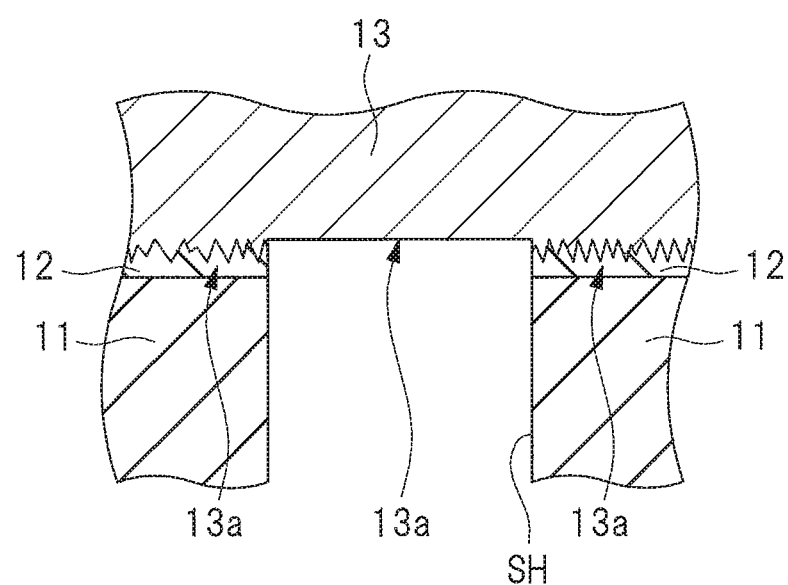
FIG. 23 is a cross-sectional view illustrating a step of manufacturing the substrate.

FIGS. 22 and 23 illustrate enlarged views of a region RG4 surrounded by a dotted line in FIG. 21. FIG. 22 illustrates a state immediately before the etching of step S1h, and FIG. 23 illustrates a state after the etching of step S1h.

The etching of step Sh1 is a flattening process for flattening the principal surface 13a of the copper foil 13, which is exposed from the through hole SH of the base material 11. This flattening process is performed for improving the connectivity obtained when the conductive connecting member (for example, the wire) is connected to the exposed surface EX of the above-described terminal TE.

In step S1h, the copper foil 13 exposed from the through hole SH of the base material 11 is prevented from being excessively etched to form a hole in the copper foil 13 at the bottom of the through hole SH. Therefore, the etching of step S1h is preferably soft etching (light-degree etching process). In this manner, only the surface part of the principal surface 13a of the copper foil 13 which is exposed from the through hole SH of the base material 11 can be etched so as to enhance the flatness of the principal surface 13a of the copper foil 13 which is exposed from the through hole SH of the base material 11. Also, the etching of step S1h is preferably wet etching. In this manner, the etching for the flattening process can be more accurately performed.

When the wet etching is performed in step S1h, the principal surface 13a of the copper foil 13 which is exposed from the through hole SH of the base material 11 is etched to enhance the flatness. However, the principal surface 13b of the copper foil 13 is also etched to enhance the flatness. However, even when the wet etching is performed in step S1h, the region in the principal surface 13a of the copper foil 13, the region being bonded to the principal surface 11a of the base material 11 via the bonding material layer 12 (in other words, the principal surface 13a of the copper foil 13 except for the part exposed from the through hole SH), is not exposed to an etching solution, and therefore, is not etched, and the flatness of the region is not changed.

That is, the exposed region of the copper foil 13 (in other words, the region exposed from the through hole SH in the principal surface 13a of the copper foil 13 and the entire principal surface 13b of the copper foil 13) is etched by the wet etching in step S1h, so that the flatness is enhanced (in other words, the surface roughness is reduced). On the other hand, the non-exposed region of the copper foil 13 (in other words, the region bonded to the principal surface 11a of the base material 11 via the bonding material layer 12 in the principal surface 13a of the copper foil 13) is not etched in step S1h, so that the flatness is not changed (in other words, the surface roughness is not changed).

As illustrated in FIG. 22, before the etching of step S1h regarding the flatness of the principal surface 13a of the copper foil 13, the region exposed from the through holes SH and the region bonded to the principal surface 11a of the base material 11 via the bonding material layer 12 have almost the same flatness as each other. In other words, at a stage before the etching of step S1h, the region exposed from the through hole SH and the region bonded to the principal surface 11a of the base material 11 via the bonding material layer 12 have almost the same surface roughness of the principal surface 13a of the copper foil 13. However, regarding the flatness of the principal surface 13a of the copper foil 13, when the etching of step S1h is performed, the flatness of the region exposed from the through hole SH is higher than the flatness of the region bonded to the principal surface 11a of the base material 11 via the bonding material layer 12 as illustrated in FIG. 23. In other words, when the etching of step S1h is performed, the surface roughness of the principal surface 13a of the copper foil 13 is smaller in the region exposed from the through hole SH than the region bonded to the principal surface 11a of the base material 11 via the base material layer 12. That is, when the etching of step S1h is performed, the surface roughness of the region which is exposed from the through hole SH in the principal surface 13a of the copper foil 13 is smaller than the surface roughness of the region which is bonded to the principal surface 11a of the base material 11 via the bonding material layer 12 in the principal surface 13a of the copper foil 13.

Figure 24:
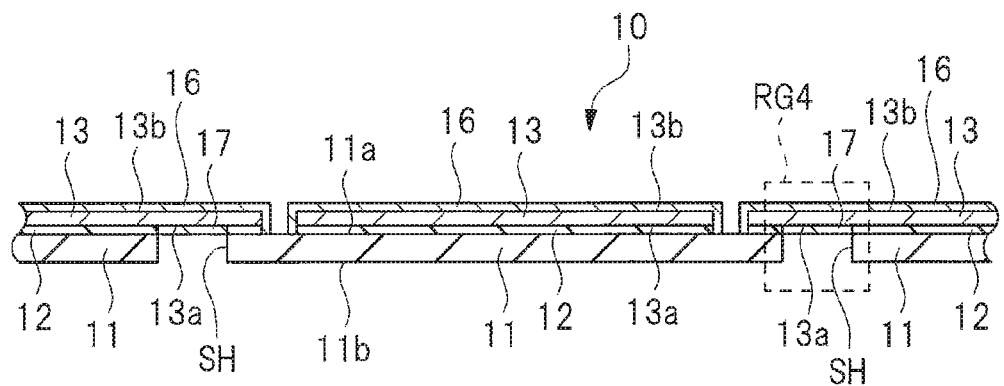
FIG. 24 is a cross-sectional view illustrating a step of manufacturing the substrate.
Figure 25:
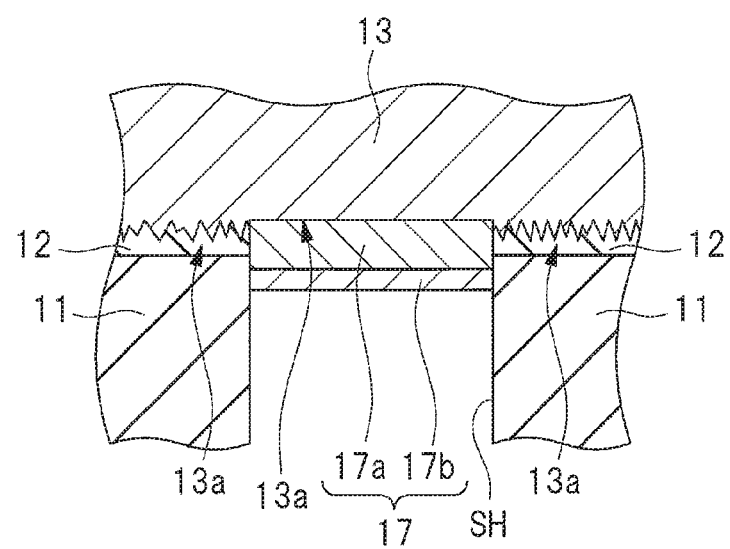
FIG. 25 is a cross-sectional view illustrating a step of manufacturing the substrate.

Next, as illustrated in FIGS. 24 and 25, plating films 16 and 17 are formed on the exposed surfaces of the copper foil 13 (step S1i of FIG. 12). Note that FIG. 25 illustrates an enlarged view of the region RG4 surrounded by the dotted line in FIG. 24. Therefore, FIGS. 22, 23, and 25 illustrate different step stages for the same region RG4.

The plating film 16 corresponds to the above-described plating layer TE2, and the plating film 17 corresponds to the above-described plating layer TE3. The plating film 16 (corresponding to the above-described plating layer TE2) is formed on the entire principal surface 13b (corresponding to the above-described lower surface TE1b) of the copper foil 13 (corresponding to the above-described copper layer TE1), and the plating film 17 (corresponding to the above-described plating layer TE3) is formed on the principal surface 13a (corresponding to the above-described upper surface TE1a) of the copper foil 13 (corresponding to the above-described copper layer TE1) exposed from the through hole SH. Each of the plating films 16 and 17 can be formed of, for example, a stacked film of a nickel plating film 17a and a gold plating film 17b on the nickel plating film 17a. In that case, the gold plating film becomes the uppermost surface film.

It is more preferred to form the plating film 16 and the plating film 17 in the same step (the same plating step) as each other. In this manner, the substrate 10 is easier to be manufactured. When the plating film 16 and the plating film 17 are formed in the same step (the same plating step) as each other, the plating film 16 and the plating film 17 have the same film configuration.

In step S1i, the plating films 16 and 17 can be formed by, for example, an electrolytic plating method. When the electrolytic plating is performed, note that a power supply line for supplying electricity is required. However, the power supply line is cut after forming the plating film 16, so that the plurality of terminals TE can be independently formed from each other.

The above-described terminals TE are formed by the copper foil 13 patterned in step S1g and the plating films 16 and 17 formed in step S1i. That is, the terminals TE are formed by forming the copper layer TE1 by the copper foil 13 patterned in step S1g and forming the plating layers TE2 and TE3 by the plating films 16 and 17 formed in step S1i. In other words, the terminals TE are formed by the copper layer TE1 formed of the patterned copper foil 13, the plating layer TE2 formed of the plating film 16, and the plating layer TE3 formed of the plating film 17.

In this manner (by steps S1a to S1i), the substrate 10 can be manufactured.

The substrate 10 manufactured in steps S1a to S1i (in other words, the substrate 10 prepared in step S1) is illustrated in FIGS. 26 to 29.

Figure 26:
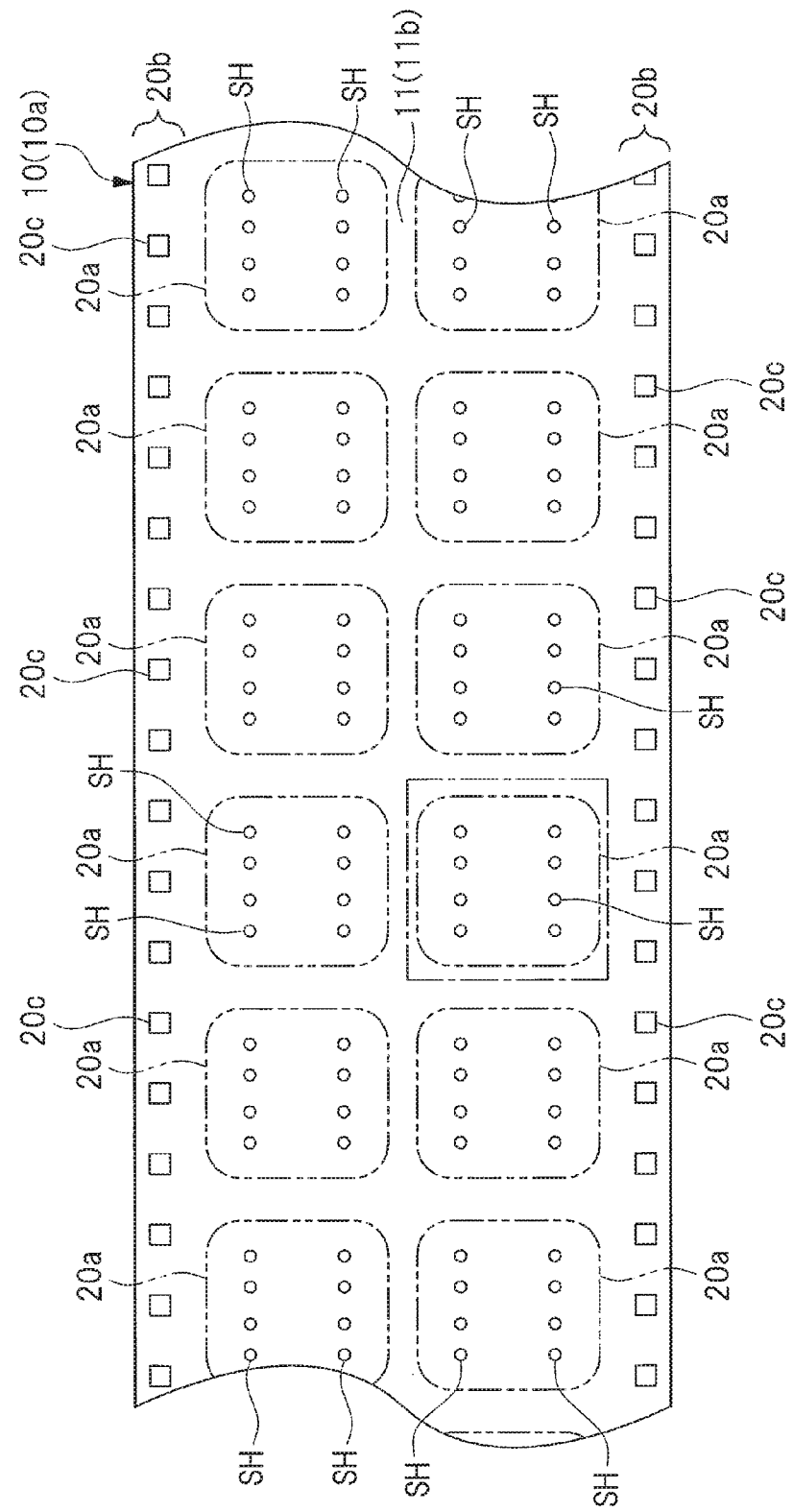
FIG. 26 is a plan view illustrating an upper surface side of the substrate.
Figure 27:
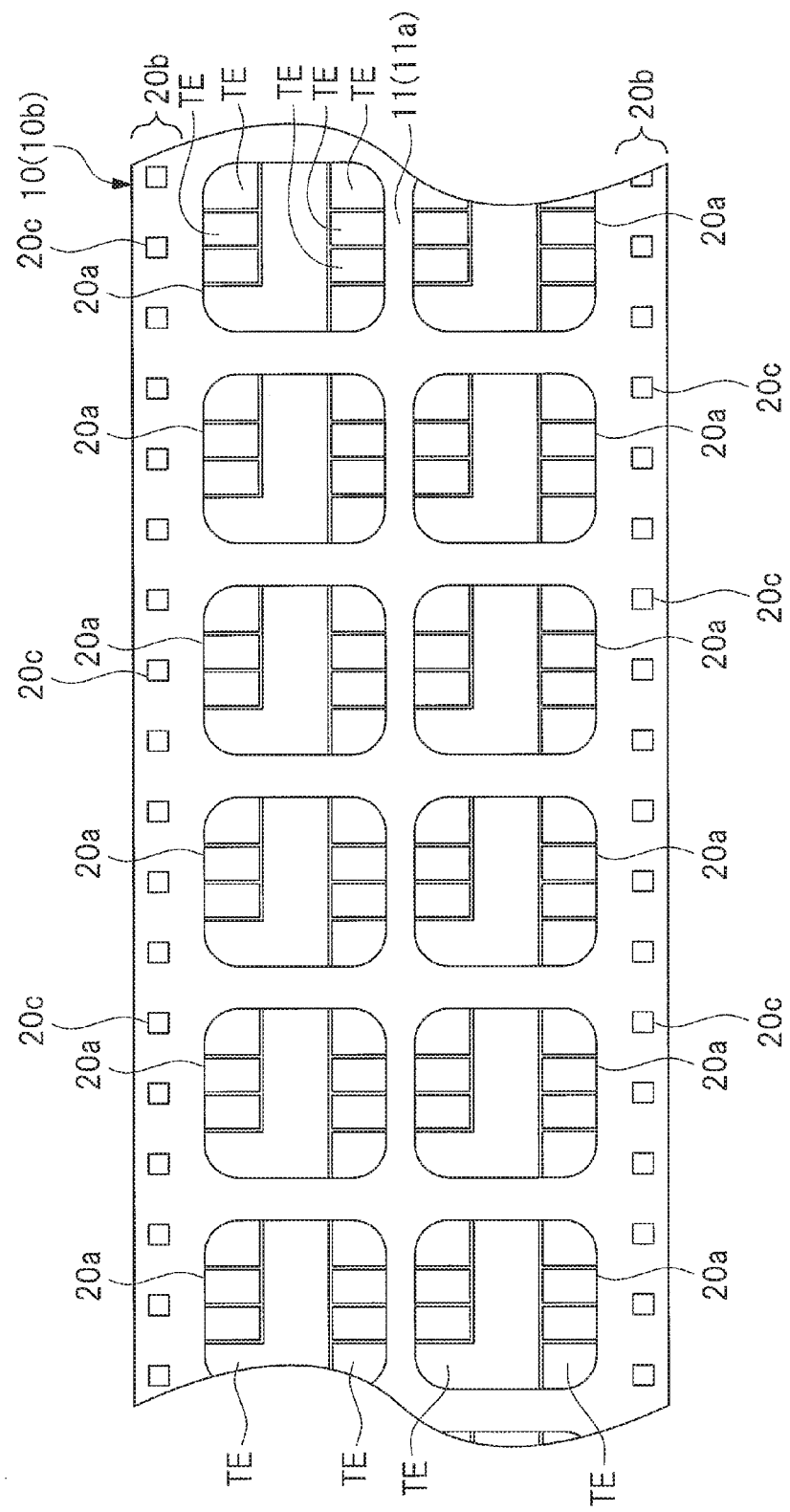
FIG. 27 is a plan view illustrating a lower surface side of the substrate.
Figure 28:
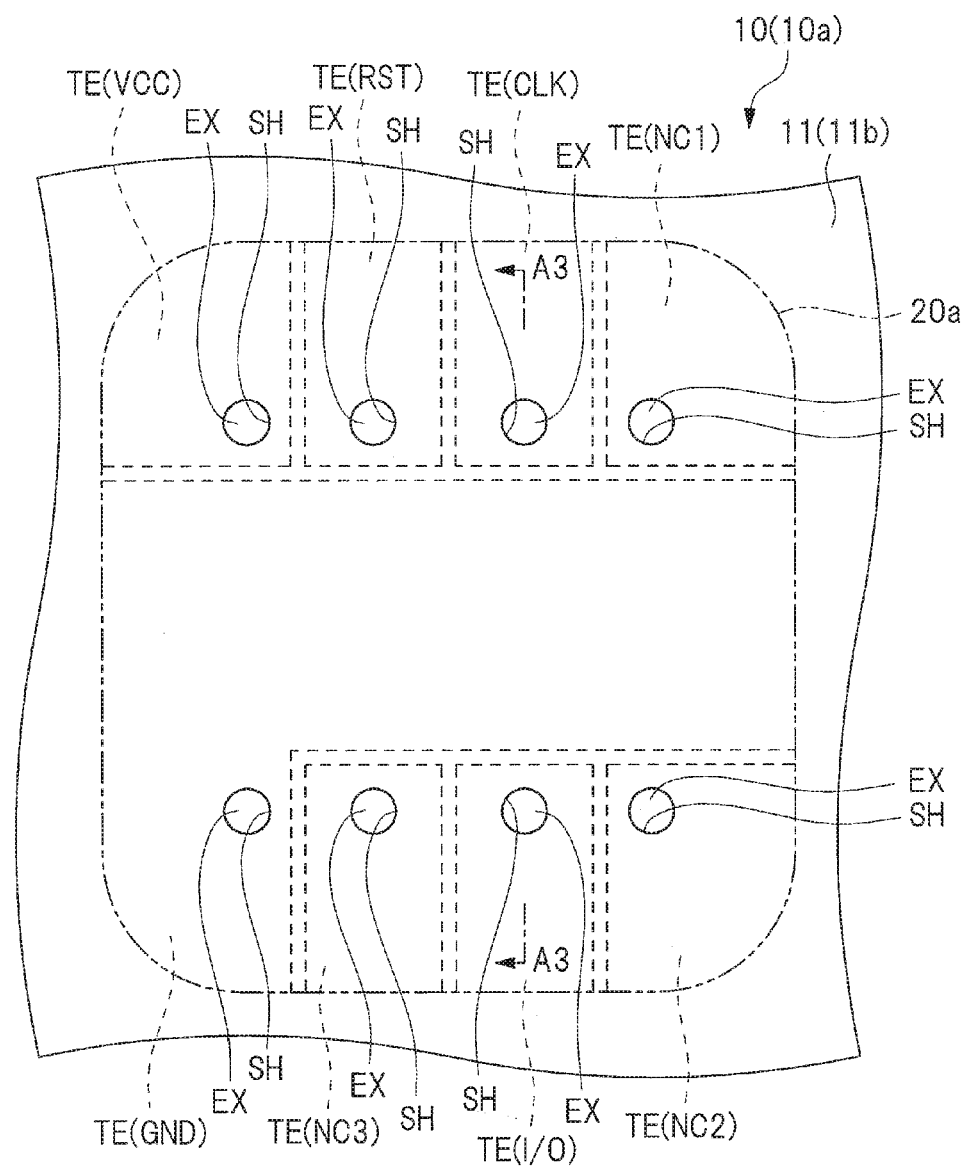
FIG. 28 is a partial enlarged plan view partially enlarging FIG. 26.
Figure 29:
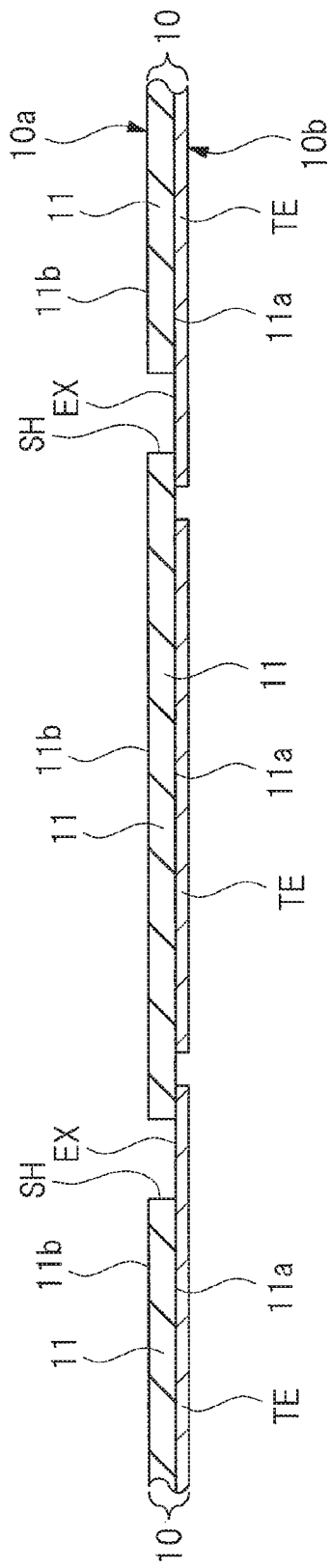
FIG. 29 is a cross-sectional view of FIG. 28 at a position of a line A3-A3.

FIG. 26 is a plan view illustrating the upper surface 10a side of the substrate 10, FIG. 27 is a plan view illustrating the lower surface 10b side of the substrate 10, FIG. 28 is a partial enlarged plan view enlarging a part of FIG. 26, and FIG. 29 is a cross-sectional view of the substrate 10. The illustration of FIG. 28 is made so as to enlarge one device region 20a among a plurality of device regions 20a provided on the substrate 10 illustrated in FIG. 26. In FIG. 28, note that each outline position of the terminals TE formed on the lower surface 10b of the substrate 10 are illustrated by dotted lines in order to easily understand a planar positional relation among members. Also, FIG. 29 almost corresponds to the cross-sectional view of FIG. 28 on a line A3-A3.

As illustrated in FIGS. 26 to 29, the substrate 10 prepared in step S1 has: the base material (tape base material) 11 having the principal surface (lower surface, back surface) 11a and the principal surface (upper surface, front surface) 14b opposite to the principal surface 11a; the plurality of terminals TE bonded and fixed to the principal surface 11a of the base material 11 via the above-described bonding material layer 12 (illustration is omitted in FIG. 29); and the through hole SH formed in the base material 11. The through hole SH is formed for each of the terminals TE so that the through hole SH is formed in the terminal TE at a position overlapped with the terminal in a planar view.

The through hole SH is formed so as to penetrate through the base material 11 from one principal surface (one of the principal surfaces 11a and 11b) of the base material 11 to the other principal surface (the other of the principal surfaces 11a and 11b) thereof but so as not to penetrate through the terminal TE, and a part (in other words, the exposed surface EX) of the terminal TE is exposed form the through hole SH in viewing the principal surface 11b of the base material 11. In other words, in each through hole SH, the part (in other words, the exposed surface EX) of the terminal TE is not covered with the base material 11 but is exposed from the base material 11. As described above, the part (surface) of exposed from the through hole SH in the terminal TE is referred to as the exposed surface EX. The exposed surface EX is formed of the surface of the above-described plating layer TE3 (plating film 17).

Also, as illustrated in FIGS. 26 and 27, the substrate 10 is provided with the plurality of device regions 20a inside a frame portion 20b in a planar view. More specifically, in the substrate 10, the plurality of device regions 20a are arranged in an array form (matrix shape). As an example, FIGS. 26 and 27 illustrate twelve device regions 20a which are arranged in two rows and six columns in the substrate 10. However, the arrangement of the device regions 20a is not limited to this arrangement, and can be variously changed. That is, the substrate 10 is a so-called multiple-piece-taking substrate having the plurality of device regions 20a.

In the frame portion 20b of the substrate 10, the plurality of sprocket holes (feeding holes, through holes) 20c for continuously processing the tape-shaped substrate 10 (substrate 11) in an assembly step of the semiconductor device PKG are formed along a long-side direction (extending direction) of the substrate 10 at, for example, a constant interval. The sprocket holes 20c are formed in the vicinities of the two facing long sides of the substrate 11 along the long sides so as to penetrate through the substrate 11.

Each of the device regions 20a corresponds to the above-described substrate CB, and each of the device regions 20a becomes the above-described substrate CB by cutting the substrate 10 in the piece-dividing step of step S6 described later.

Also, on the lower surface 10b side of the substrate 10, the plurality of terminals TE are formed in each of the plurality of device regions 20a. The arrangement of the terminals TE in each of the device regions 20a is similar to the arrangement of the terminals TE in the above-described substrate CB, and therefore, repeated explanation of the arrangement will be omitted here. Note that the substrate 10 has the upper surface (chip mounting surface) 10a which is a principal surface corresponding to the upper surface CBa of the above-described substrate CB, and the lower surface (terminal surface, terminal formation surface) 10b which is a principal surface corresponding to the lower surface CBb of the above-described substrate CB, and that the upper surface 10a and the lower surface 10b are principal surfaces which are opposite to each other. The upper surface 10a of the substrate 10 is the same surface as the principal surface 11b of the base material 11.

Further, when the semiconductor chip CP is prepared in step S2, the semiconductor chip CP can be manufactured by, for example, forming various semiconductor elements or semiconductor integrated circuits on a principal surface of a semiconductor substrate (semiconductor wafer) made of single crystal silicon, and then, dividing the semiconductor substrate into semiconductor chips by dicing or others. Note that the above-described stud bump BP can be previously formed before dicing the semiconductor substrate (semiconductor wafer). However, in the present embodiment, a case of the formation of the stud bump in a wire bonding step described later will be explained since the stud bump can be formed by using the same apparatus as that used in the wire bonding step.

Also, here, the case of the preparation of the substrate 10 in step S1 by manufacturing the substrate 10 by the above-described steps S1a to S1i has been explained. As another aspect, an already-manufactured substrate 10 (substrate 10 illustrated in FIGS. 26 to 29) can be also prepared in step S1.

Figure 30:
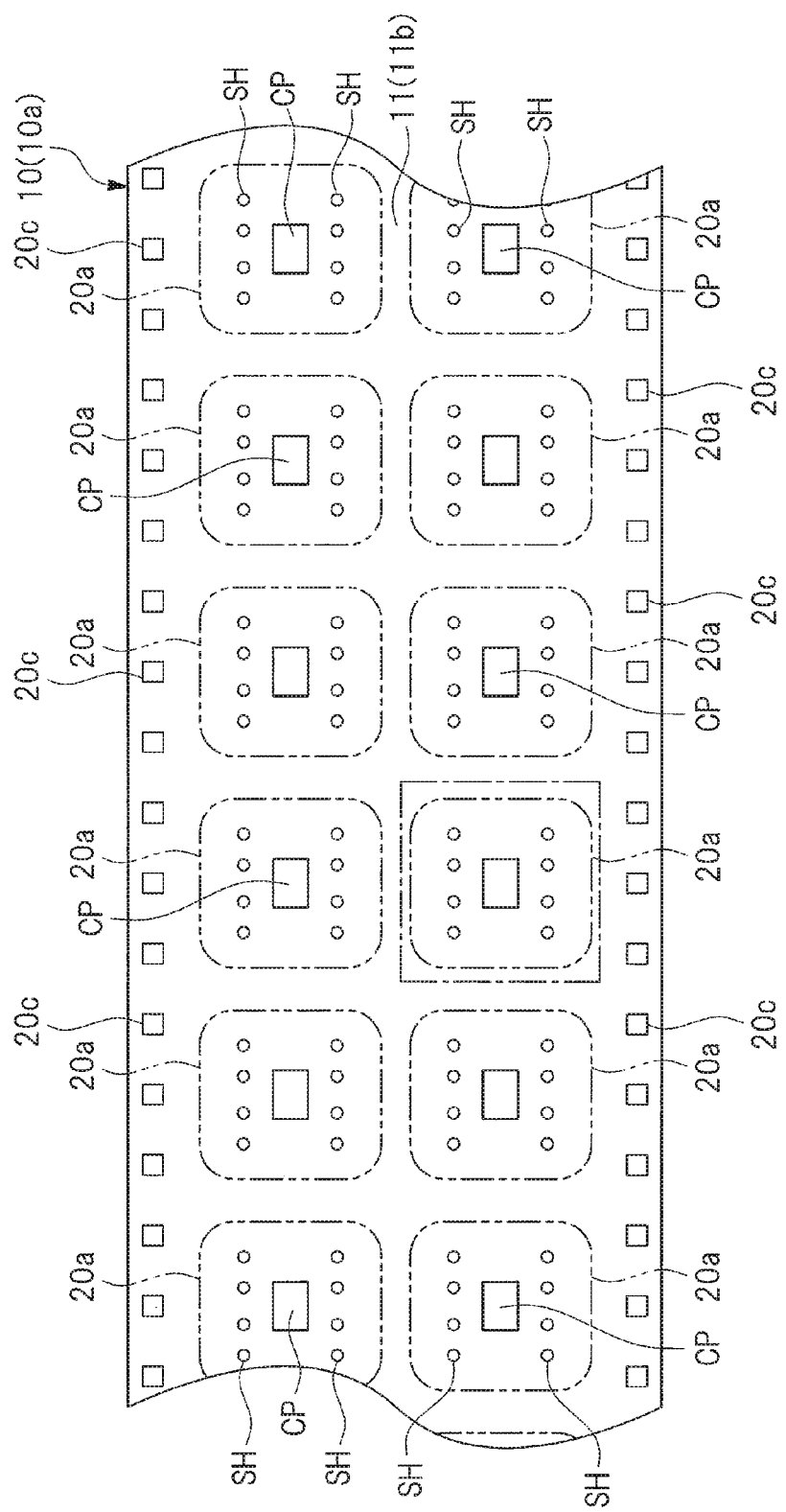
FIG. 30 is a plan view illustrating the upper surface side of the substrate obtained after a die bonding step.
Figure 31:
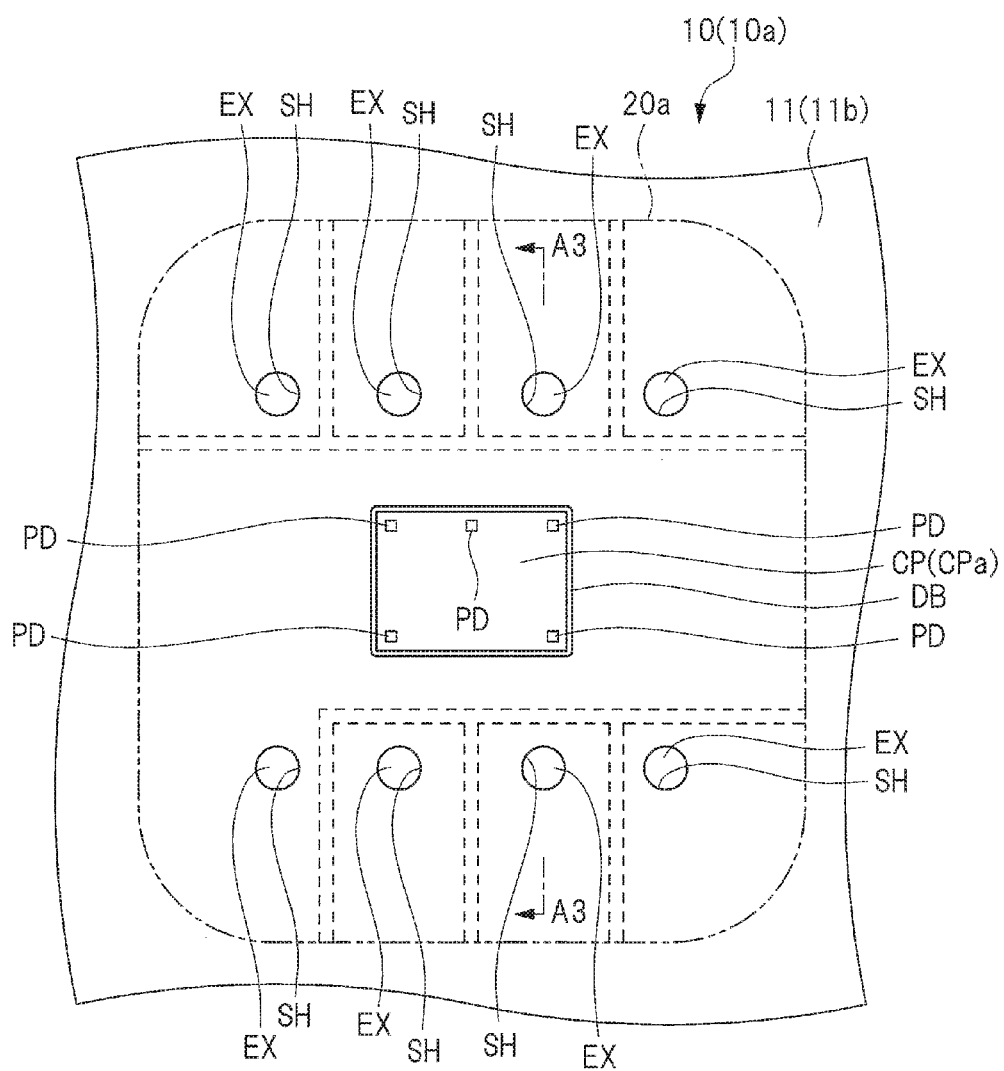
FIG. 31 is a partial enlarged plan view partially enlarging FIG. 30.
Figure 32:
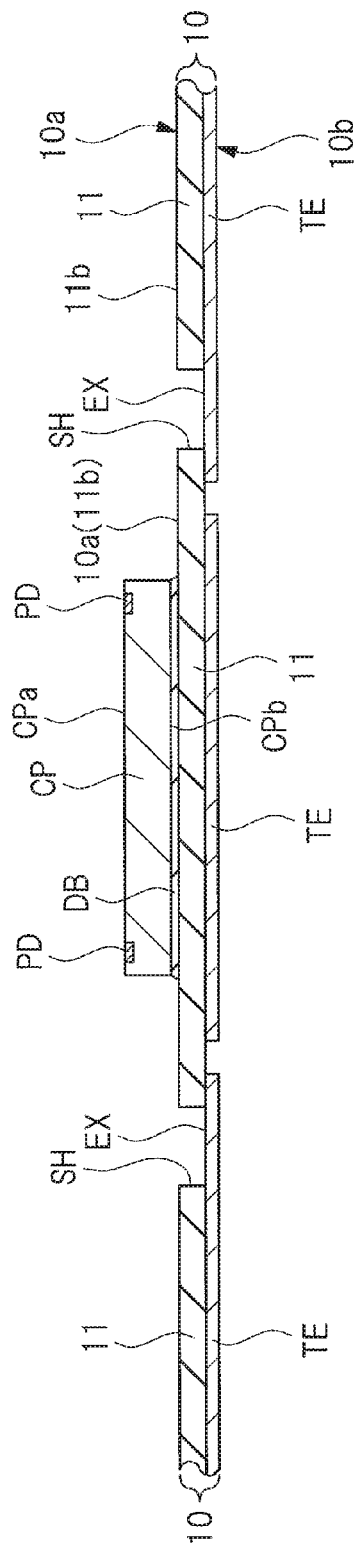
FIG. 32 is a cross-sectional view of FIG. 31 at a position of a line A3-A3.

After the preparation of the substrate 10 and the semiconductor chips CP in steps S1 and S2, a die bonding step is performed to mount the semiconductor chips CP on the plurality of device regions 20a of the upper surface 10a of the substrate CB, respectively, as illustrated in FIGS. 30 to 32 (step S3 of FIG. 11).

FIGS. 30 to 32 correspond to the above-described FIGS. 26, 28, and 29, respectively. FIG. 30 is a plan view illustrating the upper surface 10a side of the substrate 10, FIG. 31 illustrates a partially-enlarged plan view enlarging a part (one device region 20a) of FIG. 30, and FIG. 32 illustrates a cross-sectional view of FIG. 31 on a line A3-A3 (cross-sectional view at the same position as that of the above-described FIG. 29), all of the drawings illustrate a state obtained after the die bonding step of step S3. As similar to the above-described FIG. 28, the outline shape positions of the terminals TE formed on the lower surface 10b of the substrate 10 are illustrated by dotted lines also in FIG. 31.

In step S3, the back surface CPb of the semiconductor chip CP is mounted on the upper surface 10a of each of the device regions 20a of the substrate 10 so as to face the upper surface 10a of the substrate 10 (the principal surface 11b of the base material 11) via a bonding material DB which is a die bond material (face-up packaging). Also, as illustrated in FIG. 31, the semiconductor chip CP is arranged at the center part of the device region 20a so that each side of the planar shape of the semiconductor chip CP is arranged along each side of the device region 20a.

In step S3, the semiconductor chip CP is mounted on the substrate CB via the bonding material DB such as an epoxy-based thermoset resin. When a paste material having fluidity is used as the bonding material DB, the paste-state bonding material DB is applied first onto a region where the semiconductor chip CP is to be mounted in the upper surface CBa of the substrate CB, and the back surface CPb of the semiconductor chip CP is mounted on the upper surface 10a of the substrate 10 via the bonding material DB, and then, the bonding material DB is hardened (for example, is hardened by thermal treatment). In this manner, the paste-state bonding material DB is hardened, and the semiconductor chip CP is bonded and fixed to the substrate CB by the hardened bonding material DB.

Here, note that the case of usage of the paste material made of the thermoset resin as the bonding material DB has been explained. However, various modification examples can be applied. For example, not the paste material but a tape material (film material) whose both surfaces have bonding layers can be previously pasted on the back surface CPb of the semiconductor chip CP as the bonding material DB, and the semiconductor chip CP can be mounted on the upper surface 10a in the device region 20a of the substrate 10 via this tape material (bonding material DB).

Figure 33:
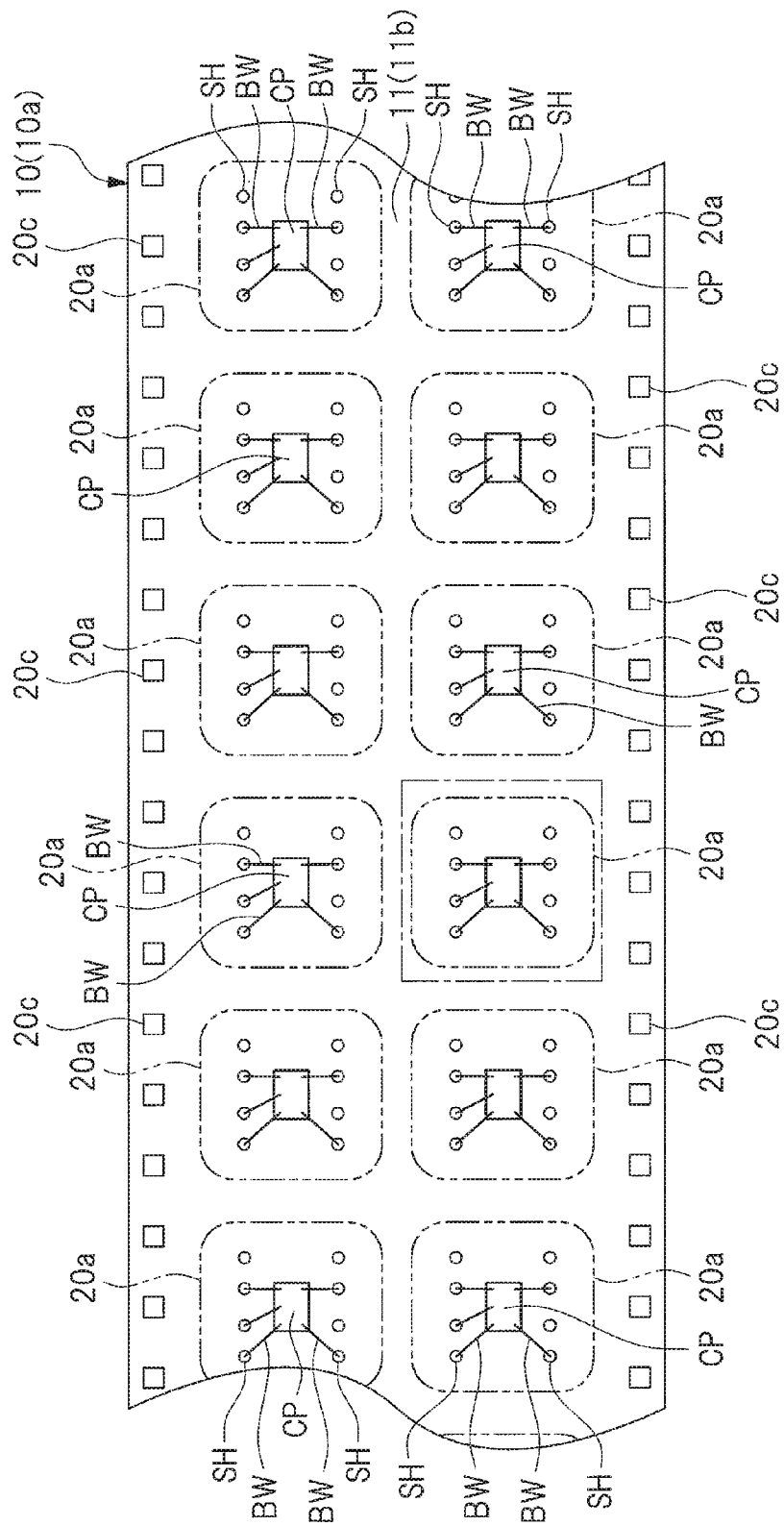
FIG. 33 is a plan view illustrating the upper surface side of the substrate obtained after a wire bonding step.
Figure 34:
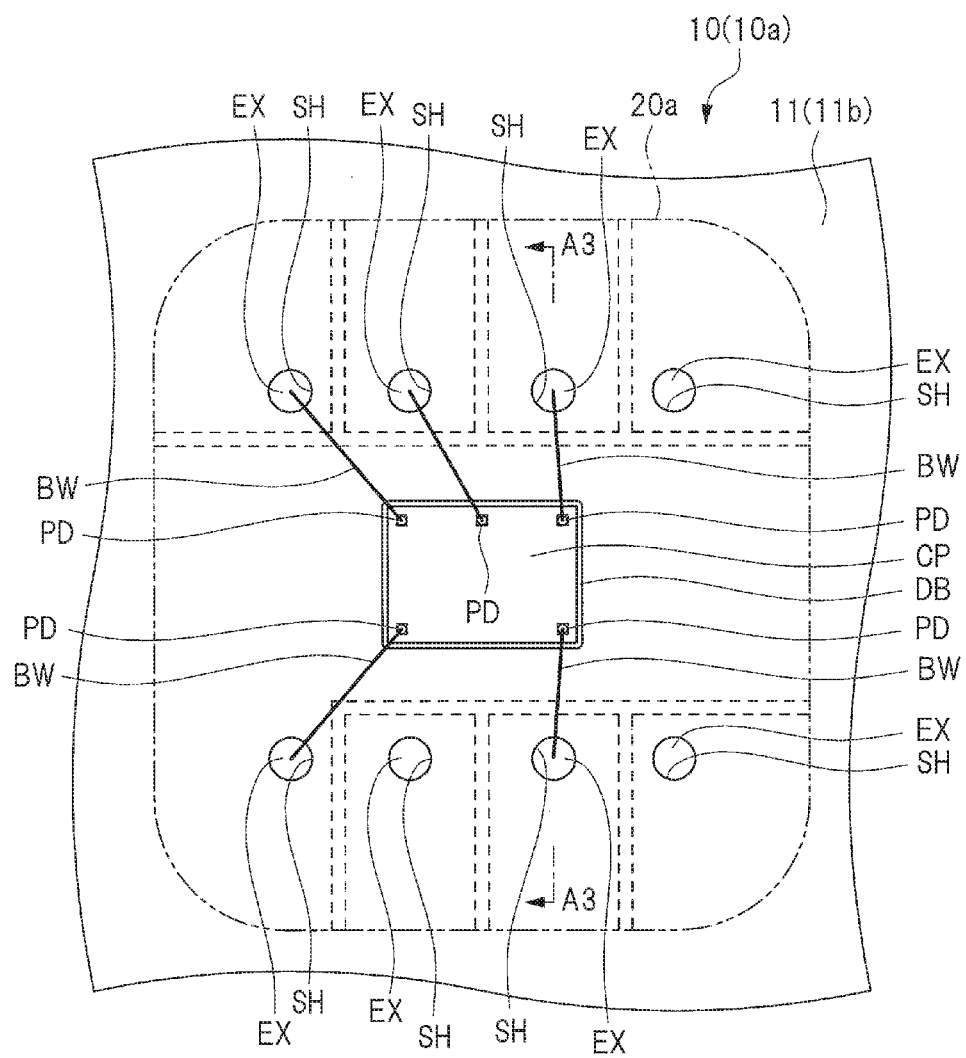
FIG. 34 is a partial enlarged plan view partially enlarging FIG. 33.
Figure 35:
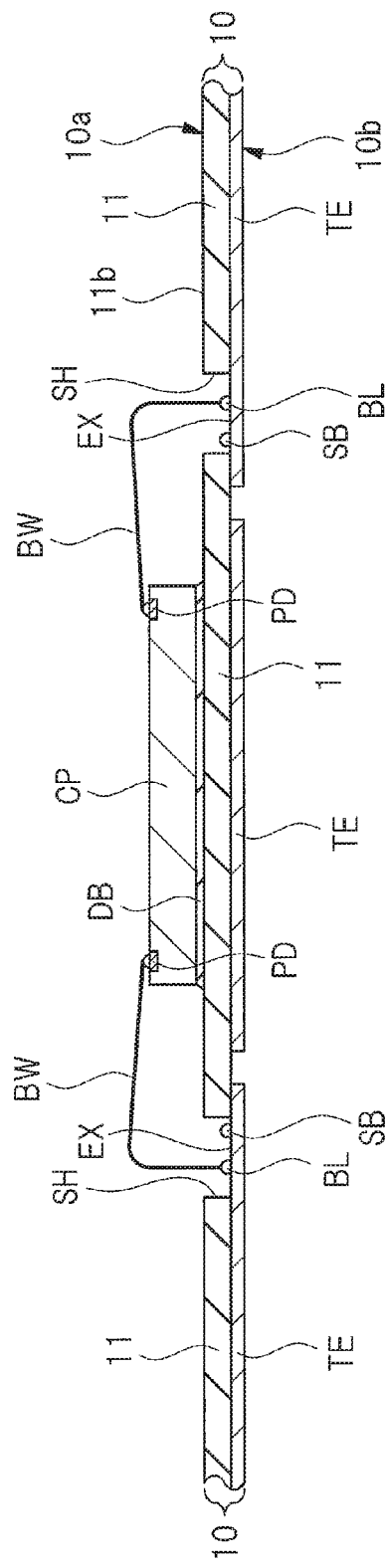
FIG. 35 is a cross-sectional view of FIG. 34 at a position of a line A3-A3.

Next, as illustrated in FIGS. 33 to 35, the wire bonding step is performed to electrically connect the plurality of pads PD of the semiconductor chip CP mounted on the device region 20a in each of the plurality of device regions 20a of the substrate CB with the exposed surfaces EX of the plurality of terminals TE in the device region 20a on which the semiconductor chip CP is mounted via the plurality of wires BW (step S4 of FIG. 11).

FIGS. 33 to 35 correspond to the above-described FIGS. 30 to 32, respectively. FIG. 33 is a plan view illustrating the upper surface 10a side of the substrate 10, FIG. 34 illustrates a partial enlarged plan view enlarging a part (one device region 20a) of FIG. 33, FIG. 35 is a cross-sectional view at a position of FIG. 34 on a line A3-A3 (cross-sectional view at the same position as the above-described FIG. 32), and all of the drawings illustrate s state obtained after the wire bonding step of step S4. As similar to the above-described FIG. 31, note that the outline shape positions of the terminals TE formed on the lower surface 10b of the substrate 10 are illustrated by a dotted line also in FIG. 34.

Hereinafter, the wire bonding step of step S4 will be specifically explained.

In step S4, prior to the connection of the plurality of pads PD of the semiconductor chip CP mounted on a certain device region 20a in the substrate 10 with the exposed surfaces EX of the plurality of terminals TE in that device region 20a via the wires BW, the stud bumps BP are formed on the surfaces of the pads PD of the semiconductor chip CP, and the stud bumps SB are formed on the exposed surfaces EX of the plurality of terminals TE in that device region 20a. The stud bumps BP and SB can be formed by applying a wire bonding technique.

Figure 36:
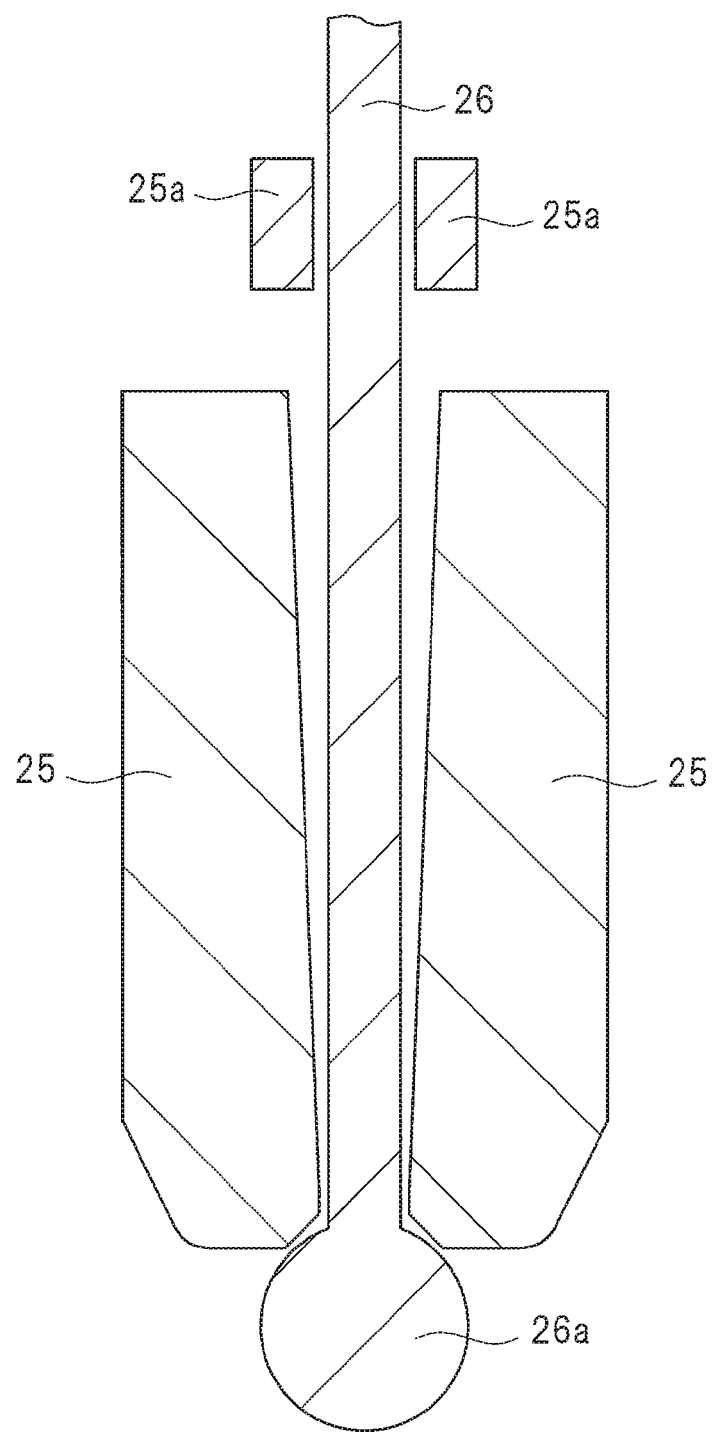
FIG. 36 is an explanatory diagram explaining a method of forming a stud bump.
Figure 37:
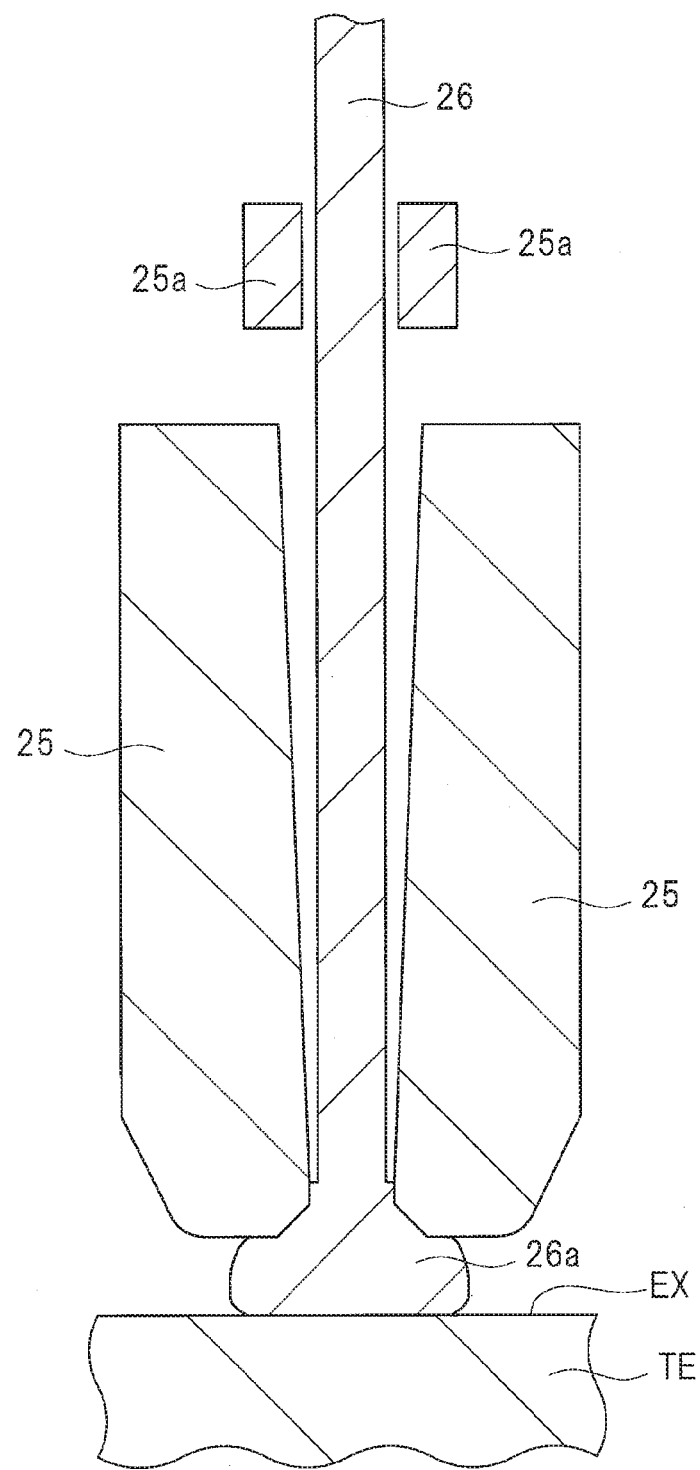
FIG. 37 is an explanatory diagram explaining a method of forming a stud bump.
Figure 38:
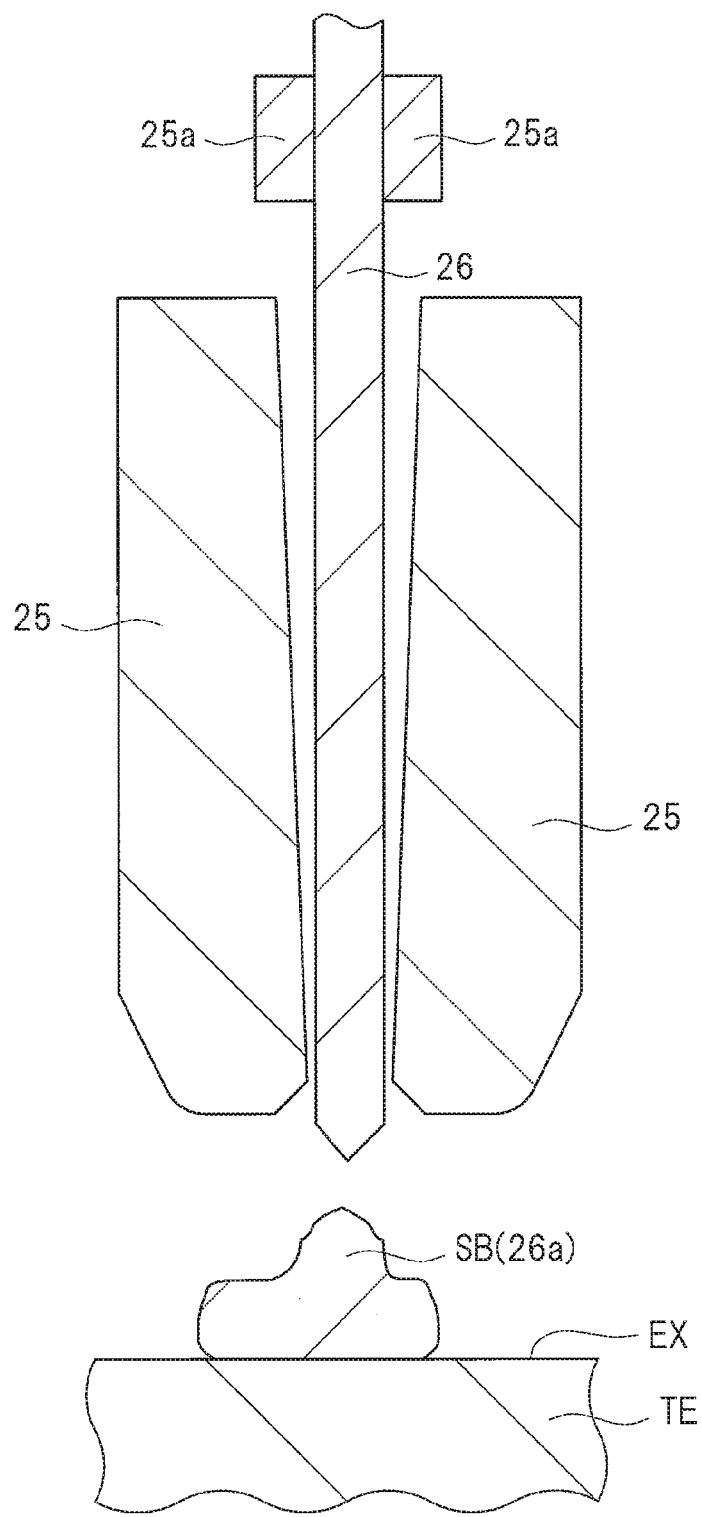
FIG. 38 is an explanatory diagram explaining a method of forming a stud bump.

The stud bumps SB can be formed as, for example, follows. FIGS. 36 to 38 are explanatory diagrams explaining a method of forming the stud bumps SB.

First, as illustrated in FIG. 36, a part of a wire 26 protruding from a tip of a capillary 25 of the wire bonding apparatus is electrically discharged. In this manner, a ball portion (ball-shaped electrode) 26a is formed at the tip (end) of the wire 26. More specifically, the ball portion 26a is formed at the tip (end) of the wire 26 by electric flame off. Then, as illustrated in FIG. 37, the ball portion 26a formed at the tip (end) of the wire 26 is connected (joined) to the exposed surface EX of the terminal TE which is exposed from the through hole SH of the substrate 10. At this time, load is applied to the ball portion 26a by the tip of the capillary 25 in a state in which the wire 26 is sandwiched and clamped by a clamper 25a arranged above the capillary 25. In other words, the ball portion 26a is pressed against the exposed surface EX of the terminal TE by the capillary 25 to be joined thereto. Further, by applying ultrasonic waves to the capillary 25, the ball portion 26a and (the exposed surface EX) of the terminal TE can be more firmly joined to each other. The processes up to here are similar to the steps for the first bonding side (the terminal TE side) in the case of the wire bonding by the so-called reverse bonding method. In the case of the formation of the stud bumps SB, an upper end of the ball portion 26a illustrated in FIG. 38 is cut next by the tip of the capillary 25 to obtain the stud bump (bump electrode) SB illustrated in FIG. 38. This stud bump SB is formed on the exposed surface EX of the terminal TE. The stud bump SB is formed of the remaining ball portion 26a joined to the exposed surface EX of the terminal TE, and is not connected to the wire.

The stud bump BP can be formed similarly to the stud bump SB. However, while the stud bump SB is formed on the exposed surface EX of the terminal TE which is exposed from the through hole SH, the stud bump BP is formed on the surface of the pad PD. That is, while a base where the stud bump is formed is different between the stud bump SB and the stud bump BP, the formation method is the same between them, and therefore, detailed explanation about the formation method of the stud bumps BP is omitted here.

Also, when the stud bumps SB and BP are formed, the joint strength between the base and each of the stud bumps SB and BP can be improved by heating the substrate 10 (including the terminals TE) and the semiconductor chip CP (including the pads PD) by using a heat stage not illustrated or others.

In the device region 20a to be a target for the wire bonding step, the stud bump BP is formed for each of the plurality of pads PD of the semiconductor chip CP mounted on that device region 20a, and the stud bump SB is formed for each of the plurality of terminals TE formed on the device region 20a. At this time, the stud bump BP may be formed after forming the stud bump SB, the stud bump SB may be formed after forming the stud bump BP, or the stud bump SB and the stud bump BP can be alternately formed.

In this manner, the stud bumps SB and BP can be formed.

After the stud bumps SB and BP are formed, the plurality of pads PD of the semiconductor chip CP and the plurality of terminals TE are electrically connected to each other via the plurality of wires BW as illustrated in FIGS. 34 and 35. In the present embodiment, the wires BW are connected by the reverse bonding method.

Figure 39:
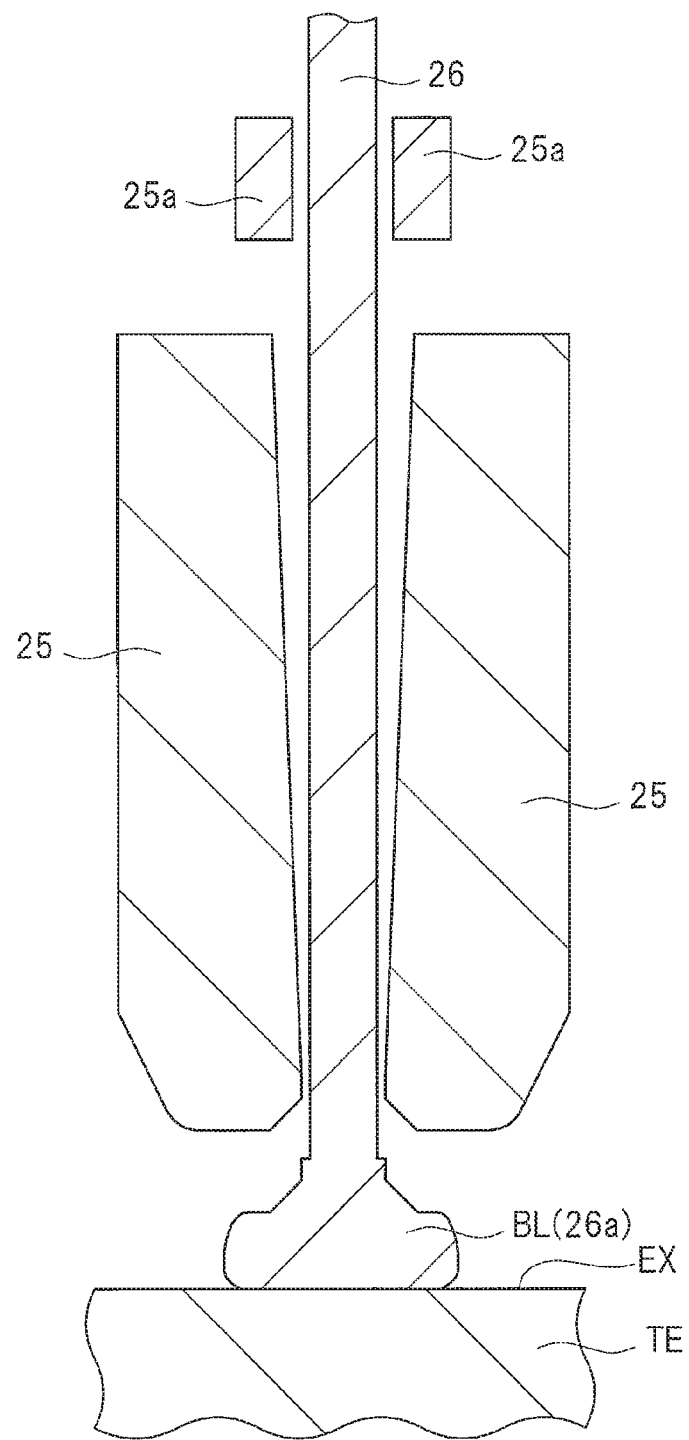
FIG. 39 is an explanatory diagram explaining a reverse bonding method.
Figure 40:
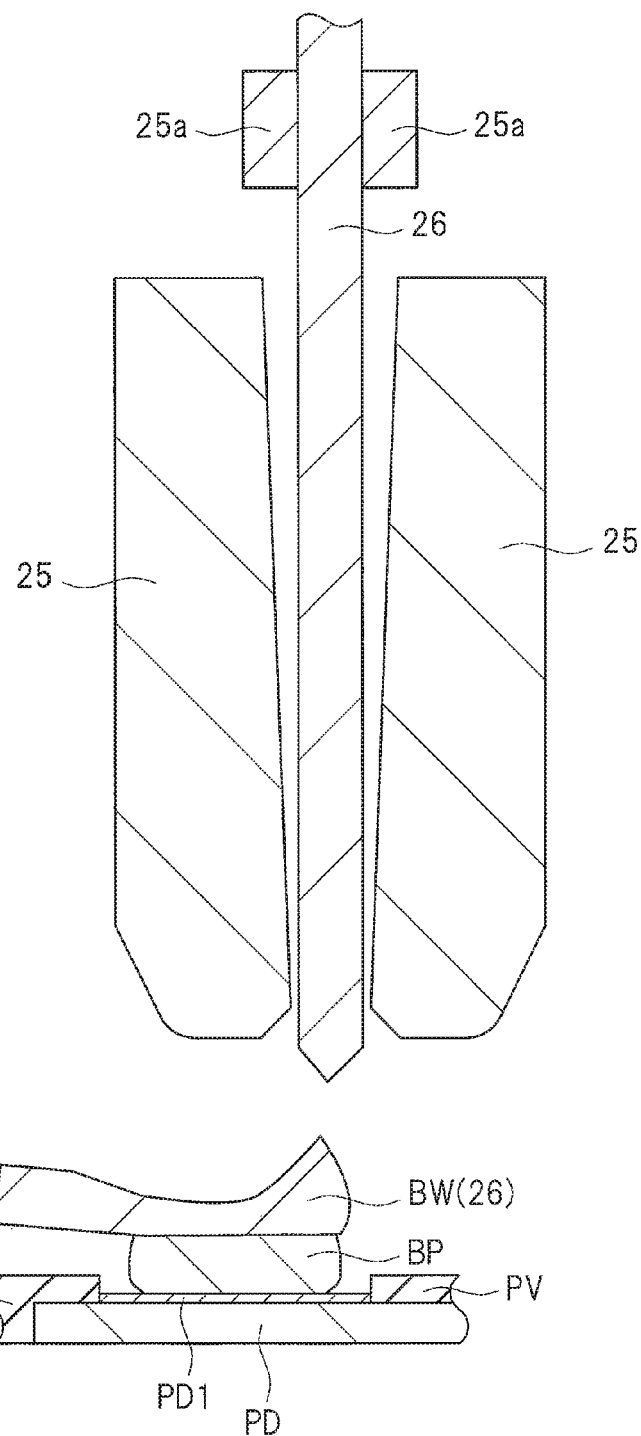
FIG. 40 is an explanatory diagram explaining a reverse bonding method.

The method of forming the wires BW by the reverse bonding method will be explained with reference to FIGS. 39 and 40. FIGS. 39 and 40 are explanatory diagrams each explaining the reverse bonding method. Also when the wires BW are formed by the reverse bonding method, note that the formation of the ball portion 26a at the tip (end) of the wire 26 is similar to that in the case of the formation of the stud bump SB as illustrated in FIG. 36.

First, the ball portion 26a is formed at the tip (end) of the wire 26 as illustrated in the above-described FIG. 36, and then, the ball portion 26a formed at the tip (end) of the wire 26 is connected (joined) to the exposed surface EX of the terminal TE which is exposed from the through hole SH of the substrate 10 as illustrated in the above-described FIG. 37. At this time, the load is applied to the ball portion 26a by the tip of the capillary 25 in the state in which the wire 26 is sandwiched and clamped by the clamper 25a arranged above the capillary 25. That is, the ball portion 26a is pressed against and joined to the exposed surface EX of the terminal TE by the capillary 25. Further, the ball portion 26a and (the exposed surface EX) of the terminal TE can be more firmly joined to each other by applying the ultrasonic waves to the capillary 25. The processes up to here are similar to the steps of forming the stud bump SB. After this, when the stud bump SB is formed, the upper end of the ball portion 26a is cut by the tip of the capillary 25. However, when the wire BW is formed, the upper end of the ball portion 26a is not cut, and the following step is subsequently performed.

That is, as illustrated in FIG. 39, the clamper 25a is loosened (in other words, the clamper 25a is released so as not to clamp the wire 26), and the capillary 25 is moved upward above the terminal TE as feeding the wire 26. Then, after the capillary 25 is moved upward to some extent (for example, to a position higher than an upper surface of the passivation film PV on the uppermost surface of the semiconductor chip CP), the capillary is moved toward the stud bump BP formed on the pad PD to be the second bonding side illustrated in FIG. 40. Then, after a part of the wire 26 reaches the stud bump BP formed on the pad PD, the wire 26 is clamped again by the clamper 25a, and the part of the wire 26 at the tip of the capillary 25 (part different from the end at which the ball portion 26a is formed) is rubbed against the surface of the stud bump BP to be the second bonding side (is torn off as being squashed). In this manner, the wire BW connected to the pad PD via the stud bump BP is formed. One end of the wire BW is the ball portion 26a (this ball portion 26a corresponds to the above-described ball portion BL), and the other end of the wire BW is joined to the stud bump BP and is connected to the pad PD via this stud bump BP. That is, the wire BW is electrically connected to the pad PD via the stud bump BP formed separately from the wire BW.

Also, when the wire BW is formed, the joint strength of the wire BW can be improved by heating the substrate 10 (including the terminal TE) and the semiconductor chip CP (including the pad PD) by using a heat stage not illustrated or others.

Further, the wire BW is formed, while the ball portion 26a formed at the tip (end) of the wire 26 is joined to the exposed surface EX of the terminal TE, the ball portion is joined to the exposed surface EX of the terminal TE as avoiding the stud bump SB. Therefore, while one end of the wire BW is joined with the stud bump BP on the pad PD, the other end of the wire BW is not joined to the stud bump SB on the exposed surface EX of the terminal TE. While the stud bump BP formed on the surface of the pad PD is formed for connecting the wire BW to the pad PD, the stud bump SB formed on the exposed surface EX of the terminal TE is not formed for connecting the wire BW to the terminal TE. The stud bump SB is formed as the anchor means for increasing the adhesiveness between the later-formed sealing body MR and the exposed surface EX of the terminal TE.

In this manner, the wire bonding step of step S4 is performed. By the wire bonding step of step S4, the plurality of pads PD of the semiconductor chip CP mounted on each device region 20a of the substrate 10 and the plurality of terminals TE formed on that device region 20a are electrically connected to each other via the plurality of wires BW, and besides, the stud bump SB is formed on the exposed surface EX of each terminal TE.

When the formation of the stud bump SB and the connection of the wire BW are performed for the exposed surface of a certain terminal TE, either one can be performed first. However, it is more preferred to perform the formation of the stud bump SB before the connection of the wire BW. This is for reliably preventing the wire BW connected to the exposed surface EX of the terminal TE from being damaged when the stud bump SB is formed on the exposed surface EX of the certain terminal TE.

Figure 41:
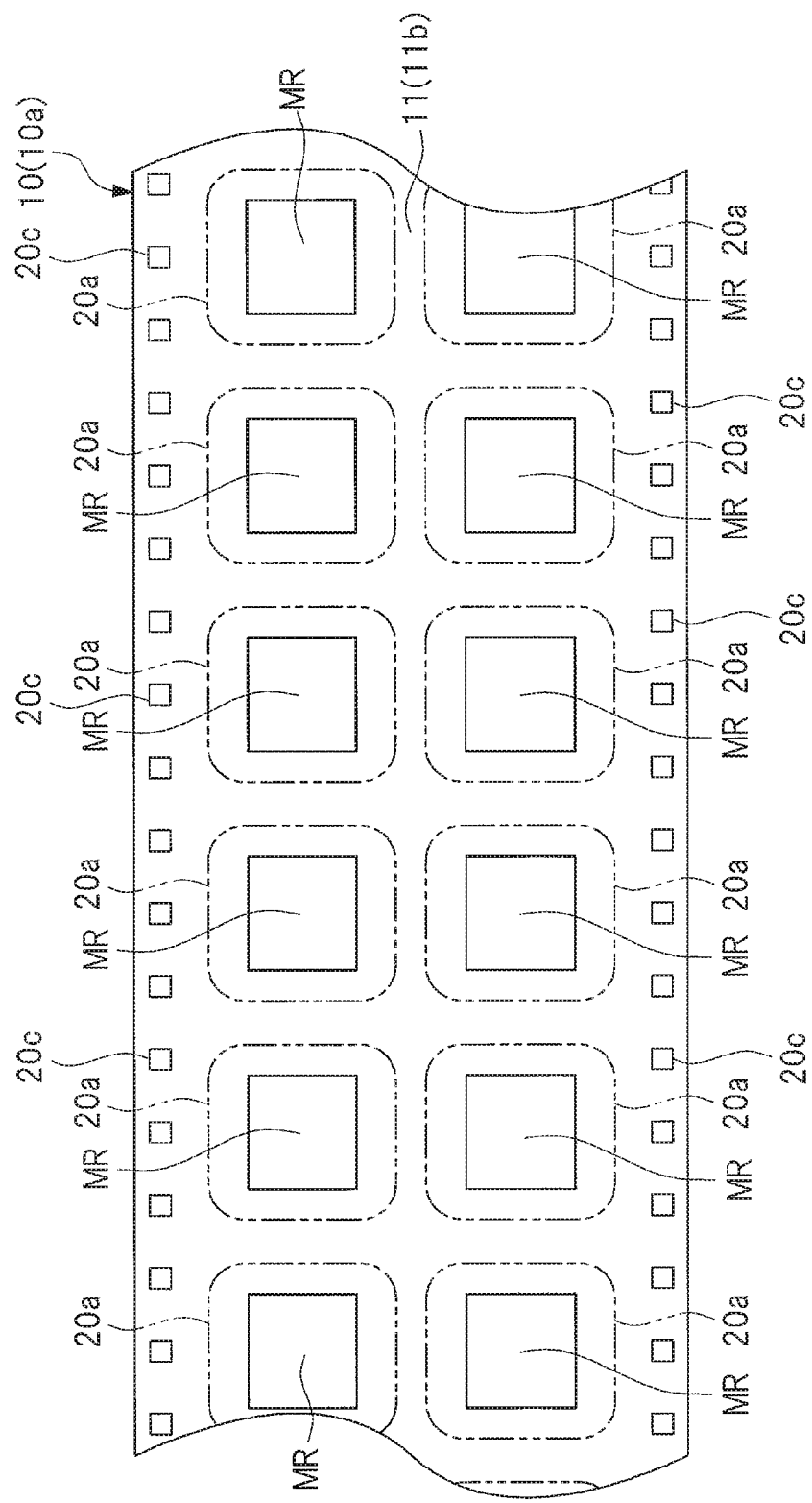
FIG. 41 is a plan view illustrating the upper surface side of the substrate obtained after a resin sealing step.
Figure 42:
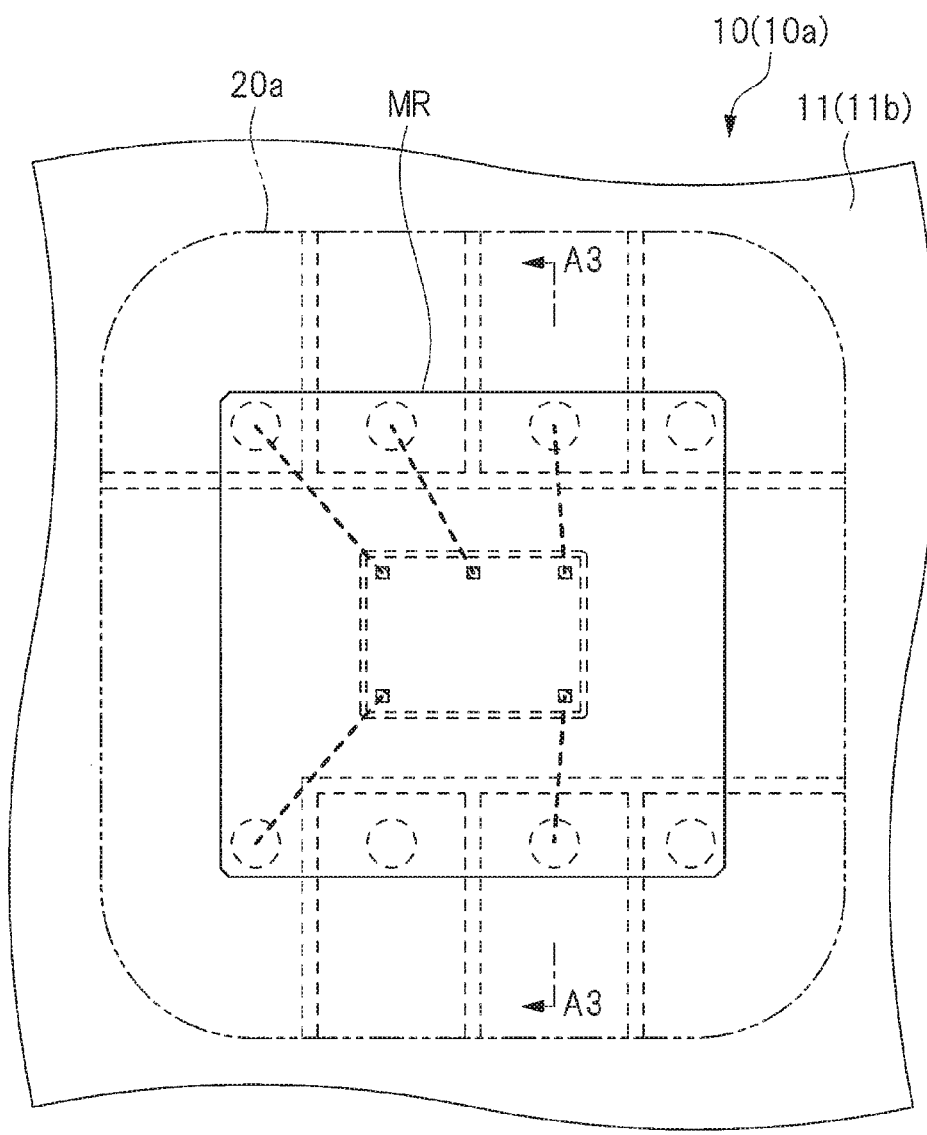
FIG. 42 is a partial enlarged plan view partially enlarging FIG. 41.
Figure 43:
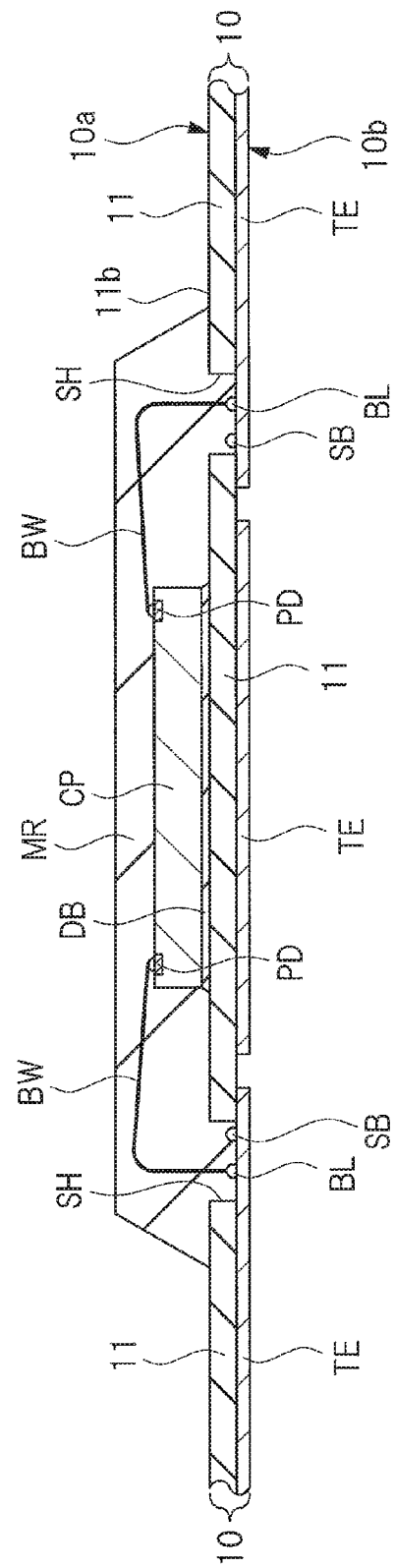
FIG. 43 is a cross-sectional view of FIG. 42 at a position of a line A3-A3.

After the wire bonding step of step S4, a resin sealing step is performed to form the sealing body MR as illustrated in FIGS. 41 to 43 (step S5 of FIG. 11).

FIGS. 41 to 43 correspond to the above-described FIGS. 33 to 35, respectively. FIG. 41 is a plan view illustrating the upper surface 10a side of the substrate 10, FIG. 42 illustrates a partial enlarged plan view enlarging a part (one device region 20a) of FIG. 41, FIG. 43 is a cross-sectional view at the position of FIG. 42 on a line A3-A3 (cross-sectional view at the same position as the above-described FIG. 35), and all of the drawings illustrate a state obtained after the resin sealing step of step S5. Also in FIG. 42 as similar to the above-described FIG. 34, note that the outline shape positions of the terminals TE formed on the lower surface 10b of the substrate 10 are illustrated by dotted lines, and the members sealed inside the sealing body MR are also illustrated by dotted lines.

In step S5, as illustrated in FIGS. 41 to 43, the semiconductor chip CP, the plurality of wires BW, and the plurality of terminals TE (specifically, the exposed surfaces EX of the terminals TE) are sealed with the sealing body (sealing resin) MR.

Hereinafter, the resin sealing step (step of forming the sealing body MR) in step S5 will be explained.

Generally, as a method of sealing the semiconductor chip, etc., a so-called transfer mold method is cited, in which a thermoset resin is softened (plasticized) in a heating chamber (pot unit), is pressed into a cavity of a heated mold to be molded, and then, is heated and hardened. Also, as another method, a so-called potting method is cited, in which a liquid resin is dropped into a region to be sealed, and then, is heated and hardened to form a sealing resin. The resin formed by the transfer mold method is harder than the resin formed by the potting method, and therefore, the transfer mold method is preferred in a viewpoint of protecting the semiconductor chip CP from breakage due to external force when the external force (especially, point load) is applied. Therefore, in the present embodiment, it is more preferred to employ the transfer mold method.

Figure 44:
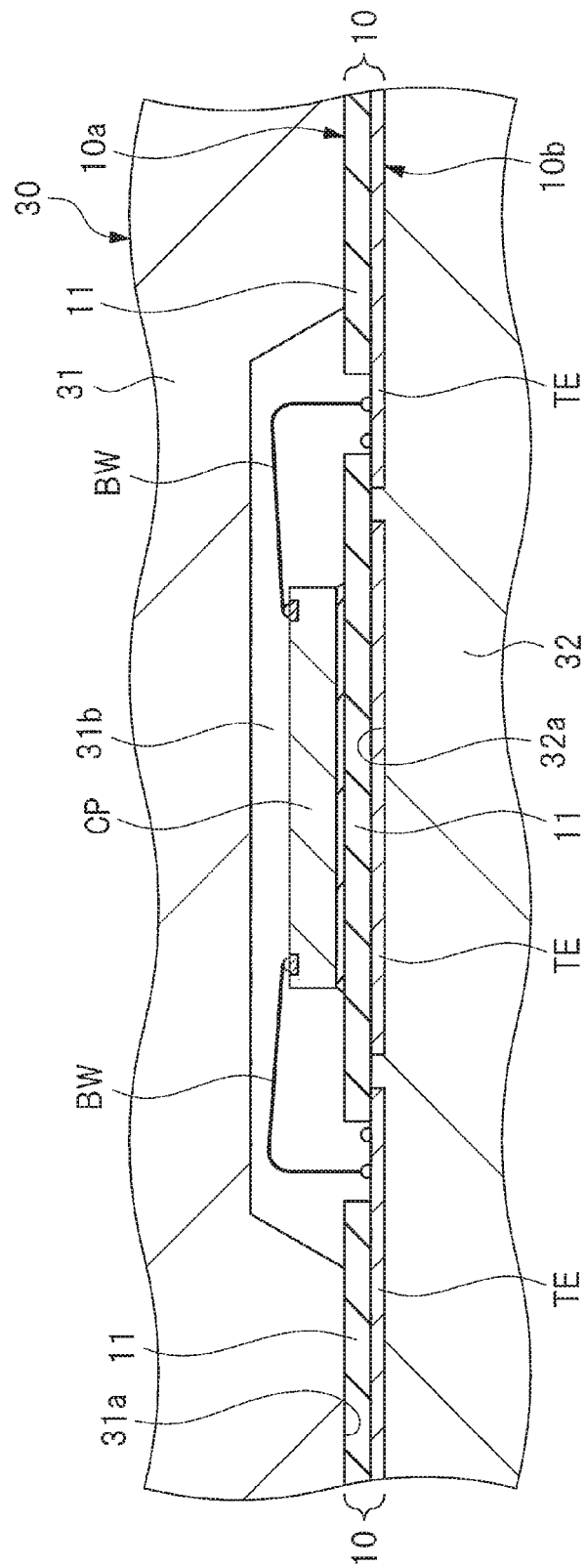
FIG. 44 is an explanatory diagram of a resin sealing step employing a transfer mold method.

In the resin sealing step of step S5 that employs the transfer mold method, a mold 30 illustrated in FIG. 44 is prepared first (mold preparing step). FIG. 44 is an explanatory diagram of the resin sealing step that employs the transfer mold method.

The mold 30 has: an upper mold (mold) 31 which has a lower surface (mold surface) 31a and a cavity (a concave portion, a hollowed portion) 31b formed on the lower surface 31a; and a lower mold (mold) 32 which has an upper surface (mold surface) 32a facing the lower surface (mold surface) 31a of this upper mold 31. FIG. 44 illustrates one cavity 31b because of the enlarged cross-sectional view. However, practically, the cavity 31b of the upper mold 31 is formed in each of the device regions 20a of the substrate 10. Each cavity 31b has, for example, a substantially rectangular (tetragonal) planar shape whose four corners are chamfered.

Although illustration is omitted, each of a gate part which is a supply port for the sealing resin into the cavity 31b, and an air vent part which is arranged at a position different from the gate part, is formed in the upper mold 31. As a method of supplying the sealing resin, for example, a side gate method that supplies the sealing resin from a lateral surface of the cavity 31b can be employed. However, as another aspect, a top gate method that supplies the sealing resin from a top surface side of the cavity 31b can be also employed.

Next, the substrate 10 is arranged on the lower mold 32 of the mold 30 (substrate arranging step). Here, an area (a planar dimension) of the cavity 31b formed in the upper mold 31 to be combined with the lower mold 32 is smaller than an area (a planar dimension) of each device region 20a of the substrate 10, and a circumferential part of the device region 20a is positioned outside the cavity 31b in a planar view.

Next, a distance between the upper mold 31 and the lower mold 32 is reduced, and the substrate 10 is sandwiched and clamped by the upper mold 31 and the lower mold 32 as illustrated in FIG. 44 (clamping step). In this manner, in periphery of a region where the sealing body MR is to be formed, the upper mold 31 (the lower surface 31a of the upper mold 31) and the upper surface 10a of the substrate 10 adhere tightly to each other. Moreover, the lower mold 32 (the upper surface 32a of the lower mold 32) and the lower surface 10b of the substrate 10 adhere tightly to each other. Since the area (planar dimension) of the cavity 31b is smaller than that of each device region 20a of the substrate 10, a part (a region outside the cavity 31b) of the upper surface of the device region 20a adheres tightly to the lower surface 31a of the upper mold 31.

Then, a sealing resin (sealing resin before the hardening) is supplied into the cavity 31b, and is hardened so as to form the sealing body MR (sealing-body forming step). In this step, a resin tablet arranged in a pot part not illustrated is heated and softened to supply the sealing resin from the gate part (not illustrated) of the mold 30 into the cavity 31b. The resin tablet is made of, for example, an epoxy-based resin which is a thermoset resin, and has such characteristics as being softened by heating at a temperature lower than its curing temperature so that its fluidity is improved. Therefore, for example, by pushing the softened resin tablet inside by using a plunger not illustrated, the sealing resin is flown from the gate part (not illustrated) formed in the mold 30 into the cavity 31b. The gas inside the cavity 31b is discharged from the air vent part (not illustrated) of the mold 30 by pressure caused by the flow-in of the sealing resin, so that inside of the cavity 31b is filled with the sealing resin. As a result, the semiconductor chip CP and the plurality of wires BW mounted on the upper surface 10a side of the substrate 10 are covered with the sealing resin. And, at this time, inside of the through holes SH is also filled with the sealing resin, and therefore, the terminals TE of the substrate 10 (specifically, the exposed surfaces EX of the terminals TE exposed from the through holes SH) are also covered with the sealing resin. Then, by heating the mold 30, the sealing resin inside the cavity 31b is heated and hardened so as to form the sealing body MR made of the hardened sealing resin.

Then, the substrate 10 on which the plurality of sealing bodies MR are formed is taken out from the mold 30 (substrate taking-out step). In this step, after the gate resin (resin in the gate) obtained by hardening the sealing resin inside the gate part (not illustrated) of the mold 30 is divided from the sealing body MR inside the cavity 31b (in a gate break manner), the upper mold 31 and the lower mold 32 are separated from each other, and the substrate 10 is taken out.

Also, after the substrate 10 is taken out from the mold 30, the sealing body MR can be heated again. In that case, the thermal treatment of the sealing body MR is performed again by, for example, conveying the substrate 10, which has been taken out from the mold 30, to a baking furnace (not illustrated), and performing thermal treatment to the substrate 10 (the substrate 10 on which the sealing body MR is formed) inside the baking furnace. In this manner, as providing the sealing resin (sealing body MR) heated inside the mold 30 to be in a state in which half or more (for example, about 70%) of curing components in the resin is hardened (a state referred to as temporary curing), the temporarily-cured sealing body MR is heated again in the baking furnace, so that an actual curing treatment of hardening all of the curing components can be performed. In the temporary curing state, although all of the curing components in the resin are not hardened, half or more of the curing components are hardened, and therefore, the semiconductor chip CP and the wires BW are sealed at this stage. However, it is preferred to completely harden all of the curing components from a viewpoint of stability of the strength of the sealing body MR or others, and therefore, the actual curing treatment is performed. By separating the process of hardening the sealing resin into two steps as described above, the sealing step can be immediately performed for a next substrate 10 to be conveyed to the mold 30 next, and therefore, manufacturing efficiency can be improved.

If the actual curing treatment of the sealing body MR is not performed after the substrate 10 is taken out from the mold 30, the sealing body MR can be formed by sufficiently hardening the sealing resin inside the mold 30 (hardening it as hard as in the actual curing).

In this manner, the resin sealing step (the step of forming the sealing body MR) in step S5 is performed.

As illustrated in FIGS. 41 to 43, by performing the resin sealing step of step S5, the sealing body (sealing resin) MR, which seals the semiconductor chip CP and the plurality of wires BW, is formed in each of the device regions 20a of the substrate 10 so that a part of the surface of each of the plurality of device regions 20a of the substrate 10 (in other words, the part being the circumferential part of the device region 20a of the upper surface 10a of the substrate 10) is exposed.

After the resin sealing step of step S5, the piece-dividing step is performed (step S6 of FIG. 11).

In the piece-dividing step of step S6, the substrate 10 illustrated in the above-described FIG. 41 is cut along the device region 20a so as to be divided into the plurality of device regions 20a. In this manner, the semiconductor packages PKG are obtained. The piece-divided individual device region 20a becomes the semiconductor device PKG. Also, the substrate 10 of the piece-divided individual device region 20a becomes the substrate CB which forms the semiconductor device PKG. A method of cutting the substrate 10 is not particularly limited. For example, the substrate can be cut by a pressing process by using a punch (cutting blade) and a die (supporting member) not illustrated.

As described above, the semiconductor device PKG is manufactured by steps S1 to S6.

<Regarding Step of Manufacturing IC Card>

Next, steps of manufacturing the IC card 1 of the present embodiment will be explained. FIGS. 45 to 48 are cross-sectional views each illustrating the steps of manufacturing the IC card 1.

In order to manufacture the IC card 1, first, the card main body 2 and the semiconductor package PKG are prepared (provided).

The semiconductor device PKG may be prepared after preparing the card main body 2 first, or the card main body 2 may be prepared after preparing the semiconductor device PKG first. Alternatively, the card main body 2 and the semiconductor device PKG may be simultaneously prepared.

Figure 45:
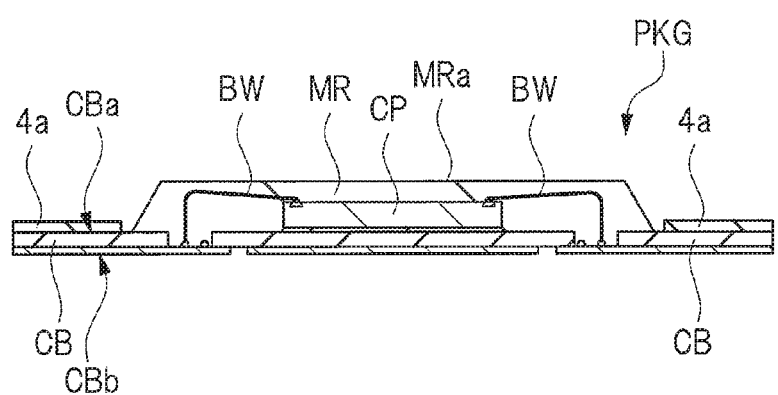
FIG. 45 is a cross-sectional view illustrating a step of manufacturing an IC card.

Next, as illustrated in FIG. 45, a sheet-shaped bonding film (bonding tape, bonding sheet) 4a is pasted on an outer peripheral part of the upper surface CBa of the substrate CB of the semiconductor device PKG. The bonding film 4a corresponds to the above-described bonding material 4. As the bonding film 4a, for example, a thermoset-type bonding film (bonding sheet) or others can be used.

Here, note that the explanation has been made about the case in which the bonding film 4a is pasted on the outer peripheral part of the upper surface CBa of the substrate CB of the piece-divided semiconductor device PKG. As another aspect, the bonding film 4a can be pasted on the upper surface CBa of the substrate CB after forming the resin sealing step of the above-described step S5 to form the sealing body MR but before performing the piece-dividing step of the above-described step S6, and then, the piece-dividing step of the above-described step S6 can be then performed. Either case can cause the state in which the bonding film 4a is pasted on the outer peripheral part of the upper surface CBa of the substrate CB of the semiconductor device PKG.

The bonding film 4a is not pasted on the sealing body MR, but is pasted on the outer peripheral part of the upper surface CBa of the substrate CB of the semiconductor device PKG (in other words, on the upper surface CBa of the substrate CB in the region where the sealing body MR is not formed).

Figure 46:
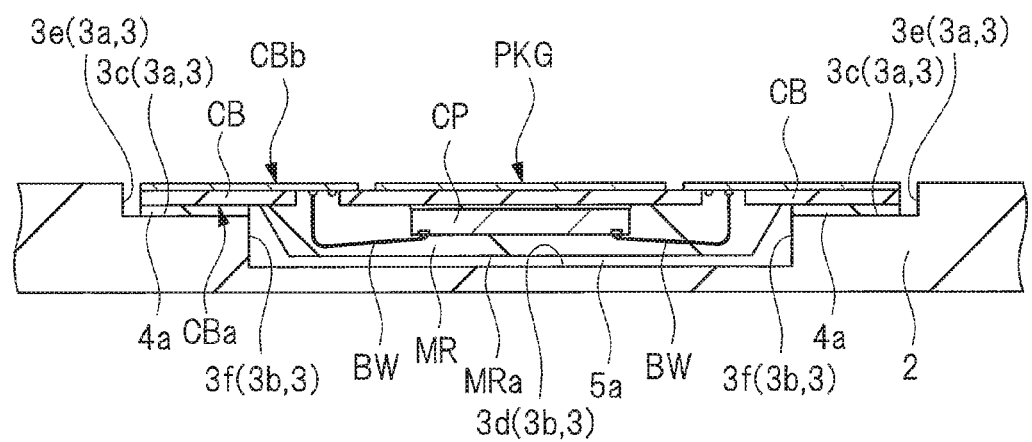
FIG. 46 is a cross-sectional view illustrating a step of manufacturing an IC card.

Next, as illustrated in FIG. 46, the semiconductor device PKG is arranged (housed) inside the concave portion 3 of the card main body 2.

As described above, the concave portion 3 is formed on the front surface 2a of the card main body 2, and the concave portion 3 is formed of the concave portion 3a and the concave portion 3b which is formed inside the concave portion 3a to be deeper than the concave portion 3a.

When the semiconductor device PKG is arranged inside the concave portion 3 of the card main body 2, the semiconductor device PKG is arranged inside the concave portion 3 of the card main body 2 in such a direction that the upper surface of the substrate CB faces the front surface 2a of the card main body 2. In this manner, the bonding film 4a pasted on the outer peripheral part of the upper surface CBa of the substrate CB of the semiconductor device PKG is arranged on the bottom surface 3c of the concave portion 3a, and the sealing body MR of the semiconductor device PKG is arranged inside the concave portion 3b. At this time, while the bonding film 4a pasted on the outer peripheral part of the upper surface CBa of the substrate CB of the semiconductor device PKG is in contact with the bottom surface 3c of the concave portion 3a, the sealing body MR of the semiconductor device PKG is not in contact with the bottom surface 3d of the concave portion 3b so that a hollow space 5a is formed between the bottom surface 3d of the concave portion 3b and an upper surface MRa of the sealing body MR.

Next, the outer peripheral part of the upper surface CBa of the substrate CB of the semiconductor device PKG is thermally compressed and bonded to the bottom surface 3c of the concave portion 3a via the bonding film 4a.

Figure 47:
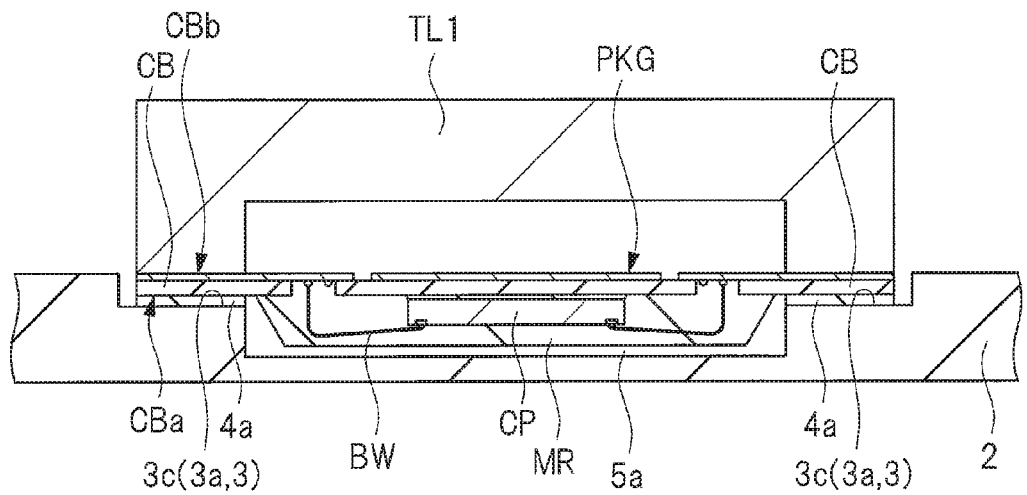
FIG. 47 is a cross-sectional view illustrating a step of manufacturing an IC card.
Figure 48:
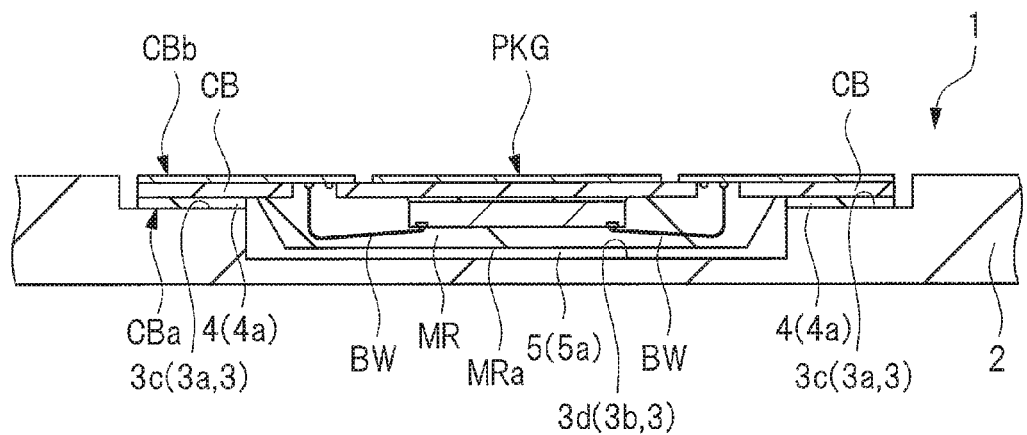
FIG. 48 is a cross-sectional view illustrating a step of manufacturing an IC card.

At this time, for example, as illustrated in FIG. 47, the substrate 10 is pressed against the bottom surface 3c of the concave portion 3a via the bonding film 4a by pressing the outer peripheral part of the lower surface CBb of the substrate CB of the semiconductor device PKG by using a heating tool (heating jig) TL1 or others, and besides, the bonding film 4a is heated by the heating tool TL1 via the substrate 10. In this manner, the bonding film 4a is softened, and then, hardened so that the outer periphery of the upper surface CBa of the substrate CB of the semiconductor device PKG is bonded and fixed to the bottom surface 3c of the concave portion 3a via the bonding film 4a. Then, the heating tool TL1 is moved away from the semiconductor device PKG. In this manner, as illustrated in FIG. 48, the semiconductor device PKG can be housed in the concave portion 3, and be fixed to the card main body 2. The hardened bonding film 4a becomes the above-described bonding material 4. Also, the hollow space 5a between the bottom surface 3d of the concave portion 3b and the upper surface MRa of the sealing body MR becomes the above-described hollow space 5.

As described above, the IC card 1 can be manufactured.

<Review>

Next, review of the present inventors will be explained.

For example, as described above in the Patent Document 1, in a so-called COT package which is a semiconductor device having a semiconductor chip mounted on a base material made of a tape, a conductive member (for example, a wire) is connected to a surface of a terminal formed on a back surface of the base material (to a surface exposed from a through hole of the base material) via the through hole formed in the base material, the terminal and the semiconductor chip are electrically connected to each other via this conductive member, and the semiconductor chip and the conductive member are sealed with a resin.

Here, a part which is in contact with the base material in the surface of the terminal (the surface facing the base material) is subjected to a surface-roughing treatment in order to improve the adhesiveness with the base material. On the other hand, the surface of the terminal to which the conductive member is connected is subjected to a surface-flattening treatment in order to improve the connectivity with the conductive member.

Moreover, while the terminal is made of a conductive member (metal), the resin (sealing body) is made of an insulating member, and therefore, there is a difference between them in a thermal expansion coefficient.

Therefore, the adhesiveness between the surface of the terminal and the resin (sealing body) is low, and therefore, there is a risk of peel-off between the surface of the terminal and the resin (sealing body). If the peel-off occurs between the surface of the terminal and the resin (sealing body), large load (stress, damage) is adversely applied to the joint portion of the conductive member on the surface of the terminal, and therefore, electrical characteristics are changed at the joint portion (which results in disconnection in some cases). This leads to reduction in reliability of the semiconductor device.

As the timing at which the joint portion is damaged, there are mainly two timing of when the semiconductor device (COT package) is housed in the card main body (in other words, of an assembly step of the IC card) and of during usage of a completed product (IC card).

<Regarding Principal Feature and Effect>

The semiconductor device PKG of the present embodiment has: the base material BS comprised of insulating material having the through hole SH; the terminal TE (external terminal) being formed on one principal surface (the lower surface BSb) of the base material BS and being partially exposed from the through hole SH; and the semiconductor chip CP being mounted on the other principal surface (the upper surface BSa) of the base material BS. The semiconductor chip CP is mounted on the other principal surface (the upper surface BSa) of the base material BS so that the back surface CPb opposite to the side where the pad PD is formed faces the other principal surface (the upper surface BSa) of the base material BS. Further, the semiconductor device PKG has: the sealing body MR; and the conductive member (in other words, the conductive connecting member, such as the wire BW here) which electrically connects the exposed surface EX exposed from the through hole SH of the base material BS in the terminal TE with the pad PD of the semiconductor chip CP, and the sealing body MR seals the inside of the through hole SH of the base material BS, the semiconductor chip CP, and the conductive connecting member (the wire BW). And, the anchor means is provided in a region (non-joint portion) except for the joint portion (bonding region) joined to the conductive connecting member (the wire BW) in the exposed surface EX of the terminal TE which is exposed from the through hole SH of the base material BS.

The anchor means is functioned as improving the adhesiveness between the sealing body MR and the terminal TE (external terminal). That is, the adhesiveness between the exposed surface EX of the terminal TE and the sealing body MR can be improved in the case in which the anchor means is provided on the exposed surface EX of the terminal TE more than the case in which the anchor means is not provided on the exposed surface EX of the terminal TE.

If the adhesiveness between the sealing body MR and the exposed surface EX of the terminal TE is low, there is a risk that the sealing body MR is peeled off from the exposed surface EX of the terminal TE. And, if the sealing body MR is peeled off from the exposed surface EX of the terminal TE, large load (stress, damage) is adversely applied to the joint portion of the conductive connecting member (for example, the wire BW) in the exposed surface EX of the terminal TE. This load leads to the change in the electric characteristics, and also leads to disconnection (phenomenon which is disconnection in electrical connection of the pad PD with the terminal TE) in some cases. Not only the case of the disconnection but also the case of the change in the electrical characteristics lead to the reduction in the reliability of the electrical connection of the pad PD with the terminal TE, and further, leads to the reduction in the reliability of the semiconductor device. Therefore, in order to improve the reliability of the electrical connection of the pad PD with the terminal TE and to improve the reliability of the semiconductor device, it is important to prevent the sealing body MR from being peeled off from the exposed surface EX of the terminal TE as much as possible.

Accordingly, in the present embodiment, the anchor means is provided in the region except for the joint portion joined with the conductive connecting member (the wire BW) in the exposed surface EX of the terminal TE which is exposed from the through hole SH of the base material BS, and the adhesiveness between the sealing body MR and the exposed surface EX of the terminal TE can be improved by the anchor means. In this manner, the peel-off of the sealing body MR from the exposed surface EX of the terminal TE can be suppressed or prevented, and therefore, this can suppress or prevent the application of the load (stress, damage) to the joint portion of the conductive connecting member (for example, the wire BW) in the exposed surface EX of the terminal TE due to the peel-off of the sealing body MR. Therefore, the change of the electrical characteristics of the joint portion of the conductive connecting member (for example, the wire BW) in the exposed surface EX of the terminal TE or the disconnection thereof can be suppressed or prevented. Therefore, the reliability of the electrical connection of the pad PD with the terminal TE can be improved. Thus, the reliability of the semiconductor device can be improved. Moreover, the manufacturing yield of the semiconductor device can be improved.

In this manner, one of the principal features is to provide the anchor means in the exposed surface EX of the terminal TE which is exposed from the through hole SH of the base material BS. In the present embodiment, the stud bump SB is used as the anchor means. Note that a concave portion 81 is used as the anchor means in a second embodiment described later, and that a surface-roughened region 71 is used as the anchor means in a third embodiment described later. Thus, while the present first embodiment and the later-described second and third embodiments are common with each other in that the anchor means is provided in the region except for the joint portion joined with the conductive connecting member (for example, the wire BW) in the exposed surface EX of the terminal TE which is exposed from the through hole SH of the base material BS, the present first embodiment, the later-described second embodiment, and the later-described third embodiment are different from each other in a specific configuration of the anchor means.

Therefore, a common technical idea between the present first embodiment and the later-described second and third embodiments is to provide the anchor means in the region except for the joint portion joined with the conductive connecting member (for example, the wire BW) in the exposed surface EX of the terminal TE which is exposed from the through hole SH of the base material BS. The present first embodiment and the later-described second and third embodiments embody the anchor means.

The anchor means is functioned as improving the adhesiveness between the sealing body MR and the terminal TE, and therefore, it is required to form the anchor means on the exposed surface EX of the terminal TE at least before the sealing body MR is formed (in other words, before the exposed surface EX of the terminal TE is sealed with the sealing body MR).

The provision of the anchor means in the region except for the joint portion joined with the conductive connecting member (for example, the wire BW) on the exposed surface EX of the terminal TE which is exposed from the through hole SH of the base material BS means that the anchor means is not provided in the joint portion joined with the conductive connecting member (for example, the wire BW) in the exposed surface EX of the terminal TE. This is for preventing interruption of reliable connection (joint) of the conductive connecting member (for example, the wire BW) to the exposed surface EX of the terminal TE by the anchor means. In other words, the exposed surface EX of the terminal TE has the region where the anchor means is provided and the region where the anchor means is not provided, and the conductive connecting member (for example, the wire BW) is connected (joined) with the region where the anchor means is not provided in the exposed surface EX of the terminal TE. The reliable connection (joint) of the conductive member to the exposed surface EX of the terminal TE can be ensured by connecting (joining) the conductive connecting member (for example, the wire BW) with the region where the anchor means is not provided in the exposed surface EX of the terminal TE, and besides, the adhesiveness between the sealing body MR and the exposed surface EX of the terminal TE can be improved by providing the anchor means in the exposed surface EX of the terminal TE.

Therefore, in the present first embodiment, the conductive connecting member (for example, the wire BW) is joined at a position at which the stud bump SB serving as the anchor means is not formed (in other words, at a position not in contact with the stud bump SB) in the exposed surface EX of the terminal TE. Also, in the later-described second embodiment, the conductive connecting member (for example, the wire BW) is joined at a position at which the concave portion 81 serving as the anchor mans is not formed (in other words, at a position not overlapped with the concave portion 81) in the exposed surface EX of the terminal TE. Also, in the later-described third embodiment, the conductive connecting member (for example, the wire BW) is joined at a position not overlapped with the surface-roughened region 71 serving as the anchor means in the exposed surface EX of the terminal TE. In these manners, the reliable connection (joint) of the conductive connecting member (for example, the wire BW) to the exposed surface EX of the terminal TE can be ensured, and besides, the adhesiveness between the sealing body MR and the exposed surface EX of the terminal TE can be improved by providing the anchor means.

When the wire BW is connected to the exposed surface EX of the terminal TE in the reverse bonding manner, the joint portion joined with the conductive connecting member (for example, the wire BW) in the exposed surface EX of the terminal TE corresponds to the portion joined with the ball portion BL in the exposed surface EX of the terminal TE because the ball portion BL is integrally formed with an end of the wire BW.

Also, the base-material facing surface TEa which is a surface on a side facing the base material BS of the terminal TE has: the joint surface BD facing one surface (the lower surface BSb) of the base material BS; and the exposed surface EX exposed from the through hole SH of the base material BS. And, the surface roughness (arithmetic mean roughness Ra) of the joint surface BD of the terminal TE is preferred to be larger than the surface roughness (arithmetic mean roughness Ra) of the joint portion joined with the conductive connecting member (the wire BW) in the exposed surface EX of the terminal TE. This point is also common between the present first embodiment and the later-described second, third, and fourth embodiments.

That is, in order to improve the reliability of the semiconductor device PKG, high bonding strength between the terminal TE and the base material BS is preferred. In this manner, the peel-off of the terminal TE from the base material BS can be prevented. In order to increase the bonding strength between the terminal TE and the base material BS, it is effective to increase the surface roughness of the joint surface BD of the terminal TE. Therefore, it is preferred to increase the surface roughness (arithmetic mean roughness Ra) of the joint surface BD of the terminal TE to some extent. Thus, it is preferred to roughen the joint surface BD of the terminal TE.

On the other hand, it is preferred that the joint portion joined with the conductive connecting member (for example, the wire BW) in the exposed surface EX of the terminal TE is flat to some extent. In other words, it is preferred not to roughen the region joined with the conductive connecting member (for example, the wire BW) in the exposed surface EX of the terminal TE but to flatten the region to some extent. This is because the reliable joint of the conductive connecting member such as the wire BW can be easily ensured when a surface to be jointed is flat in order to join the conductive connecting member such as the wire BW. Therefore, it is preferred in the exposed surface EX of the terminal TE to ensure a region having the smaller surface roughness (arithmetic mean roughness Ra) than that of the joint surface BD of the terminal TE, the region where the anchor means is not provided, and preferred to join the conductive connecting member such as the wire BW to the region.

Therefore, the surface roughness (arithmetic mean roughness Ra) of the joint surface BD (the surface bonded to the base material BS via the bonding layer SE) of the terminal TE is preferably higher than the surface roughness (arithmetic mean roughness Ra) of the joint portion joined with the conductive connecting member (the wire BW) in the exposed surface EX of the terminal TE. In other words, the surface roughness (arithmetic mean roughness Ra) of the joint portion joined with the conductive connecting member (the wire BW) in the exposed surface EX of the terminal TE is preferably lower than the surface roughness (arithmetic mean roughness Ra) of the joint surface BD (the surface bonded to the base material BS via the bonding layer SE) of the terminal TE. In this manner, the bonding strength between the terminal TE and the base material BS can be increased, and besides, the reliable connection (joint) of the conductive connecting member (for example, the wire BW) to the exposed surface EX of the terminal TE can be ensured.

For example, the surface roughness (arithmetic surface roughness Ra) of the joint surface BD of the terminal TE can be 6 μm or higher. On the other hand, the surface roughness (arithmetic mean roughness Ra) of the joint portion joined with the conductive connecting member (the wire BW) in the exposed surface EX of the terminal TE can be 4 μm or lower.

Hereinafter, the principal feature of the present first embodiment will be further specifically explained as mainly describing the stud bump SB which is the anchor means of the present first embodiment.

In the present first embodiment, the stud bump SB is used as the anchor means provided on the exposed surface EX of the terminal TE. In other words, in the present first embodiment, the stud bump SB is formed as the anchor means on the exposed surface EX of the terminal TE which is exposed from the through hole SH of the base material BS. By forming the stud bump SB on the exposed surface EX of the terminal TE, the adhesiveness between the sealing body MR and the exposed surface EX of the terminal TE can be improved. Therefore, as described above, the reliability of the electrical connection of the pad PD with the terminal TE can be improved. Therefore, the reliability of the semiconductor device can be improved. Also, the manufacturing yield of the semiconductor device can be improved.

A reason why the adhesiveness between the sealing body MR and the exposed surface EX of the terminal TE can be improved by forming the stud bump SB on the exposed surface EX of the terminal TE is, for example, as follows.

The bonding strength (bonding force) between the exposed surface EX of the terminal TE made of a metal material and the stud bump SB made of a metal material can be larger than the bonding strength (bonding force) between the exposed surface EX of the terminal TE made of the metal material and the resin (sealing body MR). Therefore, in a case of the formation of the stud bump SB as compared with a case of non-formation of the stud bump SB, a part of a resin area (area of the sealing body MR) in contact with the exposed surface EX of the terminal TE is replaced by the stud bump SB having the higher bonding strength with respect to the exposed surface EX of the terminal TE than that of the resin (sealing body MR). And, the stud bump SB is a convex portion (protruding portion) formed on the exposed surface EX of the terminal TE, and therefore, a contact area between the stud bump SB and the sealing body MR is larger than a contact area between the stud bump SB and the exposed surface EX of the terminal. Therefore, the adhesiveness between the sealing body MR and the exposed surface EX of the terminal TE including the surface of the stud bump SB in the case of the formation of the stud bump can be higher than the adhesiveness between the sealing body MR and the exposed surface EX of the terminal TE in the case of the non-formation of the stud bump SB. Therefore, the peel-off of the sealing body MR from the exposed surface EX of the terminal TE is more difficult in the case of the formation of the stud bump SB than the case of the non-formation of the stud bump SB.

Figure 49:
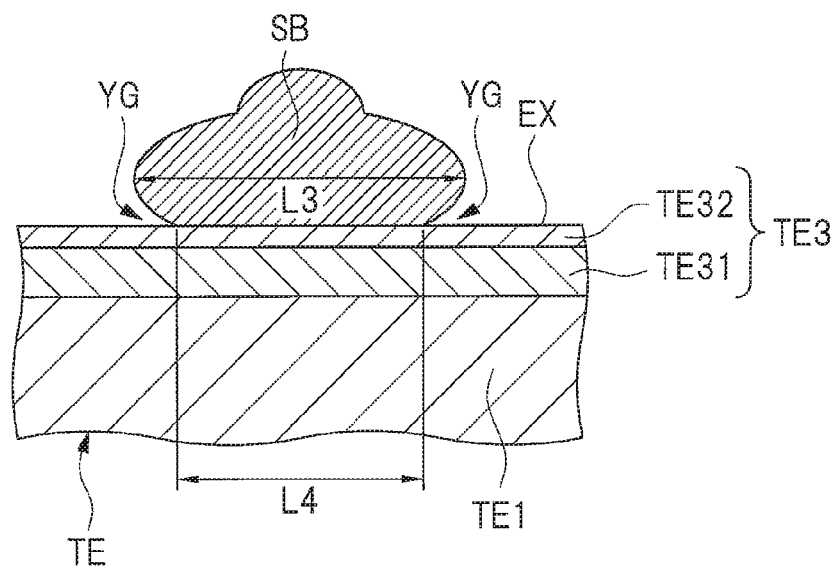
FIG. 49 is a cross-sectional view schematically illustrating a stud bump formed on an exposed surface of a terminal.

Also, the stud bump SB is formed by forming the ball portion (ball-shaped electrode) at the tip (end) of the wire made of, for example, gold, and pressing this ball portion against the exposed surface EX of the terminal TE by the capillary (illustration omitted) to join the ball portion to the exposed surface, and is formed of the ball portion (ball-shaped electrode) squashed into a flattened shape. Therefore, as illustrated in FIG. 49, a cross-sectional shape of the stud bump SB on a cross section that is substantially perpendicular to the exposed surface EX of the terminal TE is a substantially elliptical shape (elliptical shape having a smaller dimension in a direction substantially perpendicular to the exposed surface EX than a dimension in a direction substantially parallel to the exposed surface EX). Here, FIG. 49 is a cross-sectional view schematically illustrating the stud bump SB formed on the exposed surface EX of the terminal TE.

The cross-sectional area of the stud bump SB on a plane that is substantially parallel to the exposed surface EX of the terminal TE is larger at an intermediate portion in a height direction of the stud bump SB than a lower portion in the height direction of the stud bump SB (the joint surface between the stud bump SB and the exposed surface EX). Thus, in FIG. 49, a dimension L3 is larger than a dimension L4 (i.e., "L3>L4"). Here, each of the dimension L3 and the dimension L4 in FIG. 49 corresponds to a diameter of the cross section of the stud bump SB on the plane that is substantially parallel to the exposed surface EX of the terminal TE, the dimension L3 among them is the diameter of the lower portion in the height direction of the stud bump SB (the joint surface between the stud bump SB and the exposed surface EX), and the dimension L4 is the diameter of the intermediate portion in the height direction of the stud bump SB.

Note that the height direction of the stud bump SB is a protruding direction of the stud bump SB from the exposed surface EX joined with the stud bump SB with respect to the exposed surface EX of the terminal TE, and corresponds to the direction that is substantially perpendicular to the exposed surface EX of the terminal TE. A direction that goes away from the joint surface between the stud bump SB and the exposed surface EX in the protruding direction of the stud bump SB with respect to the joint surface therebetween indicates a higher side or an upper side. Therefore, the intermediate portion in the height direction of the stud bump SB is at a position higher than the joint surface between the stud bump SB and the exposed surface EX, and at a position lower than the highest portion of the stud bump SB (the portion that is most distant away from the joint surface between the stud bump SB and the exposed surface EX).

In other words, at a position higher than the joint surface (at the intermediate portion in the height direction of the stud bump SB), the stud bump SB has a portion where the cross section of the stud bump SB on the plane that is substantially parallel to the exposed surface EX of the terminal TE is larger than the joint surface between the stud bump SB and the exposed surface EX. In viewing in the height direction of the stud bump SB, this manner causes a state in which a part (a portion illustrated by arrows denoted with a symbol "YG" in FIG. 49) of the sealing body MR is sandwiched between a part of the stud bump SB and the exposed surface EX of the terminal TE. Such a state is preferable for causing the stud bump SB to be functioned as the anchor means because the sealing body MR is difficult to be peeled off from the stud bump SB.

Thus, in viewing in the height direction of the stud bump SB, it is more preferred to sandwich the part (the portion illustrated by the arrows denoted with the symbol YG in FIG. 49) of the sealing body MR between the part of the stud bump SB and the exposed surface EX of the terminal TE. In other words, in viewing in the height direction of the stud bump SB, it is more preferred to provide the part (the portion illustrated by the arrows denoted with the symbol YG in FIG. 49) of the sealing body MR immediately below the part of the stud bump SB. In this manner, the sealing body MR is difficult to be peeled off from the stud bump SB, and therefore, the adhesiveness between the sealing body MR and the stud bump SB can be further improved. Therefore, the peel-off of the sealing body MR can be more reliably suppressed or prevented. Therefore, the reliability of electrical connection of the pad PD with the terminal TE can be more reliably improved. Moreover, the reliability of the semiconductor device can be more reliably improved. Moreover, the manufacturing yield of the semiconductor device can be more reliably improved.

Also, in the present embodiment, the stud bump SB is formed as the anchor means on the exposed surface EX of the terminal TE, and the above-described FIG. 6 illustrates a case in which the stud bump SB is formed at three locations on the exposed surface EX of the terminal TE (in other words, a case in which total three stud bums SB are formed thereon) as an example. However, the number of the stud bumps SB formed on the exposed surface EX of the terminal TE is not limited to this, and can be variously changed. Even in a case in which the stud bump SB is formed at one location on the exposed surface EX of the terminal TE (in other words, a case in which total one stud bump SB is formed thereon), the peel-off of the sealing body MR can be suppressed or prevented more than the case of the non-formation of the stud bump SB since the formed stud bump SB is functioned as the anchor means. Therefore, the reliability of the electrical connection of the pad PD with the terminal TE can be improved. Moreover, the reliability of the semiconductor device can be improved. Moreover, the manufacturing yield of the semiconductor device can be improved.

However, it is more preferred to form the stud bump SB at a plurality of locations on the exposed surface EX of the terminal TE (in other words, to form a plurality of stud bumps SB). In this manner, the adhesiveness between the sealing body MR and the exposed surface EX of the terminal TE including the surface of the stud bump SB can be more increased, so that the peel-off of the sealing body MR from the exposed surface EX of the terminal TE can be more reliably suppressed or prevented.

Also, even a case in which the stud bump SB is formed at any location on the exposed surface EX of the terminal TE can obtain the effect of suppressing or preventing the peel-off of the sealing body MR more than the case of the non-formation of the stud bump SB on the exposed surface EX of the terminal TE. Note that the stud bump SB is formed in the region except for the joint portion joined with the conductive connecting member (for example, the wire BW) in the exposed surface EX of the terminal TE.

However, if the stud bump SB is formed in a region which tends to be an originating point of the peel-off of the sealing body MR in the exposed surface EX of the terminal TE, the effect of suppressing or preventing the peel-off of the sealing body MR can be more increased. In this point of view, it is more preferred to form the stud bump SB at a closer position to an inner wall of the through hole SH in the exposed surface EX of the terminal TE than to the joint portion joined with the conductive connecting member (for example, the wire BW) (see FIG. 6). This is because the portion which tends to be the originating point of the peel-off of the sealing body MR in the exposed surface EX of the terminal TE is a circumferential portion (corresponding to a region 51 hatched with dots in FIG. 50) in the exposed surface EX of the terminal TE.

Figure 50:
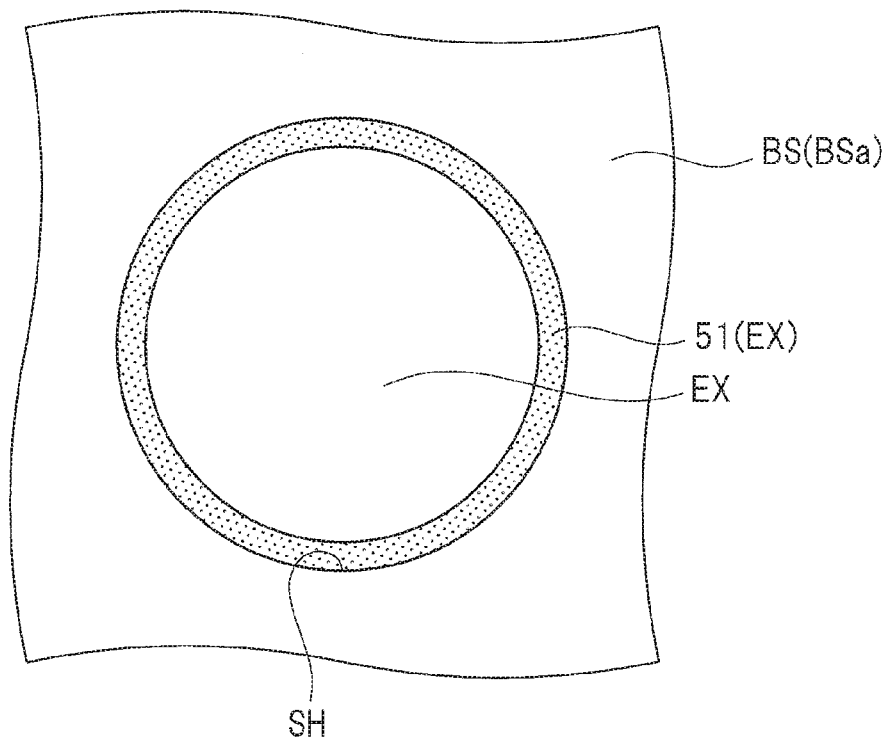
FIG. 50 is a plan view illustrating an exposed surface of a terminal exposed from a through hole of a base material.

Here, FIG. 50 is a plan view illustrating the exposed surface EX of the terminal TE which is exposed from the through hole SH of the base material BS. FIG. 50 is a plan view so that the region 51 which tends to be the originating point of the peel-off of the sealing body MR (in other words, a region where the peel-off of the sealing body MR tends to be caused first) is hatched with dots.

As illustrated in FIG. 50, the region 51 which tends to be the originating point of the peel-off of the sealing body MR in the exposed surface EX of the terminal TE is the circumferential portion (the region close to the inner wall of the through hole SH) in the exposed surface EX of the terminal TE. If the peel-off of the sealing body MR is caused in the region 51, the peel-off of the sealing body MR progresses with taking the region as the originating point, and load is adversely applied to the joint portion joined with the conductive connecting member (for example, the wire BW) in the exposed surface EX of the terminal TE.

Therefore, it is preferred to form the anchor means (the stud bump SB here) in the region 51 which tends to be the originating point of the peel-off of the sealing body MR or at a position close to the region, and therefore, it is preferred to form the anchor means in the circumferential portion in the exposed surface EX of the terminal TE or at a position close to the circumferential portion (in other words, a position close to the inner wall of the through hole SH to some extent). In this manner, the peel-off of the sealing body MR can be easily suppressed or prevented.

On the other hand, in the conductive connecting member (for example, the wire BW) for electrically connecting the pad PD with the terminal TE, it is easier to form the conductive connecting member (for example, the wire BW) at a position that is distant away from the inner wall of the through hole SH to some extent in the exposed surface EX of the terminal TE. This is because it is not easy to form the conductive connecting member (for example, the wire BW) for electrically connecting the pad PD with the terminal TE at a position that is close to the inner wall of the through hole SH in the exposed surface EX of the terminal TE since the conductive connecting member is extended from the exposed surface EX of the terminal TE to the pad PD. On the other hand, it is not required to extend the stud bump SB to the pad PD, and therefore, such a restriction in terms of the formation is smaller than that of the wire BW.

Therefore, it is more preferred to form the stud bump SB at the position that is closer to the inner wall of the through hole SH in the exposed surface EX of the terminal TE than to the joint portion joined with the conductive connecting member (for example, the wire BW). In other words, in the exposed surface EX of the terminal TE as illustrated in FIG. 6, it is more preferred that a distance (interval) L2 between the stud bump SB and the inner wall of the through hole SH is smaller than a distance (interval) L1 between the joint portion joined with the conductive connecting member (for example, the wire BW) and the inner wall of the through hole SH (that is, "L2<L1"). In this manner, the peel-off of the sealing body MR can be reliably suppressed or prevented, and besides, the conductive connecting member (for example, the wire BW) for electrically connecting the pad PD with the terminal TE can be easily reliably formed. Therefore, the reliability of the semiconductor device can be more reliably improved, and besides, the semiconductor device can be easily manufactured.

For the distance (interval) L2 between the stud bump SB and the inner wall of the through hole SH, it is preferred to ensure a distance as much as the above-described capillary 25 used for the formation of the stud bump SB is not in contact with the inner wall of the through hole SH.

Also, as illustrated in FIGS. 5 and 6, it is preferred to provide the joint portion joined with the conductive connecting member (for example, the wire BW) in the exposed surface EX of the terminal TE at a position not overlapped with the center of the exposed surface EX of the terminal TE. This is because the center of the exposed surface EX of the terminal TE is easier to bend than the circumferential portion thereof.

Note that FIG. 6 illustrates the center of the exposed surface EX of the terminal TE so as to add a symbol "CT", and FIG. 5 illustrates a center line which penetrates through the center CT of the exposed surface EX of the terminal TE and which is substantially perpendicular to the exposed surface EX of the terminal TE so as to add a symbol "CL". As illustrated in FIGS. 5 and 6, the joint portion joined with the wire BW in the exposed surface EX of the terminal TE is at a position not overlapped with the center CT of the exposed surface EX of the terminal TE and the center line CL, in other words, at a position shifted from the center CT of the exposed surface EX of the terminal TE and the center line CL.

By joining the conductive connecting member (for example, the wire BW) in the exposed surface EX of the terminal TE at the position not overlapped with the center CT of the exposed surface EX of the terminal TE, the application of the load (stress, damage) to the joint portion of the conductive connecting member (for example, the wire BW) due to the bend of the exposed surface EX of the terminal TE can be easily suppressed. Thus, the reliability of the semiconductor device can be more reliably improved.

Also, in the shift of the joint portion joined with the conductive connecting member (for example, the wire BW) in the exposed surface EX of the terminal TE from the center CT of the exposed surface EX of the terminal TE, it is preferred to shift the joint portion in a direction that goes away (separated) from the center of the semiconductor device PKG. This is because the center of the semiconductor device PKG is easier to be bent than the circumferential portion of the semiconductor device since, when the semiconductor device PKG is embedded in the card main body 2, only the circumferential portion of the semiconductor device PKG (the circumferential portion of the substrate CB) is supported by the card main body 2 (more specifically, is fixed to the bottom surface 3c of the above-described concave portion 3a via the bonding material 4).

Therefore, by shifting the position of the joint portion to which the conductive connecting member (for example, the wire BW) is joined in the exposed surface EX of the terminal TE from the center CT of the exposed surface EX of the terminal TE in a first direction, the application of the load (stress, damage) to the joint portion of the conductive connecting member (for example, the wire BW) due to the bend of the semiconductor device PKG can be easily suppressed. In this manner, the reliability of the semiconductor device can be further reliably improved. Here, the above-described first direction is the direction that goes away from the center of the semiconductor device PKG. In more detailed description of the first direction, it is more preferred that the first direction is a direction that is on a straight line connecting the center of the exposed surface EX of the terminal TE with the center of the semiconductor device PKG (almost corresponding to the center of the substrate CB) in a planar view (in viewing on a plane that is substantially parallel to the upper surface CBa of the substrate CB) and that goes away (separated) from the center of the semiconductor device PKG.

Also, in the exposed surface EX of the terminal TE, it is more preferred to surround the joint portion of the conductive connecting member (for example, the wire BW) by the plurality of stud bumps SB in the planar view. In this manner, the application of the load caused by the peel-off of the sealing body MR to the joint portion of the conductive connecting member (for example, the wire BW) can be more reliably suppressed or prevented. Thus, the reliability of the semiconductor device can be further improved.

Further, in a case in which the plurality of terminals TE are formed on the lower surface BSb of the substrate BS, by providing the anchor means in the exposed surface EX of at least one terminal TE among the plurality of terminals TE, the peel-off of the sealing body MR in the exposed surface EX of the terminal TE provided with the anchor means can be suppressed or prevented. In this manner, the reliability of the semiconductor device can be improved more than a case in which the anchor means is not provided at all.

However, in the case in which the plurality of terminals TE are formed on the lower surface BSb of the base material BS, it is more preferred to provide the anchor means in each of the exposed surfaces EX of the plurality of terminals TE. In this manner, the peel-off of the sealing body MR can be suppressed or prevented in each of the exposed surfaces EX of the plurality of terminals TE provided with the anchor means. Thus, the reliability of the semiconductor device can be further improved.

However, there is a case in which the plurality of terminals TE are formed on the lower surface BSb of the base material BS so as to mix the terminal TE joined with the conductive connecting member (for example, the wire BW) for electrically connecting the pad PD with the terminal TE not joined with the conductive connecting member. In this case, for the terminal TE joined with the conductive connecting member (for example, the wire BW), it is preferred to provide the anchor means on the exposed surface EX of this terminal TE. However, for the exposed surface EX of the terminal TE not joined with the conductive connecting member (for example, the wire BW), it is not required to provide the anchor means. This is because, for the exposed surface EX of the terminal TE not connected to the conductive connecting member (for example, the wire BW) for electrically connecting the pad PD with the terminal TE, it is not required to consider the influence on the electrical connection of the terminal TE with the pad PD even if the sealing body MR is peeled off from the exposed surface EX of this terminal TE.

When the anchor means is not provided, note that the exposed surface EX of the terminal TE not joined with the conductive connecting member (for example, the wire BW) can obtain such advantages that the manufacturing time of the semiconductor device can be shortened and that throughput can be improved.

Therefore, in the cases of the above-described FIGS. 2 and 3, the eight terminals TE are formed so that the wire BW is connected to each of the exposed surfaces EX of the terminals GND, I/O, VCC, RST, and CLK among the terminals while the wire BW is not connected to each of the exposed surfaces EX of the terminals NC1, NC2, and NC3. This case can be made as follows.

That is, the anchor means is provided on the exposed surface(s) EX of at least one terminal among the terminals GND, I/O, VCC, RST, and CLK connected to the wires BW. More preferably, the anchor means is provided on the exposed surfaces EX of all of the terminals GND, I/O, VCC, RST, and CLK connected to the wires BW. On the other hand, for the terminals NC1, NC2, and NC3 not connected to the wires BW, the anchor means may or may not be provided on the exposed surfaces. Alternatively, the provision of the anchor means and non-provision of the anchor means may be mixed. However, the case of the non-provision of the anchor means can obtain such advantages that the manufacturing time of the semiconductor device can be shortened and that throughput can be improved.

First Modification Example of First Embodiment

Next, a first modification example of the present first embodiment will be explained.

Figure 51:
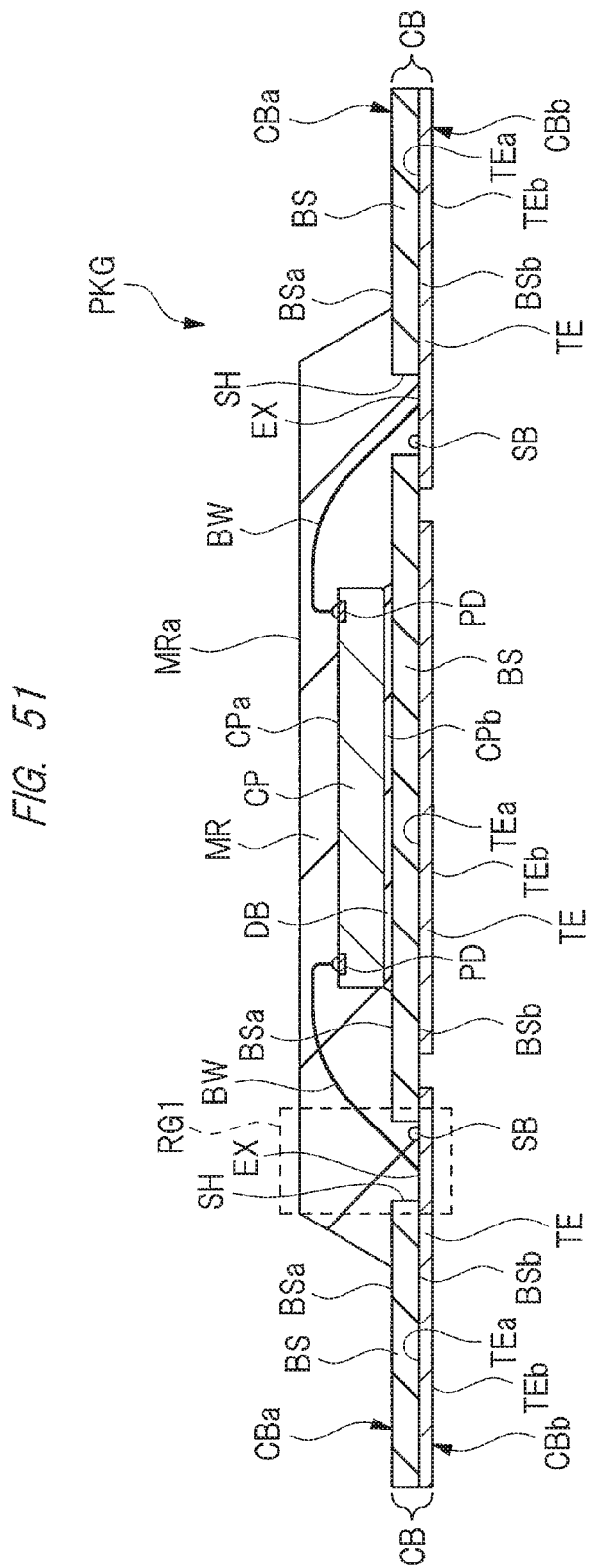
FIG. 51 is a cross-sectional view of a semiconductor device of the first modification example.
Figure 52:
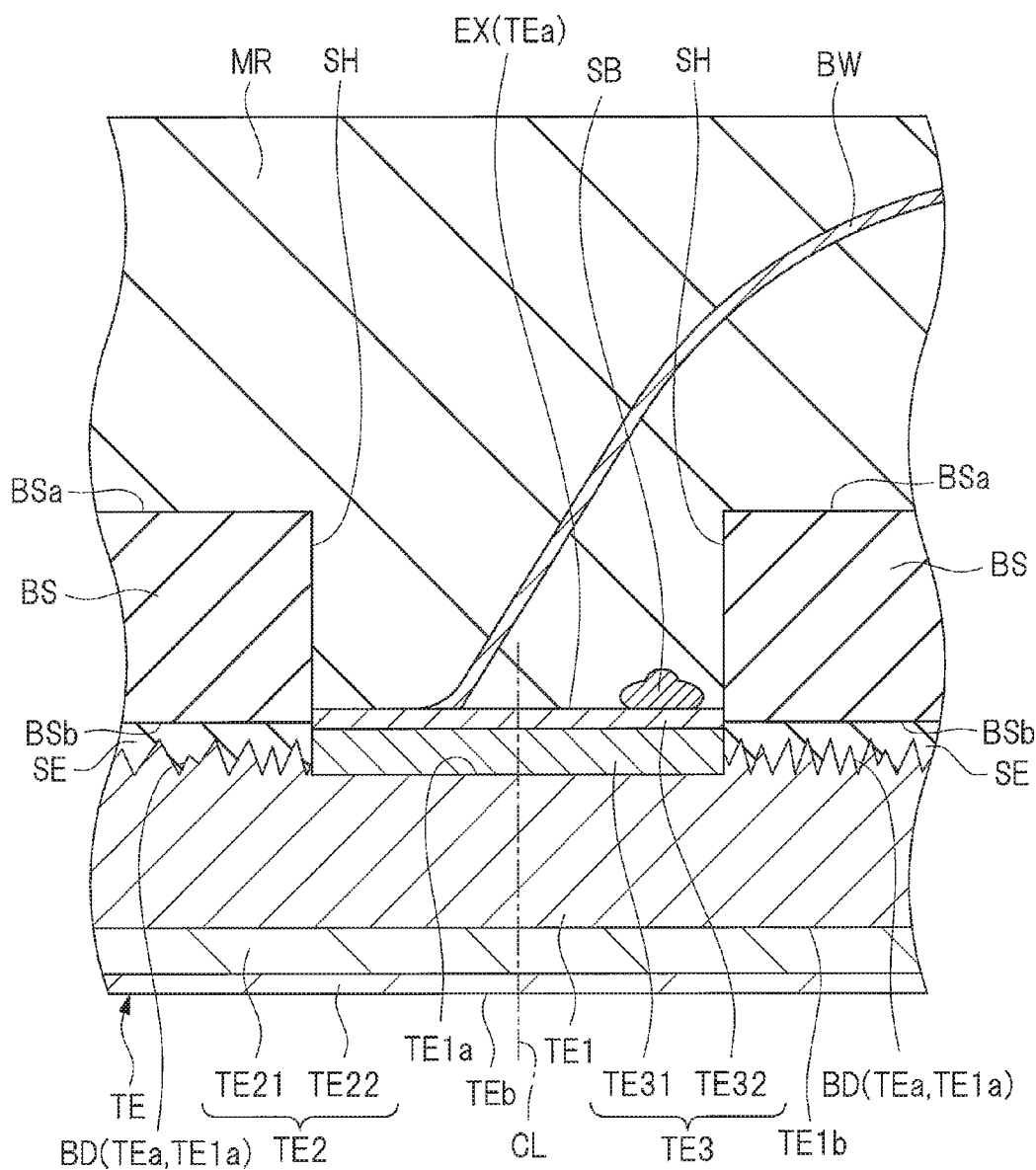
FIG. 52 is a partial enlarged cross-sectional view of the semiconductor device of the first modification example.

FIGS. 51 and 52 are cross-sectional views each illustrating the first modification example of the semiconductor device PKG of the present first embodiment, and correspond to the above-described FIGS. 4 and 5, respectively. FIG. 52 illustrates an enlarged view of a region RG1 surrounded by a dotted line in FIG. 51.

In the cases of the above-described FIGS. 4 and 5, the wire BW is connected by the reverse bonding method. However, in cases of the first modification example of FIGS. 51 and 52, the wire BW is connected by the forward bonding method.

That is, in the cases of the first modification example of FIGS. 51 and 52, the pad PD of the semiconductor chip CP and the exposed surface EX of the terminal TE of the substrate CB are electrically connected to each other via the wire BW as follows.

First, the ball portion 26a is formed at the tip (end) of the wire 26 as illustrated in the above-described FIG. 36, and then, the above-described ball portion 26a formed at the tip (end) of the wire 26 is connected (joined) to the pad PD of the semiconductor chip CP. At this time, the above-described bump BP is not formed on the pad PD. Then, the above-described clamper 25a is loosened, and the above-described capillary 25 is moved toward above the pad PD to some extent as feeding the above-described wire 26, and then, is moved toward the exposed surface EX of the terminal TE to be the second bonding side. Then, the above-described wire 26 is clamped again by the above-described clamper 25a, and a part of the wire 26 (the part being different from the end formed with the ball portion 26a) is rubbed (is torn off as being squashed) against the exposed surface EX of the terminal TE to be the second bonding side by the tip of the above-described capillary 25. In this manner, as illustrated in FIGS. 51 and 52, the wire BW is formed so as to have one end connected to the pad PD and the other end connected to the exposed surface EX of the terminal TE.

Therefore, in the cases of the first modification example of FIGS. 51 and 52, the above-described ball portion BL integrally formed with the wire BW is joined with the pad PD of the semiconductor chip CP, and it is not required to form the above-described stud bump BP on the pad PD. Moreover, the wire BW is joined with the exposed surface EX of the terminal TE so as not to interpose the above-described ball portion BL therebetween.

Other configurations and manufacturing steps of the first modification example of FIGS. 51 and 52 are as explained in the above-described first embodiment. Therefore, the repetitive explanation thereof is omitted.

Also the cases of the first modification example of FIGS. 51 and 52 can obtain effects similar to those explained in the first embodiment.

Also, the bonding strength between the wire BW and the exposed surface EX of the terminal TE is lower in the case of the connection of the wire BW by the forward bonding method than the case of the connection thereof by the reverse bonding method. Therefore, an adverse effect (such as change of the electrical characteristics or disconnection) caused when load (stress, damage) is applied to the joint portion between the wire BW and the exposed surface EX of the terminal TE due to the peel-off of the sealing body MR is larger in the case of the connection by the forward bonding method than the case of the connection of the wire BW by the reverse bonding method. However, even in the case of the connection of the wire BW by the forward bonding method, the peel-off of the sealing body MR can be suppressed or prevented by providing the anchor means on the exposed surface EX of the terminal TE, and therefore, the application of the load (stress, damage) to the joint portion between the wire BW and the exposed surface EX of the terminal TE due to the peel-off of the sealing body MR can be suppressed or prevented. Therefore, in not only the case of the connection of the wire BW by the reverse bonding method but also the case of the connection thereof by the forward bonding method, the reliability of the electrical connection of the pad PD with the terminal TE can be improved, and the reliability of the semiconductor device can be improved. Moreover, in the case of the connection of the wire BW by the forward bonding method, it is not required to form the above-described stud bump BP on the pad PD, and therefore, the manufacturing step (for example, the wire bonding step) of the semiconductor device can be simplified.

Note that the first modification example can be applied to a later-described second modification example and the later-described second and third embodiments (including modification examples).

Second Modification Example of First Embodiment

Next, the second modification example of the present first embodiment will be explained.

Figure 53:
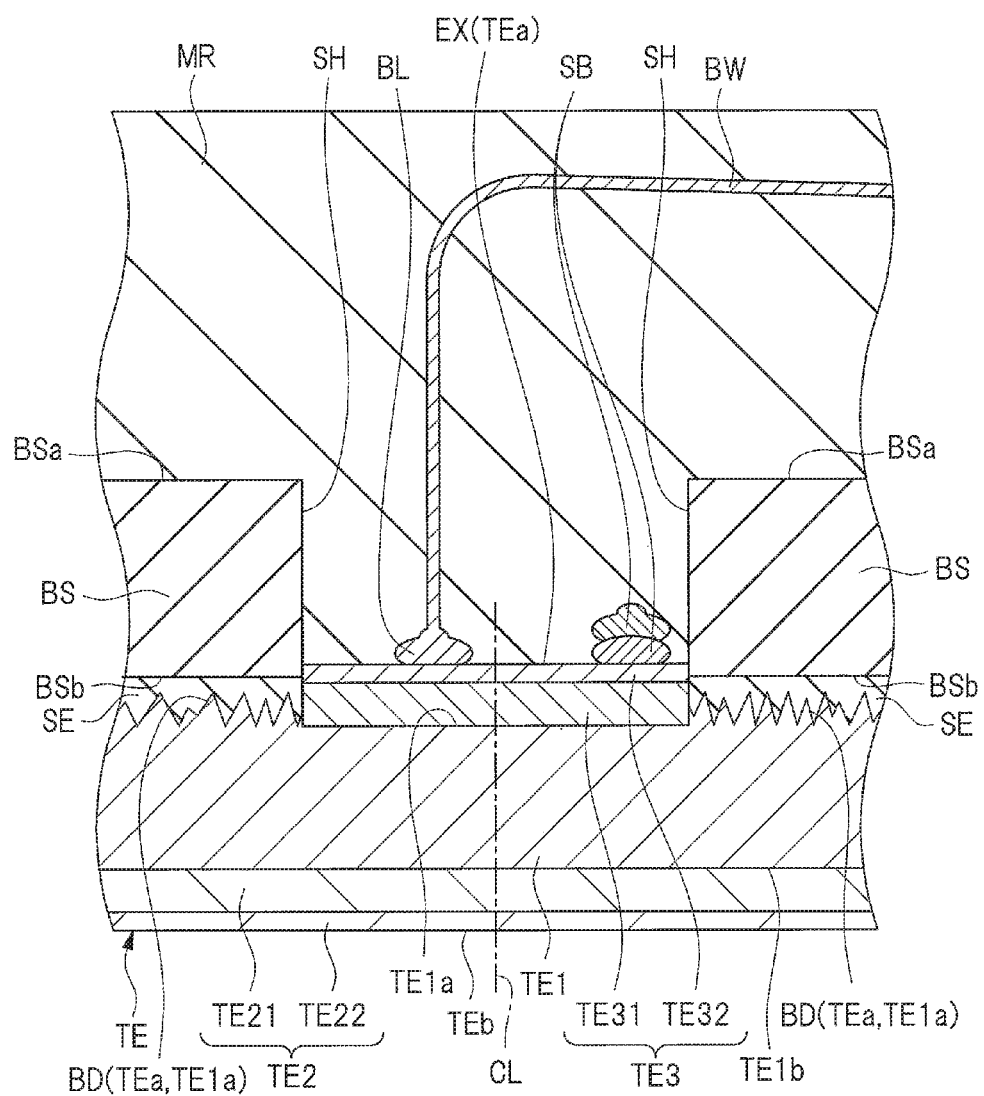
FIG. 53 is a partial enlarged cross-sectional view of a semiconductor device of the second modification example.

FIG. 53 is a partial enlarged cross-sectional view illustrating the second modification example of the semiconductor device PKG of the present first embodiment, and corresponds to the above-described FIG. 5.

In the second modification example illustrated in FIG. 53, the stud bumps SB are formed on the exposed surface EX of the terminal TE so that the plurality of stud bumps SB are stacked thereon. In other words, the plurality of stud bumps SB are stacked. This can be achieved by forming the stud bump SB on the exposed surface EX of the terminal TE in the above-described wire bonding step, and then, further forming (joining) another stud bump SB on the stud bump SB.

Two stud bumps SB are stacked in FIG. 53. However, as another aspect, three or more stud bumps SB can be stacked. When the two stud bumps SB are stacked as illustrated in FIG. 53, a total height of the two stacked stud bumps SB (a dimension in a direction substantially perpendicular to the exposed surface EX) is, for example, 10 µm or larger.

By forming the plurality of stacked stud bumps SB on the exposed surface EX of the terminal TE as described in the second modification example, the anchor effect (the effect of the prevention of the peel-off of the sealing body MR) obtained by the stud bumps SB can be further improved. In this manner, the reliability of the electrical connection of the pad PD with the terminal TE can be further improved, and the reliability of the semiconductor device can be further improved.

On the exposed surface EX of the terminal TE, note that the stud bumps SB are formed at one or more locations, more preferably, at a plurality of locations. When the second modification example is applied for the formation of the stud bumps SB at the plurality of locations on the exposed surface EX of the terminal TE, the plurality of stud bumps SB can be arranged to be stacked at all of the plurality of locations, or arranged so as to mix a location at which the plurality of stud bumps SB are arranged to be stacked and a location at which one stud bump SB is arranged without being stacked among the plurality of locations.

Second Embodiment

Figure 54:
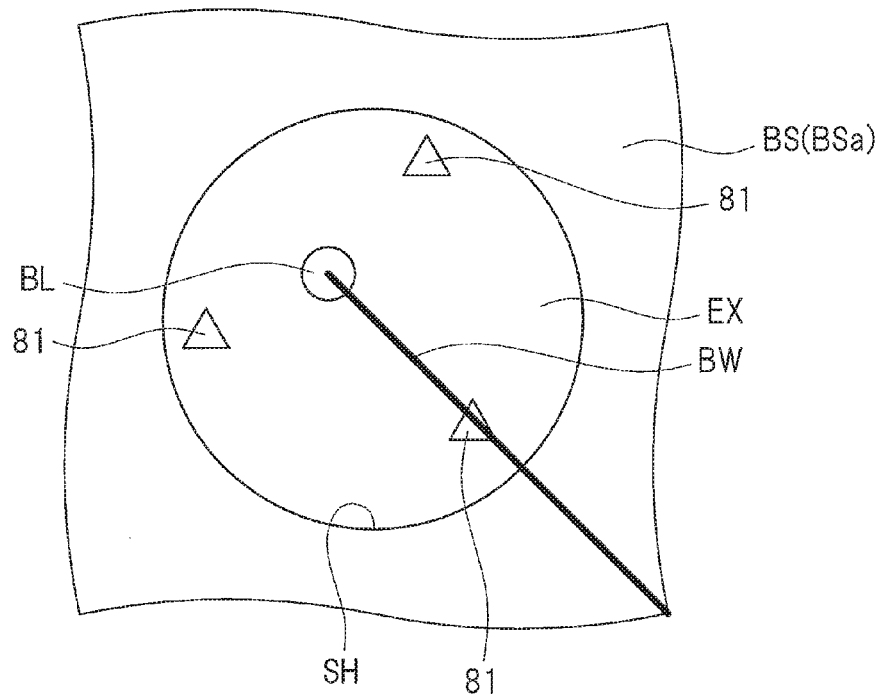
FIG. 54 is an explanatory diagram of a semiconductor device of another embodiment.
Figure 55:
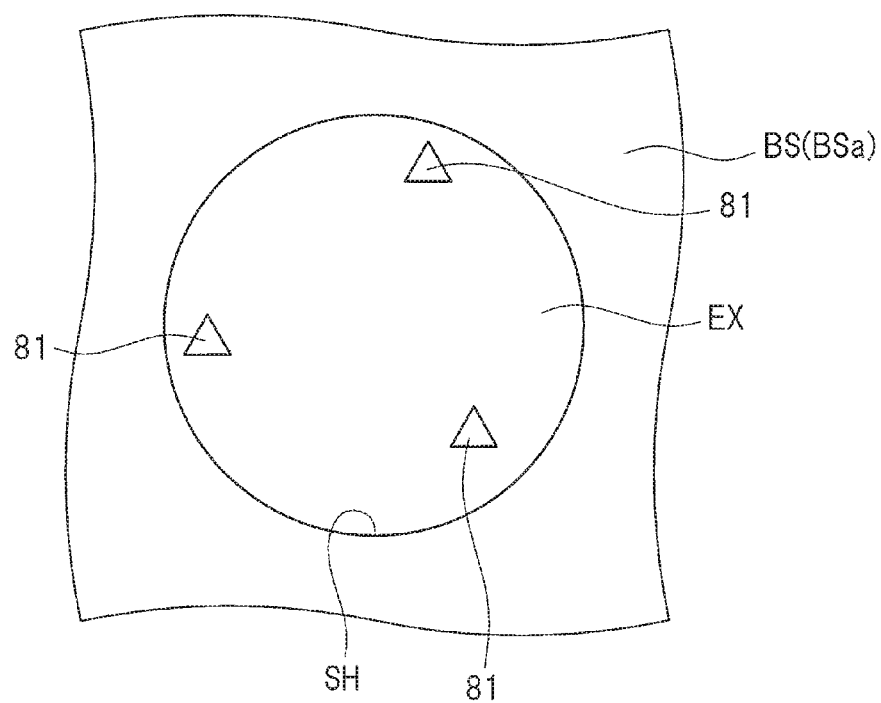
FIG. 55 is an explanatory diagram of a semiconductor device of still another embodiment.

FIGS. 54 and 55 are explanatory diagrams of a semiconductor device of the present second embodiment, and FIG. 54 corresponds to the above-described FIG. 6 of the above-described first embodiment. That is, FIG. 54 is a plan view illustrating the exposed surface EX of the terminal TE which is exposed from the through hole SH of the base material BS and illustrating the wire BW connected to the exposed surface. FIG. 55 corresponds to a plan view of the same region as FIG. 54, and FIG. 55 illustrates a stage immediately before the wire BW is connected to the exposed surface EX of the terminal TE.

In the above-described first embodiment, the stud bump SB formed on the exposed surface EX of the terminal TE is used as the anchor means provided on the exposed surface EX of the terminal TE. In the present second embodiment, as illustrated in FIGS. 54 and 55, the concave portion (the hollowed portion) 81 formed on the exposed surface EX of the terminal TE is used as the anchor means provided on the exposed surface EX of the terminal TE. The concave portion 81 is a part where the exposed surface EX of the terminal TE is hollowed. An inside part of the concave portion 81 is filled with a material of the sealing body MR (a part of the sealing body MR). A depth of the concave portion 81 can be, for example, 4 μm or larger.

The semiconductor device of the present second embodiment is similar to the semiconductor device PKG of the above-described first embodiment except for the usage of the concave portion 81 formed on the exposed surface EX of the terminal TE as the anchor means provided on the exposed surface EX of the terminal TE instead of the stud bump SB formed on the exposed surface EX of the terminal TE, and therefore, the repetitive explanation thereof is omitted here.

When the concave portion 81 is formed on the exposed surface EX of the terminal TE, the inside of the concave portion 81 is filled with the material of the sealing body MR so that an inner surface of the concave portion 81 and the sealing body MR are in contact with each other, and therefore, a contact area between the exposed surface EX of the terminal TE including the inner surface of the concave portion 81 and the sealing body MR can be increased. That is, the contact area between the exposed surface EX of the terminal TE and the sealing body MR can be larger in the case of the formation of the concave portion 81 than the case of non-formation of the concave portion 81. Therefore, the adhesiveness between the sealing body MR and the exposed surface EX of the terminal TE in the case of the formation of the concave portion 81 can be larger than the adhesiveness between the sealing body MR and the exposed surface EX of the terminal TE in the case of the non-formation of the concave portion 81. Therefore, the sealing body MR is more difficult to be peeled off from the exposed surface EX of the terminal TE in the case of the formation of the concave portion 81 than the case of the non-formation of the concave portion 81.

In this manner, in the present second embodiment, since the concave portion 81 formed on the exposed surface EX of the terminal TE is functioned as the anchor means, the peel-off of the sealing body MR from the exposed surface EX of the terminal TE can be suppressed or prevented. Therefore, the reliability of the electrical connection of the pad PD with the terminal TE can be improved, and the reliability of the semiconductor device can be improved. Moreover, the manufacturing yield of the semiconductor device can be improved.

The description about the formation position of the stud bumps SB in the above-described first embodiment, the number of the formation, and others can be applied also to the formation position of the concave portions 81, the number of the formation, and others. Moreover, a planar shape of the concave portion 81 can be variously changed.

Figure 56:
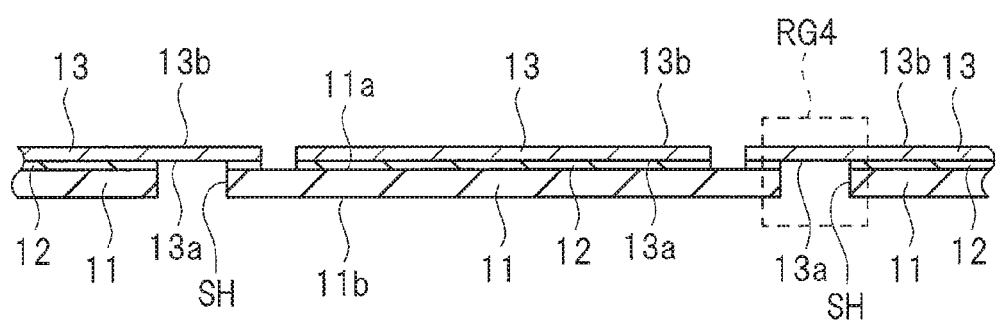
FIG. 56 is a cross-sectional view illustrating a step of manufacturing a substrate.
Figure 58:
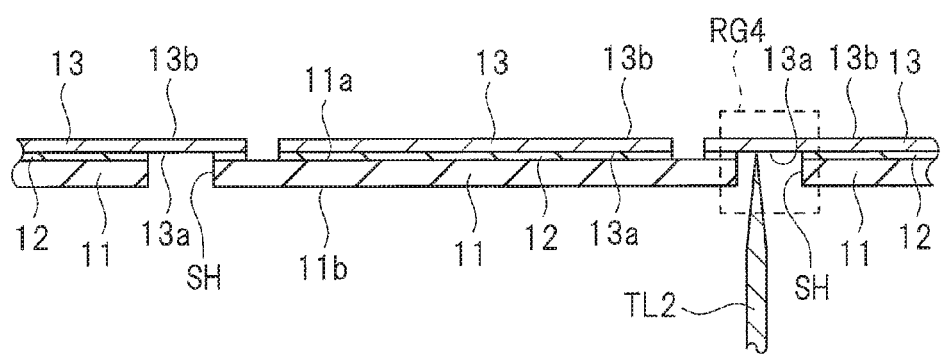
FIG. 58 is a cross-sectional view illustrating a step of manufacturing the substrate.
Figure 59:
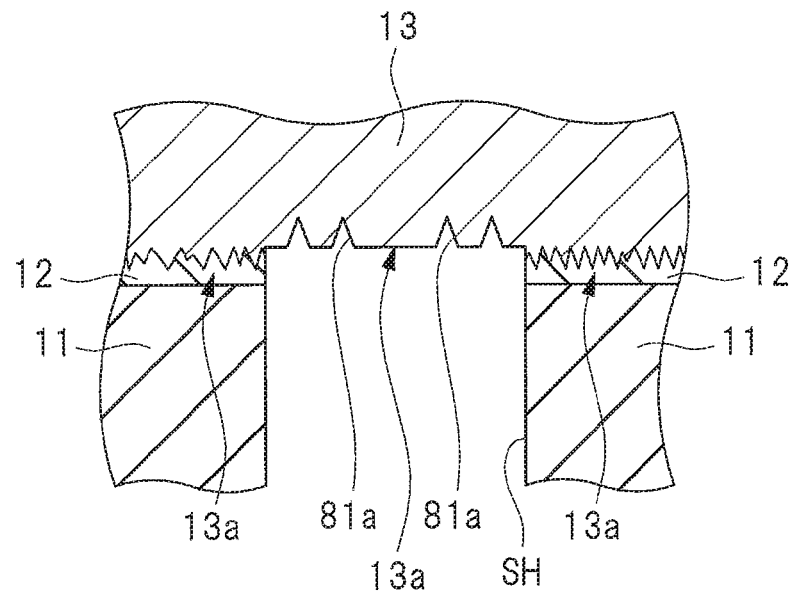
FIG. 59 is a cross-sectional view illustrating a step of manufacturing the substrate.
Figure 60:
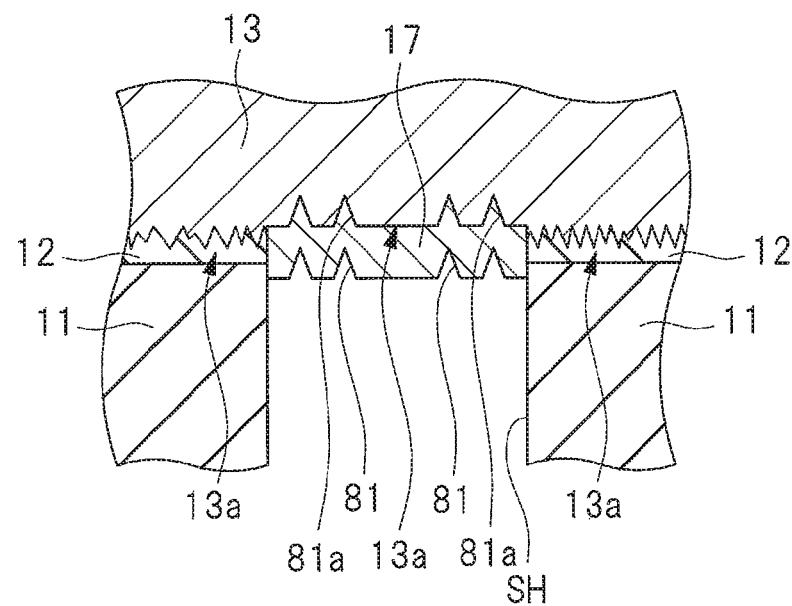
FIG. 60 is a cross-sectional view illustrating a step of manufacturing the substrate.

Next, an example of a method of forming the concave portion 81 will be explained with reference to FIGS. 56 to 60. FIGS. 56 to 60 are cross-sectional views each illustrating manufacturing steps of the substrate 10 of the present second embodiment. FIGS. 56 and 58 among them illustrate the cross-sectional views in the same region as that of the above-described FIGS. 13 to 21, FIG. 57 illustrates an enlarged view of a region RG4 surrounded by a dotted line in FIG. 56, and FIG. 59 illustrates an enlarged view of the region RG4 surrounded by a dotted line in FIG. 58. Also, FIG. 60 illustrates a cross-sectional view in the same region as but at a different step stage from those of FIG. 59.

Figure 57:
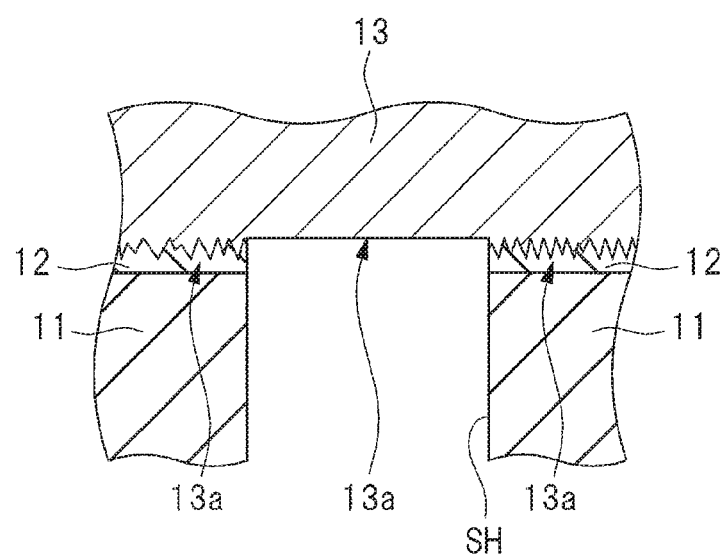
FIG. 57 is a cross-sectional view illustrating a step of manufacturing the substrate.

First, as similar to the above-described first embodiment, the steps of the above-described steps S1a to S1h are performed to obtain structures of FIGS. 56 and 57. That is, until the principal surface 13a of the copper foil 13 which is exposed from the through hole SH of the base material 11 is flattened by performing the etching step of the above-described step S1h, the manufacturing steps of the substrate 10 of the present second embodiment are similar to the manufacturing steps of the substrate 10 of the above-described first embodiment. Therefore, the structures of FIGS. 56 and 57 are the same as the structures of the above-described FIGS. 21 and 23 obtained after the etching of the above-described step S1h.

Then, in the present second embodiment, as illustrated in FIG. 58, a tip portion of a tool (jig) TL2 having a sharp tip portion is pressed against the principal surface 13a of the copper foil 13 which is exposed from the through hole SH of the substrate 11. In this manner, as illustrated in FIG. 59, the concave portion (the hollowed portion) 81a can be formed on the principal surface 13a of the copper foil 13 which is exposed from the through hole SH of the base material 11. The concave portion 81a is a part where the principal surface 13a of the copper foil 13 is hollowed.

Then, the above-described plating films 16 and 17 are formed on the exposed surfaces of the copper foil 13 by performing the above-described step S1i as similar to the above-described first embodiment. FIG. 60 illustrates a stage in which the plating films 16 and 17 are formed by performing this step S1i so that the plating film 17 (corresponding to the above-described plating layer TE3) is formed on the principal surface 13a (corresponding to the above-described upper surface TE1a) of the copper foil 13 (corresponding to the above-described copper layer TE1) which is exposed from the through hole SH.

The plating film 17 is conformally formed with respect to a base surface (in other words, the principal surface 13a of the copper foil 13 which is exposed from the through hole SH of the base material 11). Therefore, if the concave portion 81a is formed on the principal surface 13a of the copper foil 13 exposed from the through hole SH of the base material 11, the concave portion 81 is formed on the surface of the plating film 17 in accordance with the concave portion 81a. In this manner, the concave portion 81 can be formed on the surface of the plating film 17, that is, on the exposed surface EX of the terminal TE.

Also, here, the explanation has been made in the case of the formation of the concave portion 81a on the surface of the plating film 17 upon the formation of the plating film 17 by forming the concave portion 81a on the principal surface 13a of the copper foil 13 which is exposed from the through hole SH of the base material 11 before forming the plating film 17. As another aspect, the concave portion 81 can be formed on the surface of the plating film 17 (in other words, the exposed surface EX of the terminal TE) by performing steps S1a to S1i as similar to the above-described first embodiment, and then, pressing the tip portion of the tool TL2 against the surface of the plating film 17.

Further, in the present second embodiment, the concave portion 81 formed on the exposed surface EX of the terminal TE is used as the anchor means provided on the exposed surface EX of the terminal TE. As another aspect, a convex portion (a protruding portion) formed on the exposed surface EX of the terminal TE can be also used as the anchor means provided on the exposed surface EX of the terminal TE. Even the convex portion as the anchor means instead of the concave portion 81 can increase the contact area between the sealing body MR and the exposed surface EX of the terminal TE, and therefore, the adhesiveness between the sealing body MR and the exposed surface EX of the terminal TE can be increased, and the effect of suppressing or preventing the peel-off of the sealing body MR from the exposed surface EX of the terminal TE can be obtained. Since the stud bump SB of the above-described first embodiment is protruded from the exposed surface EX of the terminal TE, the stud bump can be regarded as the convex portion (the protruding portion) formed on the exposed surface EX of the terminal TE.

Third Embodiment

Figure 61:
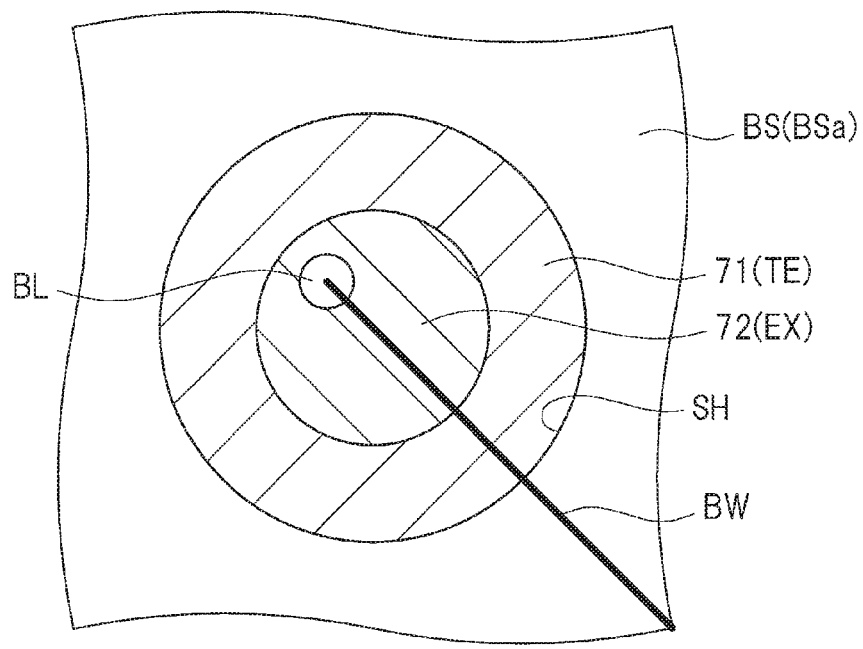
FIG. 61 is an explanatory diagram of a semiconductor device of still another embodiment.
Figure 62:
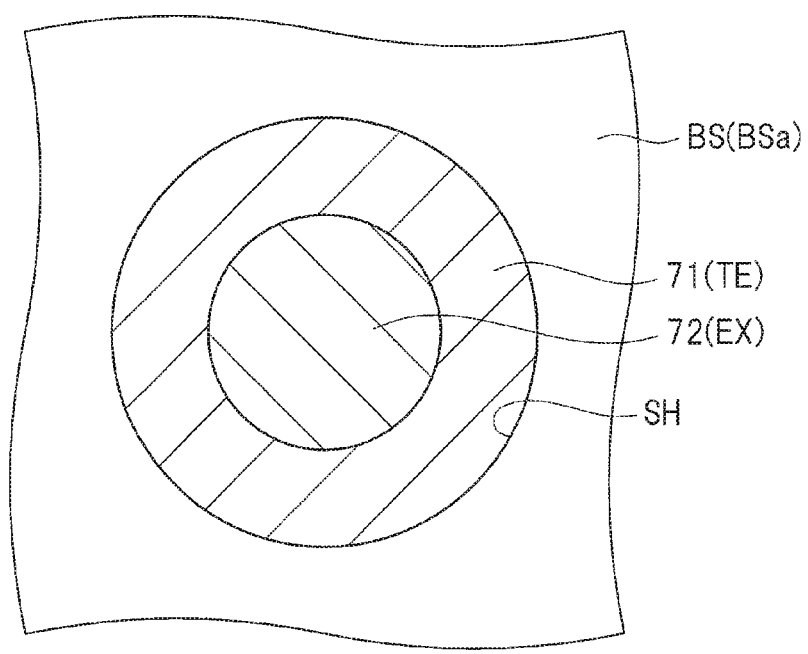
FIG. 62 is an explanatory diagram of a semiconductor device of still another embodiment.

FIGS. 61 and 62 are explanatory diagrams of a semiconductor device of the present third embodiment, and FIG. 61 corresponds to the above-described FIG. 6 of the above-described first embodiment. That is, FIG. 61 is a plan view illustrating the exposed surface EX of the terminal TE which is exposed from the through hole SH of the base material BS and illustrating the wire BW connected to the exposed surface. FIG. 62 corresponds to a plan view in the same region as that of FIG. 61 at a stage immediately before the wire BW is connected to the exposed surface EX of the terminal TE. Note that a region 71 and a region 72 are denoted by hatching in different directions from each other in order to easily distinguish the region 71 and the region 72 from each other on the exposed surface EX of the terminal TE although FIGS. 61 and 62 are plan views.

While the stud bump SB formed on the exposed surface EX of the terminal TE is used as the anchor means provided on the exposed surface EX of the terminal TE in the above-described first embodiment, and the concave portion 81 formed on the exposed surface EX of the terminal TE is used in the above-described second embodiment. In the present third embodiment, as illustrated in FIGS. 61 and 62, the surface-roughened region 71 on the exposed surface EX of the terminal TE is used as the anchor means provided on the exposed surface EX of the terminal TE.

In the present third embodiment, the exposed surface EX of the terminal TE has the surface-roughened region 71 and a flatter region 72 than the region 71. In other words, the exposed surface EX of the terminal TE has the region 71 having large surface roughness and the region 72 having small surface roughness. The surface roughness (arithmetic mean roughness Ra) of the region 71 is larger than the surface roughness (arithmetic mean roughness Ra) of the region 72. In other words, the surface roughness (arithmetic mean roughness Ra) of the region 72 is smaller than the surface roughness (arithmetic mean roughness Ra) of the region 71. Also, the flatness can be regarded to be larger as the surface roughness is smaller, and therefore, it can be also said that the region 72 has the higher flatness than that of the region 71, and the region 71 has the lower flatness than that of the region 72. Here, each surface roughness of the regions 71 and 72 indicates the arithmetic mean roughness Ra.

As one example of each surface roughness of the regions 71 and 72, the surface roughness (the arithmetic mean roughness Ra) of the region 71 having the large surface roughness can be set to, for example, 6 µm or larger, and the surface roughness (the arithmetic mean roughness Ra) of the region 72 having the small surface roughness can be set to, for example, 4 µm or smaller. That is, in the present third embodiment, the surface roughness (the arithmetic mean roughness Ra) of the region 71 is the same as the surface roughness (the arithmetic mean roughness Ra) of the joint surface BD of the terminal TE, and is still in a state in which the etching of step S1h illustrated in FIG. 12 has not been performed.

In view of the improvement of the adhesiveness between the exposed surface EX of the terminal TE and the sealing body MR, this region 71 may be additionally subjected to a surface-roughing treatment so that the surface roughness (the arithmetic mean roughness Ra) of the region 71 is larger than the surface roughness (the arithmetic mean roughness Ra) of the joint surface BD of the terminal TE.

In the present third embodiment, as illustrated in FIGS. 61 and 62, the exposed surface EX of the terminal TE has the region 71 having the large surface roughness and the region 72 having the small surface roughness. In focusing on a relation of the bonding strength between the exposed surface EX of the terminal TE and the sealing body MR with respect to the surface roughness of the exposed surface EX of the terminal TE, as the surface roughness of the exposed surface EX of the terminal TE is larger, the contact area between the exposed surface EX of the terminal TE and the sealing body MR is larger, and the bonding strength between the exposed surface EX of the terminal TE and the sealing body MR is higher. Therefore, in the present third embodiment, the exposed surface EX of the terminal TE has the region 71 having the large surface roughness, and the region 71 having the large surface roughness is brought into contact with the sealing body MR, so that the bonding strength between the exposed surface EX of the terminal TE and the sealing body MR is increased, and the adhesiveness between the exposed surface EX of the terminal TE and the sealing body MR is improved. In this manner, the peel-off of the sealing body MR from the exposed surface EX of the terminal TE can be suppressed or prevented.

However, if the surface roughness of the entire exposed surface EX of the terminal TE is large as different from the present third embodiment, it is difficult to reliably connect (join) the conductive connecting member (for example, the wire BW) to the exposed surface EX of the terminal TE. That is, it is preferred to provide the small surface roughness in the region joined with the conductive connecting member such as the wire BW on the exposed surface EX of the terminal TE.

Accordingly, in the present third embodiment, as illustrated in FIGS. 61 and 62, the exposed surface EX of the terminal TE has the region 71 having the large surface roughness and the region 72 having the small surface roughness, and the conductive connecting member (for example, the wire BW) for electrically connecting the pad PD with the terminal TE is connected (joined) to not the region 71 having the large surface roughness but the region 72 having the small surface roughness. By connecting (joining) the conductive connecting member (for example, the wire BW) to the region 72 having the small surface roughness, the conductive connecting member (for example, the wire BW) can be easily and reliably connected (joined) to the exposed surface EX of the terminal TE. Moreover, the bonding strength between the conductive connecting member (for example, the wire BW) and the exposed surface EX of the terminal TE can be increased.

In this manner, in the present third embodiment, the region 71 having the large surface roughness (the surface-roughened region 71) is provided as the anchor means in the region except for the joint portion joined with the conductive connecting member (for example, the wire BW) in the exposed surface EX of the terminal TE which is exposed from the through hole SH of the base material BS. The region 71 having the large surface roughness (the surface-roughened region 71) in the exposed surface EX of the terminal TE is functioned as the anchor means, so that the peel-off of the sealing body MR from the exposed surface EX of the terminal TE can be suppressed or prevented. Therefore, the reliability of the electrical connection of the pad PD with the terminal TE can be improved, and the reliability of the semiconductor device can be improved. Moreover, the manufacturing yield of the semiconductor device can be improved.

Also, it is preferred that the surface roughness (the arithmetic mean roughness Ra) of the joint surface BD of the terminal TE (the surface bonded to the base material BS) is larger than the surface roughness (the arithmetic mean roughness Ra) of the region 72 having the small surface roughness in the exposed surface EX of the terminal TE. In this manner, the bonding strength between the terminal TE and the base material BS can be increased, and therefore, the peel-off of the terminal TE from the base material BS can be more reliably prevented. Therefore, the reliability of the semiconductor device can be further improved.

Further, when the substrate 10 is manufactured by the steps of later-described FIGS. 61 to 70, the surface roughness (the arithmetic mean roughness Ra) of the region 71 having the large surface roughness on the exposed surface EX of the terminal TE is almost equal to the surface roughness (the arithmetic mean roughness Ra) of the joint surface BD of the terminal TE (the surface bonded to the base material BS).

Still further, as explained with reference to the above-described FIG. 50, the region 51 which tends to be the originating point of the peel-off of the sealing body MR in the exposed surface EX of the terminal TE is the circumferential portion (the region close to the inner wall of the through hole SH) in the exposed surface EX of the terminal TE. Therefore, it is preferred to form the anchor means (here, the region 71) in the region 51 which tends to be the originating point of the peel-off of the sealing body MR, or at a position close to the region, and therefore, it is preferred to form the anchor means in the circumferential portion in the exposed surface EX of the terminal TE or at a position close to the circumferential portion (in other words, a position close to the inner wall of the through hole SH to some extent). In this manner, the peel-off of the sealing body MR can be easily suppressed or prevented.

Therefore, as illustrated in FIGS. 61 and 62, it is preferred to provide the region 71 having the large surface roughness on the circumferential portion side (for example, so as to form a ring shape adjacent to the inner wall of the through hole SH) on the exposed surface EX of the terminal TE, and it is preferred to provide the region 72 having the small surface roughness inside the region 71 (on the center side of the exposed surface EX). Thus, on the exposed surface EX of the terminal TE, it is preferred that the region adjacent to the inner wall of the through hole SH is the region 71 having the large surface roughness, that the region 72 having the small surface roughness is surrounded by the region 71 having the large surface roughness, and that the region 71 having the large surface roughness is interposed between the region 72 having the small surface roughness and the inner wall of the through hole SH. In this manner, the peel-off of the sealing body MR can be easily suppressed or prevented, and besides, the conductive connecting member such as the wire BW can be easily connected (joined) to the exposed surface EX of the terminal TE.

The semiconductor device of the present third embodiment is also similar to the semiconductor device PKG of the above-described first embodiment except for the usage of the surface-roughened region 71 (the region 71 having the large surface roughness) of the exposed surface EX of the terminal TE as the anchor means provided on the exposed surface EX of the terminal TE instead of the stud bump SB formed on the exposed surface EX of the terminal TE, and therefore, repetitive explanation thereof is omitted here.

Also, the above-described second embodiment and the present third embodiment can be the same as the above-described first embodiment also in that the position of the joint portion joined with the conductive connecting member such as the wire BW on the exposed surface EX of the terminal TE is the position not overlapped with the center (CT) of the exposed surface EX, and also in the direction of the shift of the joint portion from the center (CT) of the exposed surface EX.

Next, an example of a method of manufacturing the substrate 10 including the exposed surface EX of the terminal TE having the region 71 having the large surface roughness and the region 72 having the small surface roughness will be explained with reference to FIGS. 61 to 70.

Figure 63:
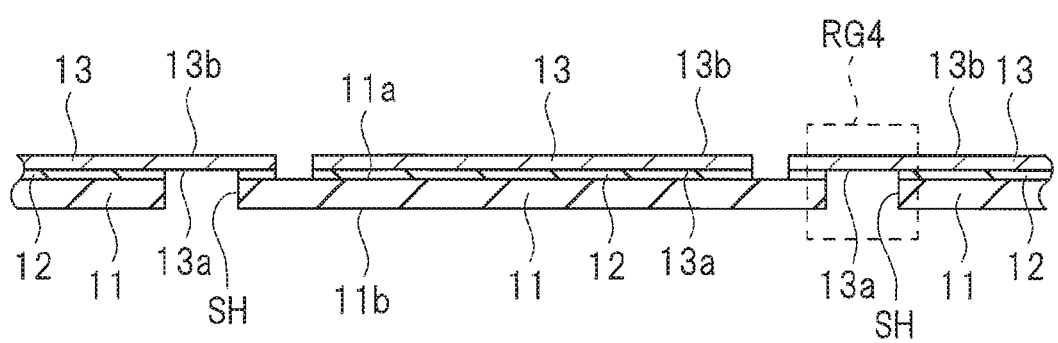
FIG. 63 is a cross-sectional view illustrating a step of manufacturing a substrate.
Figure 64:
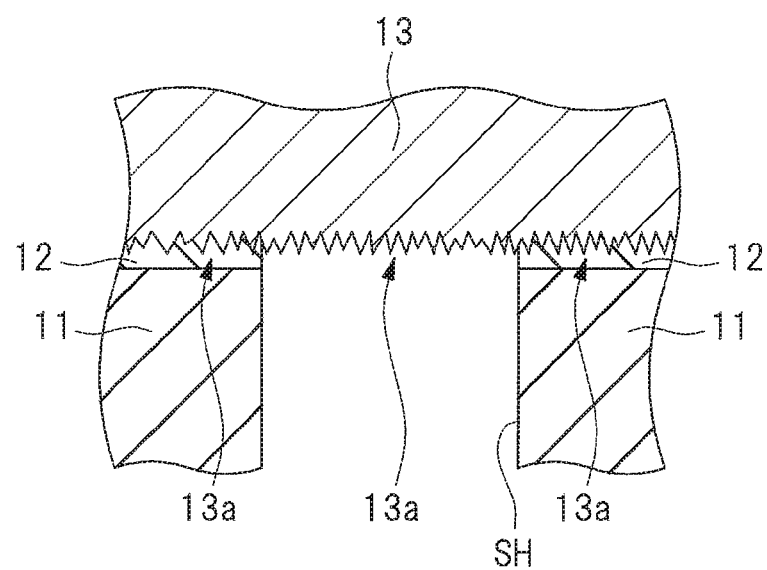
FIG. 64 is a cross-sectional view illustrating a step of manufacturing the substrate.
Figure 65:
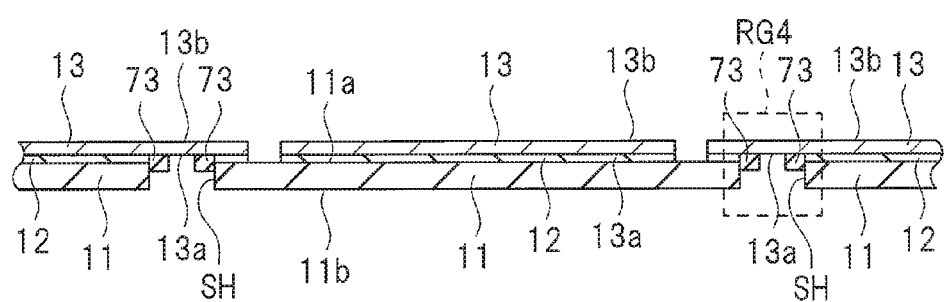
FIG. 65 is a cross-sectional view illustrating a step of manufacturing the substrate.
Figure 66:
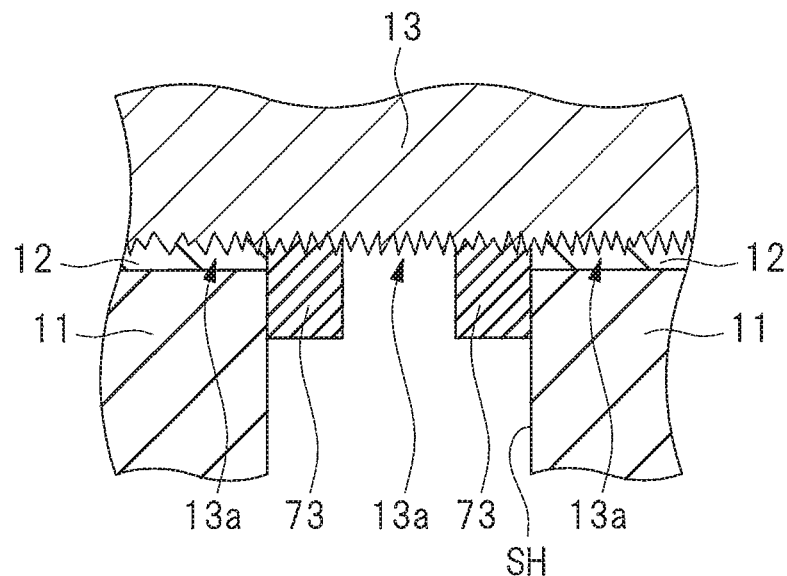
FIG. 66 is a cross-sectional view illustrating a step of manufacturing the substrate.
Figure 67:
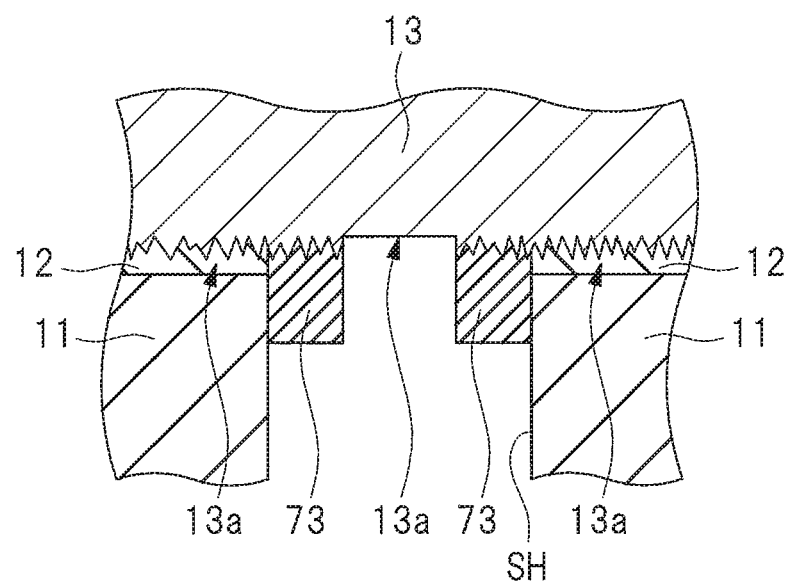
FIG. 67 is a cross-sectional view illustrating a step of manufacturing the substrate.
Figure 68:
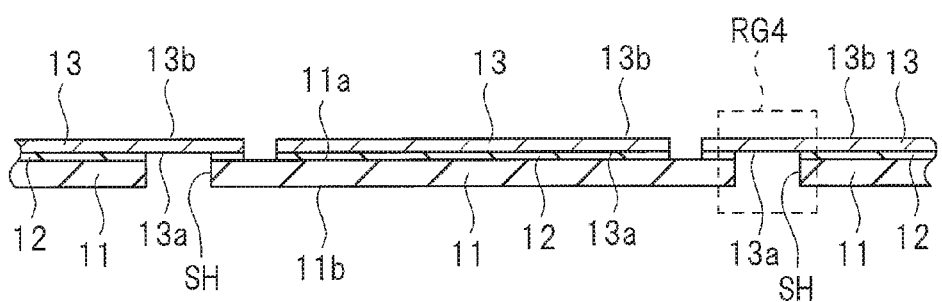
FIG. 68 is a cross-sectional view illustrating a step of manufacturing the substrate.
Figure 69:
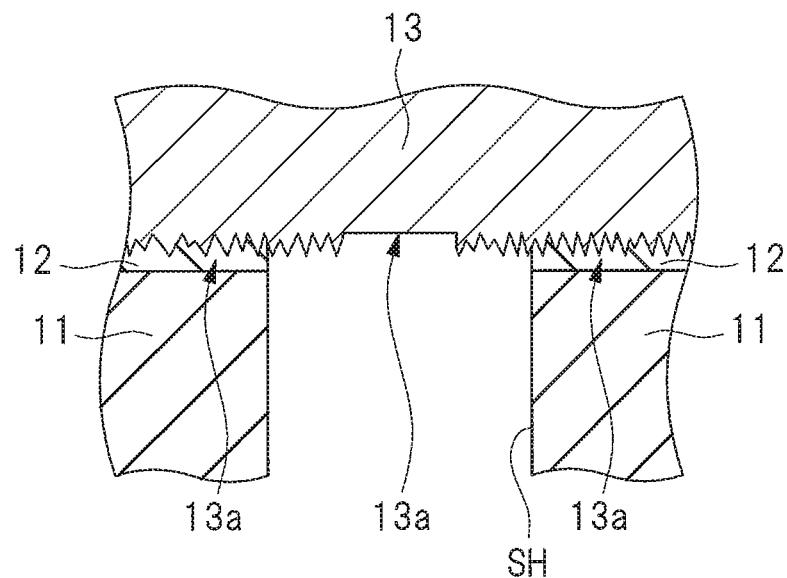
FIG. 69 is a cross-sectional view illustrating a step of manufacturing the substrate.
Figure 70:
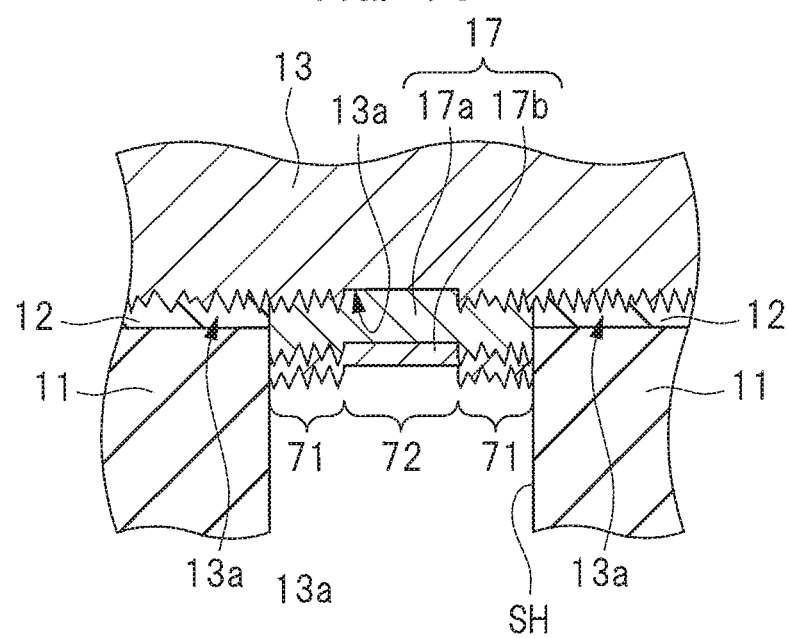
FIG. 70 is a cross-sectional view illustrating a step of manufacturing the substrate.

FIGS. 61 to 70 are cross-sectional views each illustrating manufacturing steps of the substrate 10 of the present third embodiment. FIGS. 63, 65, and 67 among them illustrate the cross-sectional views of the same region as that of the above-described FIGS. 13 to 21, FIG. 64 illustrates an enlarged view of a region RG4 surrounded by a dotted line in FIG. 63, FIG. 66 illustrates an enlarged view of the region RG4 surrounded by a dotted line in FIG. 65, and FIG. 69 illustrates an enlarged view of a region RG4 surrounded by a dotted line in FIG. 68. FIG. 67 illustrates a cross-sectional view of the same region as but at a different step stage from those of FIG. 66, and FIG. 70 illustrates a cross-sectional view of the same region as but at a different step stage from those of FIG. 69.

First, as similar to the above-described first embodiment, the steps of the above-described steps S1a to S1g are performed to obtain structures of FIGS. 63 and 64. That is, until performing the patterning step for the copper foil 13 in the above-described step S1g, the manufacturing steps of the substrate 10 of the present third embodiment are similar to the manufacturing steps of the substrate 10 of the above-described first embodiment. Therefore, the structures of FIGS. 63 and 64 are the same as the structures of the above-described FIGS. 21 and 22 obtained before the etching of the above-described step S1h.

Next, in the present third embodiment, as illustrated in FIGS. 65 and 66, a mask layer 73 is formed on the principal surface 13a of the copper foil 13 which is exposed from the through hole SH of the substrate 11. This mask layer 73 is functioned as an etching mask in the etching of the above-described step S1h performed later. The mask layer 73 is formed on not entirely but partially the principal surface 13a of the copper foil 13 which is exposed from the through hole SH of the base material 11. A planar region where the mask layer 73 is formed is a region that substantially matches the region 71 having the high surface roughness in the above-described FIG. 62.

Next, as illustrated in FIG. 67, the principal surface 13a of the copper foil 13 which is exposed from the through hole SH of the base material 11 is etched by performing the etching step of the above-described step S1h.

Regarding the etching step of the above-described step S1h, the present third embodiment is different from the above-described first embodiment in that the part not covered with the mask layer 73 in the principal surface 13a of the copper foil 13 which is exposed from the through hole SH of the base material is etched while the part covered with the mask layer 73 therein is not etched since the mask layer 73 is functioned as the etching mask. FIG. 66 illustrates a state immediately before the etching of step S1h, and FIG. 67 illustrates a state after the etching of step S1h. The mask layer 73 is removed after the etching of step S1h is performed, and FIGS. 68 and 69 illustrate the state in which the mask layer 73 has been removed.

When the etching step of the above-described step S1h is performed, the part not covered with the mask layer 73 in the principal surface 13a of the copper foil 13 which is exposed from the through hole SH of the base material 11 is etched so as to increase the flatness. However, even when the etching step of step S1h is performed, the region bonded to the principal surface 11a of the base material 11 via the bonding material layer 12 in the principal surface 13a of the copper foil 13 (in other words, the region being the principal surface 13a of the copper foil 13 except for the part exposed from the through hole SH) and the region covered with the mask layer 73 are not etched so as not to change the flatness. Except for the points, the present third embodiment and the above-described first embodiment are also basically the same as each other in the etching step of the above-described step S1h.

As illustrated in FIG. 66, regarding the flatness of the principal surface 13a of the copper foil 13 before the etching of step S1h, the region exposed from the through hole SH, the region covered with the mask layer 73, and the region bonded to the principal surface 11a of the base material 11 via the bonding material layer 12 have almost the similar flatness to each other, and have almost the same surface roughness as each other. However, regarding the flatness of the principal surface 13a of the copper foil 13 obtained when the etching of step S1h is performed, as illustrated in FIG. 67, the flatness in the region not covered with the mask layer 73 in the region which is exposed from the through hole SH is higher than the flatness in the region bonded to the principal surface 11a of the base material 11 via the bonding material layer 12 and the flatness in the region covered with the mask layer 73. That is, when the etching of step S1h is performed, in the surface roughness of the principal surface 13a of the copper foil 13, the region not covered with the mask layer 73 in the region which is exposed from the through hole SH is smaller than the region bonded to the principal surface 11a of the base material 11 via the bonding material layer 12 and the region covered with the mask layer 73.

Then, the above-described plating films 16 and 17 are formed on the exposed surface of the copper foil 13 by performing the above-described step S1i as similar to the above-described first embodiment. FIG. 70 illustrates a stage in which the plating films 16 and 17 are formed by performing this step S1i so that the plating film 17 (corresponding to the above-described plating layer TE3) is formed on the principal surface 13a (corresponding to the above-described upper surface TE1a) of the copper foil 13 (corresponding to the above-described copper layer TE1) which is exposed from the through hole SH.

The plating film 17 is conformally formed with respect to the base surface (in other words, the principal surface 13a of the copper foil 13 which is exposed from the through hole SH of the base material 11). Therefore, by forming the region having the large surface roughness (the region covered with the mask layer 73) and the region having the small surface roughness (the region not covered with the mask layer 73) on the principal surface 13a of the copper foil 13 which is exposed from the through hole SH of the base material 11, the surface roughness of the plating film 17 is as large as the surface roughness of the principal surface 13a of the copper foil 13 which is the base. That is, in the principal surface 13a of the copper foil 13 which is exposed from the through hole SH of the base material 11, the plating film 17 having the large surface roughness is formed in the region having the large surface roughness, and the plating film 17 having the small surface roughness is formed in the region having the small surface roughness. The above-described region 71 having the large surface roughness is formed of the plating film 17 having the large surface roughness, and the above-described region 72 having the small surface roughness is formed of the plating film 17 having the small surface roughness.

As described above, the region 71 having the large surface roughness and the region 72 having the small surface roughness can be provided on the surface of the plating film 17, in other words, on the exposed surface EX of the terminal TE.

Also, although an example of the method of providing the region 71 having the large surface roughness and the region 72 having the small surface roughness on the exposed surface EX of the terminal TE has been described here, another method can be also used.

Moreover, the case in which the plating film 17 is formed on the entire principal surface 13a of the copper foil 13 which is exposed from the through hole SH of the base material 11 has been explained. As another aspect, it is also possible not to form the plating film 17 (in other words, the above-described plating layer TE3) except for the region to which the conductive connecting member (for example, the wire BW) is connected (joined). For example, there can be also a case in which the plating film 17 (in other words, the above-described plating layer TE3) is formed in the above-described region 72 having the small surface roughness while the plating film 17 (in other words, the above-described plating layer TE3) is not formed in the above-described region 71 having the large surface roughness.

Modification Example of First to Third Embodiments

The above-described first to third embodiments employ the substrate CB in which the terminal TE is formed on the lower surface BSb of the base material BS while the metal pattern (the terminal, the wiring, or others) is not formed on the upper surface BSa of the base material BS. In the above-described first to third embodiments (including the modification examples), a so-called dual substrate can be also used as the substrate CB, the dual substrate including the terminal TE formed on the lower surface BSb of the base material BS and the metal pattern (the terminal, the wiring, or others) formed on the upper surface BSa which is the principal surface of the base material BS on the chip mounting side.

Figure 71:
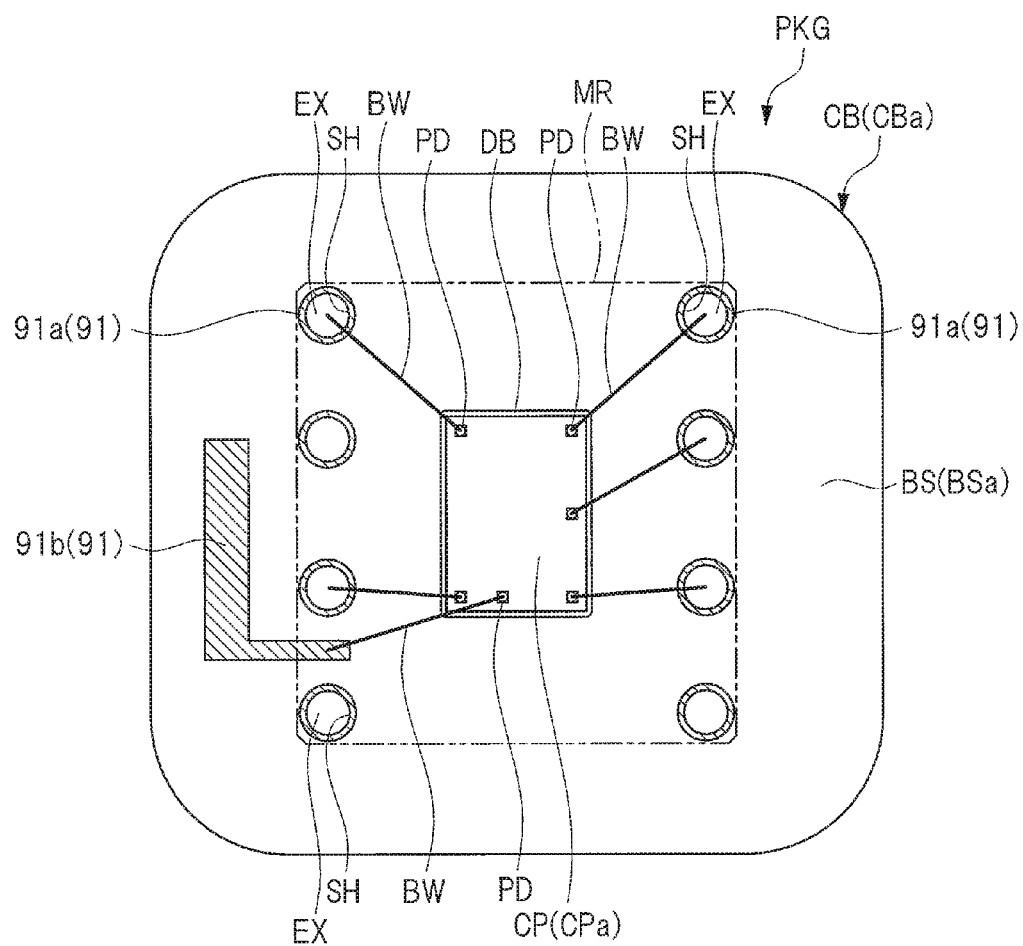
FIG. 71 is a plan perspective view of a semiconductor device of still another embodiment.

In the present modification example, an example of the case in which the dual substrate is applied to the substrate CB will be explained. FIG. 71 is a plan view of the semiconductor device PKG of the present modification example, and corresponds to the above-described FIG. 3 of the above-described first embodiment. FIG. 71 also illustrates a plan view (in other words, a top view) on the upper surface side of the semiconductor device PKG as similar to the above-described FIG. 3 so as to be a transparent plan view in which the sealing body MR is viewed as being transparent and so that an outer shape position of the sealing body MR is illustrated by a dashed double-dotted line. Note that the terminal TE as illustrated in the above-described FIGS. 2 and 3 is formed on the lower surface CBb of the substrate CB also in the present modification example. However, FIG. 71 does not illustrate the terminal. Also, while FIG. 71 is the plan view, a metal pattern 91 is hatched in order to easily see the drawing.

The semiconductor device PKG of FIG. 71 is different from the semiconductor device PKG of the above-described first embodiment in that the metal pattern 91 (more specifically, a metal pattern 91a and a terminal 91b) is formed on the upper surface CBa side of the substrate CB, in other words, on the upper surface BSa of the base material BS and in that the terminal 91b and the pad PD of the semiconductor chip CP are electrically connected to each other by the conductive member such as the wire BW. Except for these points, the semiconductor device PKG of FIG. 71 is similar to the semiconductor device PKG of the above-described first embodiment.

In the case of the semiconductor device PKG of the present modification example of FIG. 71, the metal pattern 91 is formed on the upper surface CBa side of the substrate CB, in other words, on the upper surface BSa of the base material BS, and the metal pattern 91 includes the metal pattern 91a and the terminal 91b. The terminal 91b and the pad PD of the semiconductor chip CP are electrically connected to each other via the wire BW, a part of the terminal 91b (including a connection portion of the wire BW with the terminal 91b) is sealed with the sealing body MR, and the other part of the terminal 91b is not covered with the sealing body MR but exposed. The part of the terminal 91b which is exposed from the sealing body MR can be functioned as an external terminal of the semiconductor device PKG of FIG. 71. Therefore, the semiconductor device PKG of FIG. 71 has the above-described terminal TE (not illustrated in FIG. 71) as an external terminal on the lower surface CBb side of the substrate CB, and has the terminal 91b as an external terminal on the upper surface CBa side of the substrate CB. Also, the terminal 91b serves both as the terminal and a wiring. Therefore, the substrate CB of the semiconductor device PKG of FIG. 71 has the above-described terminal TE (not illustrated in FIG. 71) as the external terminal on the lower surface CBb side, and has the metal pattern for the wiring or the terminal on the upper surface CBa side of the substrate CB.

The metal pattern 91a is formed in the periphery of the through hole SH so as to surround the through hole SH. Although the metal pattern 91a is formed in view of the manufacturing steps, this is not required to be formed.

Note that FIG. 71 illustrates an example of the metal pattern 91 formed on the upper surface CBa side of the substrate CB, in other words, on the upper surface BSa of the base material BS, and a shape of the metal pattern 91 and usage thereof can be variously changed.

The present modification example can be applied to all of the above-described first to third embodiments (including the modification examples). That is, in all of the above-described first to third embodiments (including the modification examples), the substrate CB (dual substrate) as illustrated in FIG. 71 can be used.

Next, an example of the manufacturing method in a case in which the above-described substrate 10 is manufactured as the dual substrate used in the present modification example will be explained with reference to FIGS. 72 to 81.

FIGS. 72 to 81 are cross-sectional views each illustrating a step of manufacturing the substrate 10 in the present modification example, and illustrate cross-sectional views in the same region as that of the above-described FIGS. 13 to 21.

Figure 72:
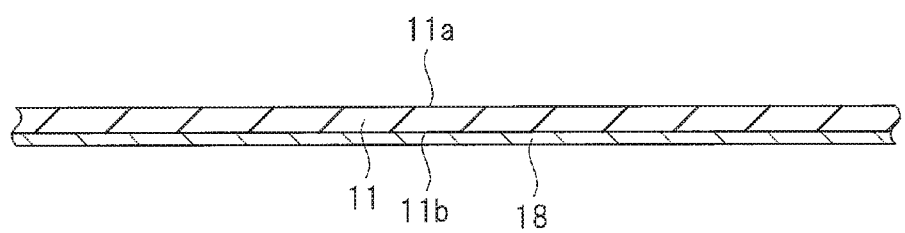
FIG. 72 is a cross-sectional view illustrating a step of manufacturing a substrate.

First, as illustrated in FIG. 72, a base material (base material layer, tape base material) 11 in which the copper foil (copper layer) 18 is pasted on one principal surface 11b is prepared. Here, the copper foil 18 can be also pasted on the principal surface 11b of the base material 11 prepared in the above-described step S1a. The copper foil 18 is pasted on the principal surface 11b of the base material 11 via a bonding material layer (whose illustration is omitted).

Figure 73:
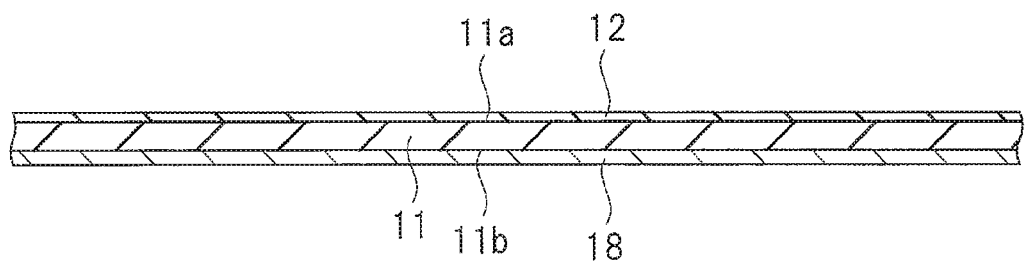
FIG. 73 is a cross-sectional view illustrating a step of manufacturing the substrate.

Next, in the above-described step S1b, the bonding material layer 12 is formed on the principal surface 11a of the base material 11 as illustrated in FIG. 73.

Figure 74:
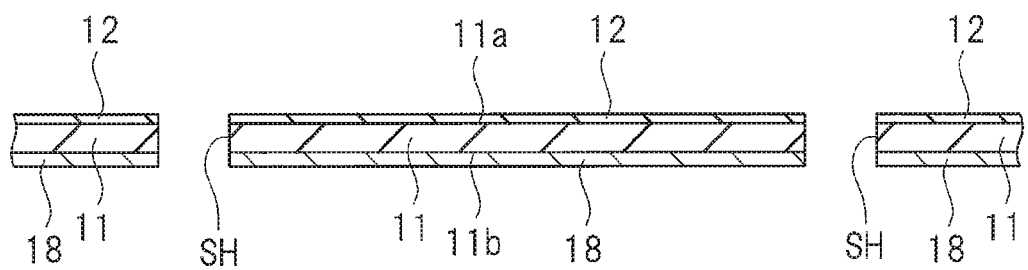
FIG. 74 is a cross-sectional view illustrating a step of manufacturing the substrate.

Then, in the above-described step S1c, the through hole SH is formed in the base material 11 as illustrated in FIG. 74. The through hole SH penetrates through the base material 11 and besides the copper foil 18 and the bonding material layer 12.

Figure 75:
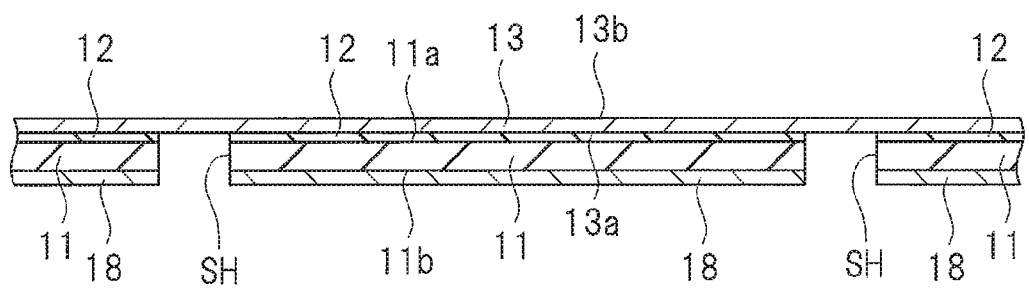
FIG. 75 is a cross-sectional view illustrating a step of manufacturing the substrate.

Next, in the above-described step S1d, as illustrated in FIG. 75, the copper foil (copper layer) 13 is pasted on the principal surface 11a of the base material 11 via the bonding material layer 12.

Figure 76:
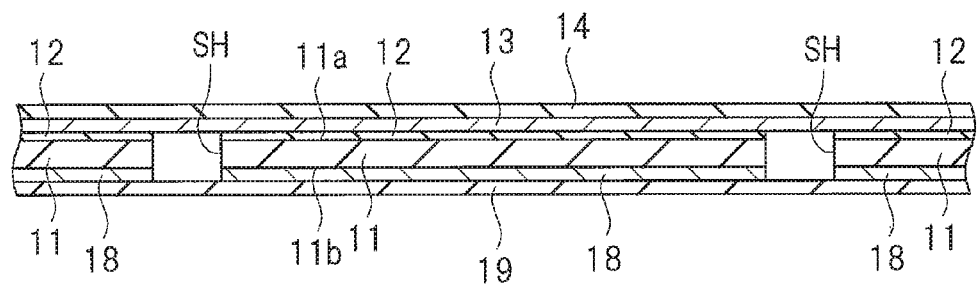
FIG. 76 is a cross-sectional view illustrating a step of manufacturing the substrate.

Next, in the above-described step S1e, as illustrated in FIG. 76, the photoresist layer (photoresist film) 14 is formed on the copper foil 13, and a photoresist layer (photoresist film) 19 is formed (pasted) on the copper foil 18. As the pasted photoresist film as each of the photoresist layers 14 and 19, for example, a photoresist dry film can be used.

Next, in the above-described step S1f, the photoresist layers 14 and 19 are subjected to the exposure treatment and the development treatment, so that each of the photoresist layers 14 and 19 is patterned.

Figure 77:
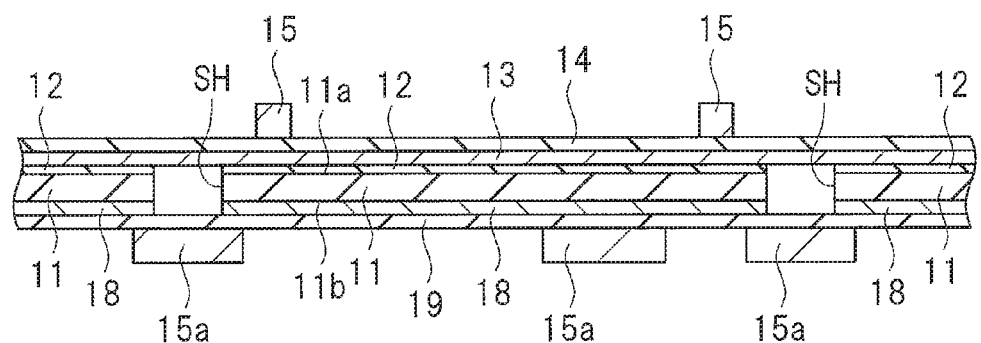
FIG. 77 is a cross-sectional view illustrating a step of manufacturing the substrate.
Figure 78:
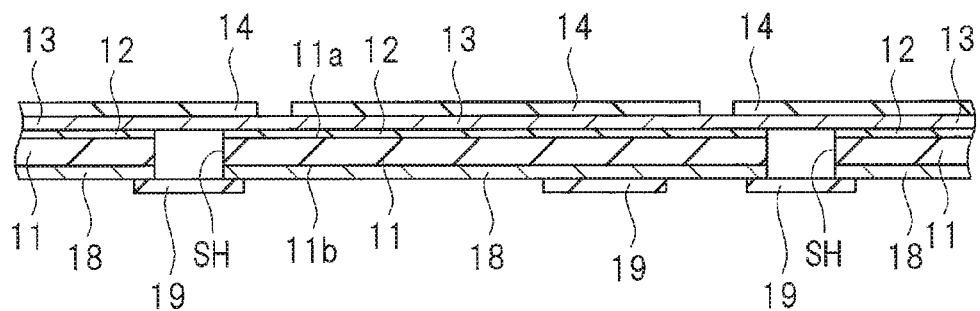
FIG. 78 is a cross-sectional view illustrating a step of manufacturing the substrate.

A step of patterning each of the photoresist layers 14 and 19 can be performed as, for example, follows. That is, as illustrated in FIG. 77, the exposure mask 15 is formed or arranged on the photoresist layer 14 first, and then, the photoresist layer 14 is exposed to light as using the mask 15 as a light-shielding mask. Moreover, an exposure mask 15a is formed or arranged on the photoresist layer 19, and then, the photoresist layer 19 is exposed to light as using the mask 15a as the light-shielding mask. Then, by performing the development treatment to the photoresist layers 14 and 19, each of the photoresist layers 14 and 19 can be patterned as illustrated in FIG. 78. After performing the exposure and development treatments to one of the photoresist layer 14 and the photoresist layer 19, the exposure and development treatments to the other one may be performed.

While the photoresist layer 14 patterned by the exposure and the development is formed in the region where the above-described terminal TE is formed, the photoresist layer 19 patterned by the exposure and the development is formed in the region where the above-described metal pattern 91 is formed.

However, in order not to etch the copper foil 13 via the through hole SH in the etching step for patterning the copper foil 18 later, the through hole SH is to be covered with the photoresist layer 19 also after the exposure and the development treatments. That is, in order not to expose the through hole SH to light on the principal surface 11b side of the base material 11, the photoresist layer 19 is to be left so as to have a pattern which is slightly larger than the through hole SH at a position overlapped with the through hole SH. The copper foil 18 is left below the photoresist layer 19 in this portion in the periphery of the through hole SH, so that the above-described metal pattern 91a is formed.

Figure 79:
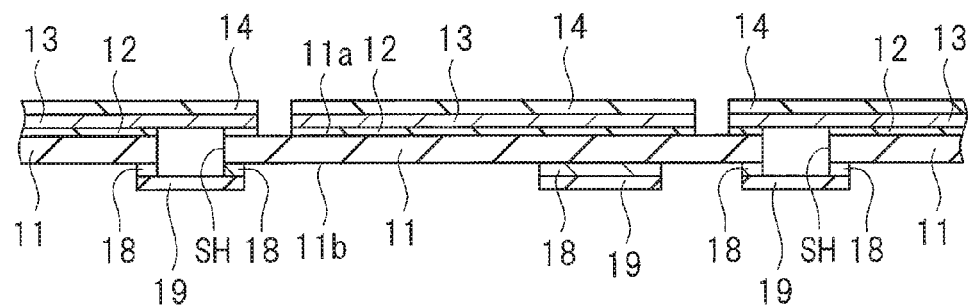
FIG. 79 is a cross-sectional view illustrating a step of manufacturing the substrate.
Figure 80:
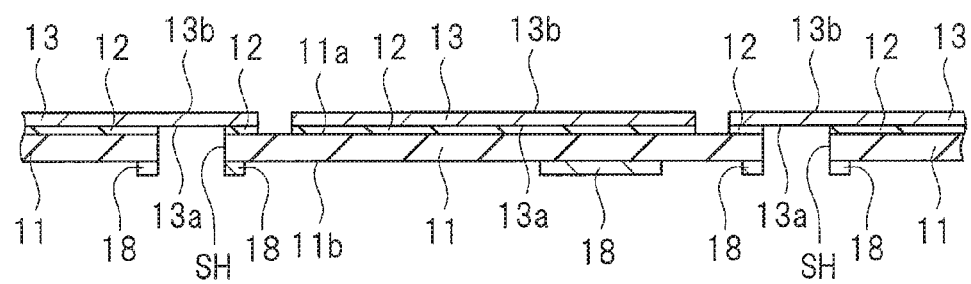
FIG. 80 is a cross-sectional view illustrating a step of manufacturing the substrate.

Next, in the above-described step S1g, as illustrated in FIG. 79, the copper foil 13 is etched and patterned as using the photoresist layer 14 as an etching mask, and the copper foil 18 is etched and patterned as using the photoresist layer 19 as an etching mask. In this manner, the copper foil 13 and the copper foil 18 are patterned into predetermined patterns. The patterned copper foil 13 serves as the copper layer TE1 of the above-described terminal TE. The patterned copper foil 18 serves as a copper layer serving as a main body of the above-described metal pattern 91. After the etching, the photoresist layers 14 and 19 are removed as illustrated in FIG. 80.

Next, in the above-described step S1h, the principal surface 13a of the copper foil 13 which is exposed from the through hole SH of the base material 11 is etched. This etching is a flattening treatment performed for flattening the principal surface 13a of the copper foil 13 which is exposed from the through hole SH of the base material 11, and therefore, it is required not to form a hole in the copper foil 13 at a bottom portion of the through hole SH due to excessive etching of the copper foil 13 which is exposed from the through hole SH of the base material 11.

Figure 81:
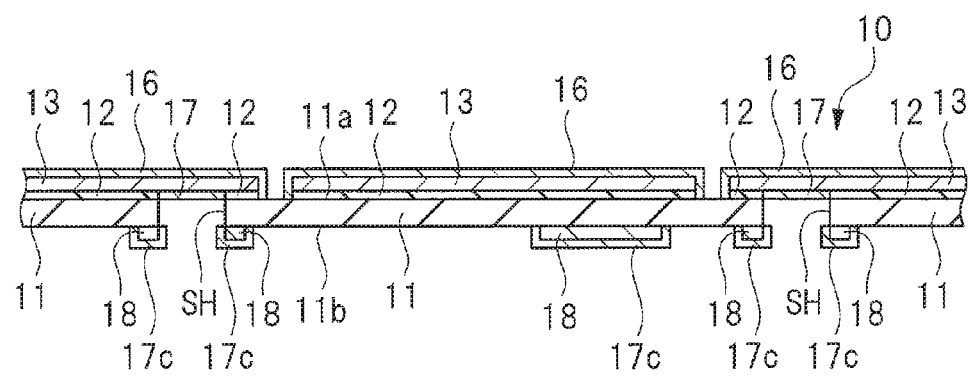
FIG. 81 is a cross-sectional view illustrating a step of manufacturing the substrate.

Next, in the above-described step S1i, as illustrated in FIG. 81, the above-described plating films 16 and 17 are formed on the exposed surface of the copper foil 13, and a plating film 17c is formed on the exposed surface of the copper foil 18. The above-described terminal TE is formed of the copper foil 13 and the plating films 16 and 17, and the above-described metal pattern 91 (more specifically, the metal pattern 91a and the terminal 91b) is formed of the copper foil 18 and the plating film 17c. As similar to the plating films 16 and 17, the plating film 17c can be, for example, a stacked film of a nickel plating film and a gold plating film on the nickel plating film. In that case, the gold plating film is the uppermost surface.

In this manner, the substrate 10 can be manufactured as the dual substrate.

Further, in the scope within the concept of the technical ideas explained in the above-described first to third embodiments (including the modification examples), combination of the above-described first to third embodiments and the modification examples thereof can be applied.

In the foregoing, the invention made by the present inventors has been concretely described based on the embodiments. However, it is needless to say that the present invention is not limited to the foregoing embodiments and various modifications and alterations can be made within the scope of the present invention.

In addition to that, a part of the contents described in the embodiments will be described below.

(Item 1) A method of manufacturing a semiconductor device including the following steps of (a) a step of preparing a substrate including: a base material comprised of insulating material having a first surface and a second surface opposite to the first surface; an external terminal formed on the second surface of the base material; and a through hole formed from one of the first surface and the second surface of the base material toward the other one so as to expose a part of the external terminal, (b) a step of mounting a semiconductor chip, having a principal surface, a pad formed on the principal surface, and a back surface opposite to the principal surface, on the first surface of the base material so that the back surface faces the first surface of the base material, (c) a step of electrically connecting of the pad of the semiconductor chip via a conductive member with an exposed surface of the external terminal which is exposed from the through hole of the base material, and (d) a step of forming a sealing body for sealing inside of the through hole of the base material, the semiconductor chip, and the conductive member, and an anchor means is here provided in a region of the exposed surface except for a joint portion joined with the conductive member.

What is claimed is:
1. A semiconductor device comprising:
 a substrate comprising:
  a base material having a first surface, a second surface opposite to the first surface, and a through hole formed from one of the first surface and the second surface toward the other one, the base material being comprised of an insulating material; and
  an external terminal formed on the second surface of the base material, the external terminal being comprised of a metal material;
 a semiconductor chip having a principal surface, a pad formed on the principal surface, and a back surface opposite to the principal surface, and mounted on the first surface of the base material such that the back surface faces the first surface of the base material;
 a plating layer formed inside of the through hole and also formed on an exposed surface of the external terminal, the exposed surface being exposed from the through hole of the base material when seen from the first surface of the base material;
 a wire electrically connecting the pad of the semiconductor chip with the external terminal of the substrate, the wire having a first part connected to a surface of the plating layer, and a second part opposite to the first part;

a plurality of first stud bumps formed on the surface of the plating layer such that the first part of the wire is surrounded by the plurality of first stud bumps in plan view; and a sealing body sealing inside of the through hole of the base material, the semiconductor chip, the wire and the plurality of first stud bumps, wherein each of the plurality of first stud bumps has a first portion connected to the surface of the plating layer, and a second portion not connected to the surface of the plating layer, and wherein the second portion of each of the plurality of first stud bumps is in contact with the sealing body.

2. The semiconductor device according to claim 1, wherein a part of the sealing body is located between the second portion of each of the plurality of first stud bumps and the surface of the plating layer in cross-section view.

3. The semiconductor device according to claim 1, wherein the second part of the wire is electrically connected with the pad of the semiconductor chip via a second stud bump.

4. The semiconductor device according to claim 1, wherein a plurality of third stud bumps are stacked on the plurality of first stud bumps, respectively.

5. The semiconductor device according to claim 1, wherein the wire and the plurality of first stud bumps are made of the same metal material as each other.

6. The semiconductor device according to claim 1, wherein, in plan view, the first part of the wire is located at a position spaced apart from the central portion of the surface of the plating layer.

7. The semiconductor device according to claim 6, wherein, in plan view, the first part of the wire is located away from the semiconductor chip than the central portion of the surface of the plating layer.

8. The semiconductor device according to claim 1, wherein the first part of the wire is a ball portion having a diameter larger than a diameter of a third part of the wire between the first part and the second part.

* * * * *